(12) United States Patent
Takaki et al.

(10) Patent No.: US 11,703,757 B2
(45) Date of Patent: Jul. 18, 2023

(54) RESIST COMPOSITION AND METHOD OF FORMING RESIST PATTERN

(71) Applicant: TOKYO OHKA KOGYO CO., LTD., Kawasaki (JP)

(72) Inventors: Daichi Takaki, Kawasaki (JP); Hirokuni Saito, Kawasaki (JP); Makoto Sakata, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 211 days.

(21) Appl. No.: 16/905,029

(22) Filed: Jun. 18, 2020

(65) Prior Publication Data

US 2020/0409259 A1 Dec. 31, 2020

(30) Foreign Application Priority Data

Jun. 26, 2019 (JP) .................. 2019-119012

(51) Int. Cl.
*G03F 7/038* (2006.01)
*G03F 7/004* (2006.01)
*C08L 33/16* (2006.01)
*G03F 7/039* (2006.01)
*G03F 7/32* (2006.01)

(52) U.S. Cl.
CPC ............ *G03F 7/0045* (2013.01); *C08L 33/16* (2013.01); *G03F 7/0382* (2013.01); *G03F 7/0397* (2013.01); *G03F 7/32* (2013.01)

(58) Field of Classification Search
CPC ..... G03F 7/0382; G03F 7/0397; G03F 7/0045
See application file for complete search history.

(56) References Cited

U.S. PATENT DOCUMENTS

| 2009/0258315 | A1 | 10/2009 | Ober et al. |
| 2011/0117499 | A1 | 5/2011 | Matsumiya et al. |
| 2018/0120701 | A1 | 5/2018 | Hirano |
| 2018/0299773 | A1* | 10/2018 | Maruyama ............ G03F 7/0392 |
| 2019/0033715 | A1 | 1/2019 | Adachi et al. |

FOREIGN PATENT DOCUMENTS

| JP | 2011-013569 A | 1/2011 |
| JP | A-2019-028286 | 2/2019 |
| KR | 10-1219723 | 1/2013 |
| WO | WO2017/002545 | 1/2017 |

OTHER PUBLICATIONS

Office Action in Japanese Patent Application No. 2019-119012, dated Jan. 24, 2023.

* cited by examiner

*Primary Examiner* — Daborah Chacko-Davis
(74) *Attorney, Agent, or Firm* — Knobbe, Martens, Olson & Bear, LLP

(57) ABSTRACT

A resist composition including: a base material component (A), a compound (B1) represented by Formula (b1-1), and a fluorine additive component (F) which contains a fluororesin component (F1) having a constitutional unit (f1) represented by Formula (f-1) and a constitutional unit (f2) represented by Formula (f-2); in Formula (b1-1), $V^{b01}$ represents a fluorinated alkylene group, $R^{b02}$ represents a fluorine atom or a hydrogen atom, a total number of fluorine atoms as $V^{b01}$ and $R^{b02}$ is 2 or 3; in Formula (f-1), $Rf^1$ represents a monovalent organic group having a fluorine atom; in Formula (f-2), $Rf^2$ represents a group represented by Formula (f2-r-1), which is a group containing a polycyclic aliphatic cyclic group.

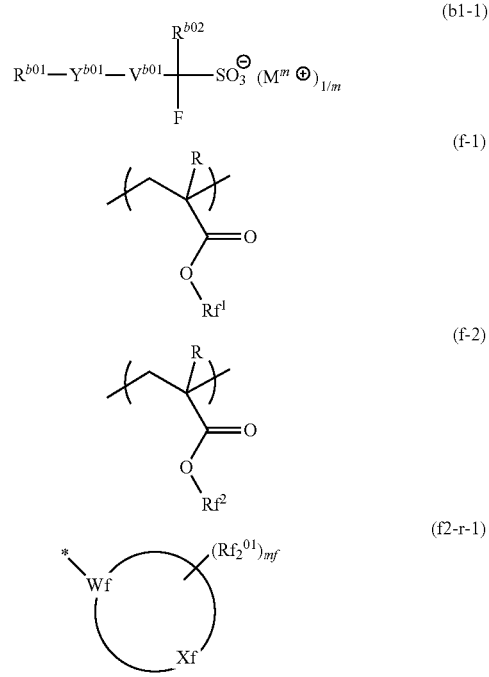

4 Claims, 1 Drawing Sheet

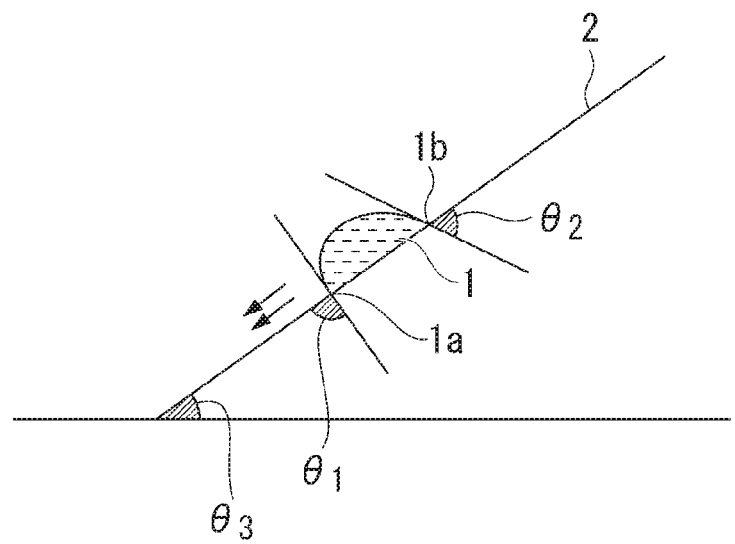

RESIST COMPOSITION AND METHOD OF FORMING RESIST PATTERN

BACKGROUND OF THE INVENTION

Field of the Invention

The present invention relates to a resist composition and a method of forming a resist pattern.

Priority is claimed on Japanese Patent Application No. 2019-119012, filed on Jun. 26, 2019, the content of which is incorporated herein by reference.

Description of Related Art

In lithography techniques, for example, a step of forming a resist pattern having a predetermined shape on a resist film is performed by forming a resist film formed of a resist material on a substrate, performing selective exposure on the resist film to radiation such as light or electron beams through a mask on which a predetermined pattern has been formed, and performing a developing treatment.

A resist material whose characteristic is changed such that the exposed portion is dissolved in a developing solution is referred to as a positive tone, and a resist material whose characteristic is changed such that the exposed portion is not dissolved in a developing solution is referred to as a negative tone.

In recent years, in the manufacture of semiconductor elements and liquid crystal display elements, advances in lithography techniques have led to rapid progress in the field of pattern miniaturization.

These pattern miniaturization techniques typically involve shortening the wavelength (increasing the energy) of the exposure light source. Specifically, ultraviolet rays typified by g-line and i-line have been used in the related art, but nowadays mass production of semiconductor elements using KrF excimer lasers and ArF excimer lasers has started. Further, examination has also been conducted on electron beams, extreme ultraviolet (EUV) rays, and X rays, which have a wavelength shorter (energy higher) than these excimer lasers.

Resist materials require lithography characteristics such as a high resolution that enables reproduction of patterns with minute dimensions, and a high level of sensitivity to these kinds of exposure light sources.

As a resist material that satisfies these requirements, a chemically amplified resist composition which includes a base material component whose solubility in an alkali developing solution is changed due to an action of an acid and an acid generator component that generates an acid upon exposure has been used.

As one of the techniques for improving the resolution, a lithography method, which is so-called liquid immersion lithography (hereinafter, also referred to as "liquid immersion exposure"), of interposing a liquid (liquid immersion medium) having a higher refractive index than that of air between an objective lens of an exposure device and a sample and performing exposure (immersion exposure) has been known. According to the liquid immersion exposure, even in a case of using a light source with the same exposure wavelength, the same high resolution as in a case of using a light source with a shorter wavelength or a high NA lens can be achieved, and the depth of focus is not even degraded. Further, the liquid immersion exposure can be performed using an exposure device of the related art. Therefore, liquid immersion exposure has been used in recent years because the liquid immersion exposure can realize formation of a resist pattern that is low in cost and has a high resolution and an excellent depth of focus. The liquid immersion exposure is considered to be effective in forming any pattern shape and to be combined with a super-resolution technique such as a phase shift method or a deformed illumination method. Recently, a technique using an ArF excimer laser as a light source is actively researched as the liquid immersion exposure technique. As the liquid immersion medium, water is mainly examined.

In the above immersion exposure, a resist material having characteristics corresponding to the immersion exposure technique in addition to the typical lithography characteristics (the sensitivity, the resolution, the etching resistance, and the like) is required. For example, in the liquid immersion exposure, in a case where a resist film is brought into contact with a liquid immersion solvent, elution of a substance in the resist film into the liquid immersion solvent (substance elution) occurs. The substance elution causes phenomena such as deterioration of the resist layer and a change in the refractive index of the liquid immersion solvent and degrades the lithography characteristics. Since the amount of the substance elution is affected by the characteristics (such as the hydrophilicity and the hydrophobicity) of the surface of the resist film, the substance elution is reduced by, for example, increasing the hydrophobicity of the surface of the resist film, and thus the lithography characteristics are improved.

It has been proposed that a compound having a fluorine atom is added to a resist composition used for such liquid immersion exposure. For example, Patent Literature 1 discloses, as a compound having a fluorine atom which is added to a resist composition, a fluorine-containing polymer compound that has a constitutional unit having a fluorine atom and a constitutional unit derived from (meth)acrylic acid.

CITATION LIST

Patent Literature

[Patent Literature 1]
Japanese Unexamined Patent Application, First Publication No. 2011-13569

SUMMARY OF THE INVENTION

With further advances of the lithography technique and further miniaturization of resist patterns, further improvement in the hydrophobicity of the surface of the resist film is required.

However, the resist composition as disclosed in Patent Literature 1 has a problem in that the hydrophobicity of the surface of the resist film is not sufficient.

In view of the above-described circumstances, an object of the present invention is to provide a resist composition and a method of forming a resist pattern, which enable improvement of lithography characteristics and formation of a resist pattern with an excellent shape.

In order to achieve the above-described object, the present invention employs the following configuration.

According to a first aspect of the present invention, there is provided a resist composition which generates an acid upon exposure and whose solubility in a developing solution is changed due to an action of the acid, the resist composition including: a base material component (A) whose solubility in a developing solution is changed due to the action of an acid; an acid generator component (B) which generates an acid upon exposure; and a fluorine additive component (F), in which the acid generator component (B) contains a compound (B1) represented by Formula (b1-1), and the fluorine additive component (F) contains a fluororesin component (F1) which has a constitutional unit represented by Formula (f-1) and a constitutional unit (f2) represented by Formula (f-2).

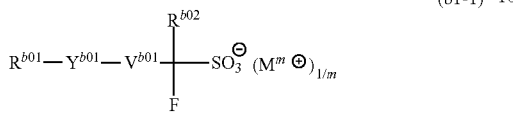

(b1-1)

[In the formula, $R^{b01}$ represents a cyclic group which may have a substituent, a chain alkyl group which may have a substituent, or a chain alkenyl group which may have a substituent. $Y^{b01}$ represents a divalent linking group having an oxygen atom or a single bond. $V^{b01}$ represents a fluorinated alkylene group. $R^{b02}$ represents a fluorine atom or a hydrogen atom. Here, a total number of fluorine atoms as $V^{b01}$ and $R^{b02}$ is 2 or 3. m represents an integer of 1 or greater, and $M^{m+}$ represents an m-valent organic cation.]

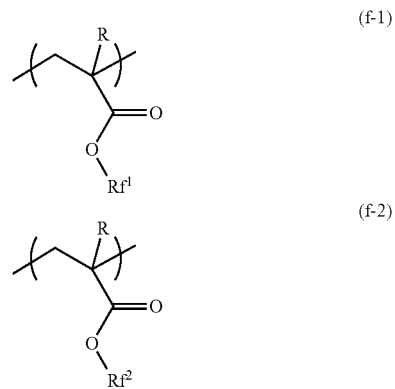

(f-1)

(f-2)

[In Formula (f-1), R represents a hydrogen atom, an alkyl group having 1 to 5 carbon atoms, or a halogenated alkyl group having 1 to 5 carbon atoms. $Rf^1$ represents a monovalent organic group having a fluorine atom.

In Formula (f-2), R represents a hydrogen atom, an alkyl group having 1 to 5 carbon atoms, or a halogenated alkyl group having 1 to 5 carbon atoms. $Rf^2$ represents a group represented by Formula (f2-r-1).]

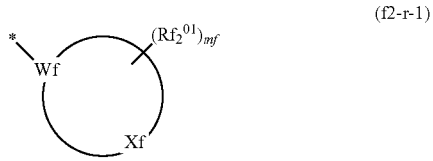

(f2-r-1)

[In the formula, Wf represents a carbon atom. Xf represents a group that forms a polycyclic aliphatic cyclic group with Wf. $Rf_2^{01}$ represents an alkyl group. Here, $Rf_2^{01}$ is not bonded to Wf. mf represents an integer of 2 or greater. The symbol * represents a bonding site.]

According to a second aspect of the present invention, there is provided a method of forming a resist pattern, including: a step (i) of forming a resist film on a support using the resist composition according to the first aspect; a step (ii) of exposing the resist film; and a step (iii) of developing the exposed resist film to form a resist pattern.

According to the resist composition and the method of forming a resist pattern of the present invention, it is possible to improve the lithography characteristics and form a resist pattern with an excellent shape.

BRIEF DESCRIPTION OF THE DRAWINGS

FIG. 1 is a view showing an advancing angle (θ1), a reversing angle (θ2), and a falling angle (θ3).

DETAILED DESCRIPTION OF THE INVENTION

In the present description and the scope of the present patent claims, the term "aliphatic" is a relative concept used in relation to the term "aromatic", and defines a group or compound that has no aromaticity.

The term "alkyl group" includes linear, branched, or cyclic monovalent saturated hydrocarbon, unless otherwise specified. The same applies to the alkyl group in an alkoxy group.

The term "alkylene group" includes linear, branched, or cyclic divalent saturated hydrocarbon, unless otherwise specified.

The "halogenated alkyl group" is a group in which some or all hydrogen atoms of an alkyl group have been substituted with halogen atoms. Examples of the halogen atom include a fluorine atom, a chlorine atom, a bromine atom, and an iodine atom.

The "fluorinated alkyl group" or a "fluorinated alkylene group" is a group in which some or all hydrogen atoms of an alkyl group or an alkylene group have been substituted with fluorine atoms.

The term "constitutional unit" indicates a monomer unit constituting a polymer compound (a resin, a polymer, or a copolymer).

The expression "may have a substituent" includes a case where a hydrogen atom (—H) is substituted with a monovalent group and a case where a methylene (—CH$_2$—) group is substituted with a divalent group.

The term "exposure" is a general concept for irradiation with radiation.

The "base material component" is an organic compound having a film-forming ability, and an organic compound having a molecular weight of 500 or greater is preferably used. In a case where the molecular weight of the organic compound is 500 or greater, the film-forming ability is improved, and a nano-level resist pattern is easily formed. Organic compounds used as the base material component are classified into non-polymers and polymers. As the non-polymers, those having a molecular weight of 500 or greater and less than 4000 are typically used. Hereinafter, the "low-molecular-weight compound" indicates a non-polymer having a molecular weight of 500 or greater and less than 4000. As the polymer, those having a molecular weight of 1000 or greater are typically used. Hereinafter, the "resin", the "polymer compound", or the "polymer" indicates a polymer having a molecular weight of 1000 or greater. As the molecular weight of the polymer, the weight-average molecular weight in terms of polystyrene according to gel permeation chromatography (GPC) is used.

The "constitutional unit derived from acrylamide" indicates a constitutional unit that is formed by cleavage of an ethylenic double bond of acrylamide.

In the acrylamide, the hydrogen atom bonded to the carbon atom at the α-position may be substituted with a substituent, and one or both hydrogen atoms in the amino group of the acrylamide may be substituted with a substituent. Further, the carbon atom at the α-position of acrylamide indicates the carbon atom to which the carbonyl group of acrylamide is bonded, unless otherwise specified.

As the substituent which substitutes the hydrogen atom bonded to the carbon atom at the α-position of acrylamide, the same substituents as those for the substituent ($R^{\alpha 0}$) at the α-position in the above-described α-substituted acrylic acid ester can be exemplified.

The "constitutional unit derived from hydroxystyrene" indicates a constitutional unit that is formed by cleavage of an ethylenic double bond of hydroxystyrene. The "constitutional unit derived from a hydroxystyrene derivative" indicates a constitutional unit formed by cleavage of an ethylenic double bond of a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include those obtained by substituting a hydrogen atom of a hydroxyl group of hydroxystyrene, in which the hydrogen atom at the α-position may be substituted with a substituent, with an organic group; and those obtained by bonding a substituent other than a hydroxyl group to a benzene ring of hydroxystyrene in which the hydrogen atom at the α-position may be substituted with a substituent. Further, the α-position (the carbon atom at the α-position) indicates the carbon atom having a benzene ring bonded thereto, unless otherwise specified.

As the substituent which substitutes the hydrogen atom at the α-position of hydroxystyrene, the same substituents as those for the substituent at the α-position in the above-described α-substituted acrylic acid ester can be exemplified.

The "constitutional unit derived from vinylbenzoic acid or a vinylbenzoic acid derivative" indicates a constitutional unit that is formed by cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include those obtained by substituting a hydrogen atom of a carboxy group of vinylbenzoic acid, in which the hydrogen atom at the α-position may be substituted with a substituent, with an organic group; and those obtained by bonding a substituent other than a hydroxyl group or a carboxy group to a benzene ring of vinylbenzoic acid in which the hydrogen atom at the α-position may be substituted with a substituent. Further, the α-position (the carbon atom at the α-position) indicates the carbon atom having a benzene ring bonded thereto, unless otherwise specified.

The concept "styrene derivative" includes those obtained by substituting a hydrogen atom at the α-position of styrene with another substituent such as an alkyl group or a halogenated alkyl group; and derivatives thereof. Examples of the derivatives thereof include those obtained by bonding a substituent to a benzene ring of hydroxystyrene in which the hydrogen atom at the α-position may be substituted with a substituent. Further, the α-position (the carbon atom at the α-position) indicates the carbon atom having a benzene ring bonded thereto, unless otherwise specified.

The "constitutional unit derived from styrene" or "constitutional unit derived from a styrene derivative" indicates a constitutional unit formed by cleavage of an ethylenic double bond of styrene or a styrene derivative.

As the alkyl group as the substituent at the α-position, a linear or branched alkyl group is preferable, and specific examples thereof include alkyl groups of 1 to 5 carbon atoms (such as a methyl group, an ethyl group, a propyl group, an isopropyl group, an n-butyl group, an isobutyl group, a tert-butyl group, a pentyl group, an isopentyl group, and a neopentyl group).

Specific examples of the halogenated alkyl group as the substituent at the α-position include groups in which some or all hydrogen atoms in the above-described "alkyl group as the substituent at the α-position" have been substituted with halogen atoms. Examples of the halogen atom include a fluorine atom, a chlorine atom, a bromine atom, and an iodine atom. Among these, a fluorine atom is particularly preferable.

Specific examples of the hydroxyalkyl group as the substituent at the α-position include groups in which some or all hydrogen atoms in the above-described "alkyl group as the substituent at the α-position" have been substituted with a hydroxyl group. The number of hydroxyl groups in the hydroxyalkyl group is preferably in a range of 1 to 5 and most preferably 1.

In the present specification and the scope of the present patent claims, asymmetric carbons may be present and enantiomers or diastereomers may be present depending on the structures of the chemical formulae. In this case, these isomers are represented by one chemical formula. These isomers may be used alone or in the form of a mixture.

(Resist Composition)

The resist composition according to a first embodiment of the present invention is a resist composition which generates an acid upon exposure and whose solubility in a developing solution is changed due to an action of the acid and contains a base material component (A) (hereinafter, also referred to as a "component (A)") whose solubility in a developing solution is changed due to the action of an acid, an acid generator component (B) (hereinafter, also referred to as a "component (B)") which generates an acid upon exposure, and a fluorine additive component (F) (hereinafter, also referred to as a "component (F)").

In a case where a resist film is formed using the resist composition according to the present embodiment and the formed resist film is subjected to selective exposure, an acid is generated from the component (B) at an exposed portion of the resist film, and the solubility of the component (A) in a developing solution is not changed at an unexposed portion of the resist film while the solubility of the component (A) in a developing solution is changed due to the action of the acid, and thus a difference in solubility in a developing solution occurs between the exposed portion and the unexposed portion. Therefore, in a case where the resist film is developed, the exposed portion of the resist film is dissolved and removed to form a positive-tone resist pattern in a case where the resist composition is of a positive tone, whereas the unexposed portion of the resist film is dissolved and removed to form a negative-tone resist pattern in a case where the resist composition is of a negative tone.

In the present specification, a resist composition which forms a positive-tone resist pattern by dissolving and removing the exposed portion of the resist film is referred to as a positive-tone resist composition, and a resist composition which forms a negative-tone resist pattern by dissolving and removing the unexposed portion of the resist film is referred to as a negative-tone resist composition. The resist composition of the present embodiment may be a positive-tone resist composition or a negative-tone resist composition. Further, the resist composition of the present embodiment may be used in an alkali developing process using an alkali developing solution in the developing treatment in a case of forming a resist pattern or may be used in a solvent developing process using a developing solution containing an organic solvent (organic developing solution) in the developing treatment.

The resist composition of the present embodiment has a function of generating an acid upon exposure, and the component (A) in addition to the component (B) may generate an acid upon exposure.

In a case where the component (A) generates an acid upon exposure, the component (A) becomes a "base material component which generates an acid upon exposure and whose solubility in a developing solution is changed due to the action of the acid".

In a case where the component (A) is a base material component which generates an acid upon exposure and whose solubility in a developing solution is changed due to the action of the acid, it is preferable that a component (A1) described below is a polymer compound which generates an acid upon exposure and whose solubility in a developing solution is changed due to the action of the acid. As such a polymer compound, a resin having a constitutional unit that generates an acid upon exposure is exemplified. A known monomer can be used as the monomer from which the constitutional unit generating an acid upon exposure is derived.

<Component (A)>

In the resist composition of the present embodiment, it is preferable that the component (A) has a resin component (A1) whose solubility in a developing solution is changed due to the action of an acid (hereinafter, also referred to as a "component (A1)"). Since the polarity of the base material component before and after the exposure is changed by using the component (A1), an excellent development contrast can be obtained not only in an alkali developing process but also in a solvent developing process.

As the component (A), at least the component (A1) is used, and other polymer compounds and/or low-molecular-weight compounds may be used in combination with the component (A1).

In a case of applying an alkali developing process, the base material component having the component (A1) is insoluble in an alkali developing solution before exposure, but in a case where an acid is generated from the component (B) upon exposure, the action of this acid causes an increase in the polarity of the base material component, thereby increasing the solubility of the component (A1) in an alkali developing solution. Therefore, in a case where selective exposure is performed on a resist film formed by coating a support with the resist composition in the formation of a resist pattern, the exposed portion of the resist film is changed from being insoluble to being soluble in an alkali developing solution, whereas the unexposed portion of the resist film remain insoluble in an alkali developing solution, and hence, a positive-tone resist pattern is formed by performing alkali development.

Meanwhile, in a case of a solvent developing process, the base material component having the component (A1) exhibits high solubility in an organic developing solution before exposure. For example, in a case where an acid is generated from the component (B) upon exposure, the polarity of the component (A1) is increased by the action of the generated acid, thereby decreasing the solubility of the component (A1) in an organic developing solution. Therefore, in a case where selective exposure is performed on a resist film formed by coating a support with the resist composition in the formation of a resist pattern, the exposed portion of the resist film is changed from being soluble to being insoluble in an organic developing solution, whereas the unexposed portion of the resist film remain soluble in an organic developing solution. Therefore, a negative-tone resist pattern is formed by performing development using an organic developing solution so that a contrast is imparted between the exposed portion and the unexposed portion.

In the resist composition according to the present embodiment, the component (A) may be used alone or in combination of two or more kinds thereof.

In regard to component (A1)

The component (A1) is a resin component whose solubility in a developing solution is changed due to the action of an acid.

As the component (A1), those having a constitutional unit (a1) containing an acid decomposable group whose polarity is increased by the action of an acid are preferable.

Further, the component (A1) may have other constitutional units as necessary in addition to the constitutional unit (a1).

<<Constitutional Unit (a1)>>

The constitutional unit (a1) is a constitutional unit that contains an acid decomposable group whose polarity is increased due to the action of an acid.

The "acid decomposable group" indicates a group having acid decomposability in which at least a part of a bond in the structure of the acid decomposable group can be cleaved due to the action of an acid.

Examples of the acid decomposable group whose polarity is increased due to the action of an acid include groups which are decomposed due to the action of an acid to generate a polar group.

Examples of the polar group include a carboxy group, a hydroxyl group, an amino group, and a sulfo group ($-SO_3H$). Among these, a polar group containing —OH in the structure thereof (hereinafter, also referred to as a "OH-containing polar group") is preferable, a carboxy group or a hydroxyl group is more preferable, and a carboxy group is particularly preferable.

More specific examples of the acid decomposable group include a group in which the above-described polar group has been protected by an acid dissociable group (such as a group in which a hydrogen atom of the OH-containing polar group has been protected by an acid dissociable group).

Here, the "acid dissociable group" indicates both a group (i) having an acid dissociation property in which a bond between the acid dissociable group and an atom adjacent to the acid dissociable group can be cleaved due to the action of an acid; and a group (ii) in which some bonds are cleaved due to the action of an acid, a decarboxylation reaction occurs, and thus the bond between the acid dissociable group and the atom adjacent to the acid dissociable group can be cleaved.

It is necessary that the acid dissociable group that constitutes the acid decomposable group is a group which exhibits a lower polarity than that of the polar group generated by the dissociation of the acid dissociable group. Thus, in a case where the acid dissociable group is dissociated by the action of an acid, a polar group exhibiting a higher polarity than that of the acid dissociable group is generated so that the polarity is increased. As a result, the polarity of the entire component (A1) is increased. Due to the increase in the polarity, relatively, the solubility in a developing solution is changed such that the solubility is increased in a case where the developing solution is an alkali developing solution and the solubility is decreased in a case where the developing solution is an organic developing solution.

Examples of the acid dissociable group are the same as those which have been proposed as the acid dissociable groups of the base resin for a chemically amplified resist composition.

Specific examples of the acid dissociable group of the base resin for a chemically amplified resist composition include an "acetal type acid dissociable group", a "tertiary alkyl ester type acid dissociable group", and a "tertiary alkyloxycarbonyl acid dissociable group" described below.

Acetal Type Acid Dissociable Group:

Examples of the acid dissociable group that protects a carboxy group or a hydroxyl group in the polar groups include an acid dissociable group represented by Formula (a1-r-1) (hereinafter, also referred to as an "acetal type acid dissociable group").

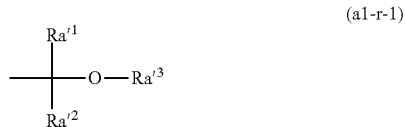

(a1-r-1)

[In the formula, $Ra'^1$ and $Ra'^2$ represent a hydrogen atom or an alkyl group. $Ra'^3$ represents a hydrocarbon group, and $Ra'^3$ may be bonded to any of $Ra'^1$ and $Ra'^2$ to form a ring.]

In Formula (a1-r-1), it is preferable that at least one of $Ra'^1$ and $Ra'^2$ represents a hydrogen atom and more preferable that both $Ra'^1$ and $Ra'^2$ represent a hydrogen atom.

In a case where $Ra'^1$ or $Ra'^2$ represents an alkyl group, examples of the alkyl group include the same alkyl groups exemplified as the substituent which may be bonded to the carbon atom at the α-position in the description on α-substituted acrylic acid ester. Among these, an alkyl group having 1 to 5 carbon atoms is preferable. Specific preferred examples thereof include linear or branched alkyl groups. More specific examples thereof include a methyl group, an ethyl group, a propyl group, an isopropyl group, an n-butyl group, an isobutyl group, a tert-butyl group, a pentyl group, an isopentyl group, and a neopentyl group. Among these, a methyl group or an ethyl group is more preferable, and a methyl group is particularly preferable.

In Formula (a1-r-1), examples of the hydrocarbon group as $Ra'^3$ include a linear or branched alkyl group and a cyclic hydrocarbon group.

The linear alkyl group has preferably 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group has preferably 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

In a case where $Ra'^3$ represents a cyclic hydrocarbon group, the hydrocarbon group may be an aliphatic hydrocarbon group or an aromatic hydrocarbon group and may be a polycyclic group or a monocyclic group.

As the aliphatic hydrocarbon group which is a monocyclic group, a group in which one hydrogen atom has been removed from a monocycloalkane is preferable. The monocycloalkane has preferably 3 to 6 carbon atoms, and specific examples thereof include cyclopentane and cyclohexane.

As the aliphatic hydrocarbon group which is a polycyclic group, a group in which one hydrogen atom has been removed from a polycycloalkane is preferable. As the polycycloalkane, a group having 7 to 12 carbon atoms is preferable, and specific examples thereof include adamantane, norbornane, isobornane, tricyclodecane, and tetracyclododecane.

In a case where the cyclic hydrocarbon group as $Ra'^3$ becomes an aromatic hydrocarbon group, the aromatic hydrocarbon group is a hydrocarbon group having at least one aromatic ring.

The aromatic ring is not particularly limited as long as the aromatic ring is a cyclic conjugated system having (4n+2) π electrons and may be monocyclic or polycyclic. The aromatic ring has preferably 5 to 30 carbon atoms, more preferably 5 to 20 carbon atoms, still more preferably 6 to 15 carbon atoms, and particularly preferably 6 to 12 carbon atoms.

Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

Specific examples of the aromatic hydrocarbon group as $Ra'^3$ include a group in which one hydrogen atom has been removed from the above-described aromatic hydrocarbon ring or aromatic hetero ring (such as an aryl group or a heteroaryl group); a group in which one hydrogen atom has been removed from an aromatic compound having two or more aromatic rings (such as biphenyl or fluorene); and a group in which one hydrogen atom of the above-described aromatic hydrocarbon ring or aromatic hetero ring has been substituted with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group). The number of carbon atoms in the alkylene group bonded to the aromatic hydrocarbon ring or aromatic hetero ring is preferably in a range of 1 to 4, more preferably 1 or 2, and particularly preferably 1.

The cyclic hydrocarbon group as $Ra'^3$ may include a substituent. Examples of the substituent include $—R^{P1}$, $—R^{P2}—O—R^{P1}$, $—R^{P2}—CO—R^{P1}$, $—R^{P2}—CO—OR^{P1}$, $—R^{P2}—O—CO—R^{P1}$, $—R^{P2}—OH$, $—R^{P2}—CN$, and $—R^{P2}—COOH$ (hereinafter, these substituents will also be collectively referred to as "$Ra^{05}$")

Here, $R^{P1}$ represents a chain-like monovalent saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. Further, $R^{P2}$ represents a single bond, a chain-like divalent saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms. Some or all hydrogen atoms in the chain-like saturated hydrocarbon group, the aliphatic cyclic saturated hydrocarbon group, and the aromatic hydrocarbon group as $R^{P1}$ and $R^{P2}$ may be substituted with fluorine atoms. The aliphatic cyclic hydrocarbon group may have one or more of one kind of substituents or one or more of each of plural kinds of the substituents.

Examples of the chain-like monovalent saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, or a cyclododecyl group; and a polycyclic aliphatic saturated hydrocarbon group such as a bicycle[2.2.2]octanyl group, a tricycle[5.2.1.0²,⁶] decanyl group, a tricycle[3.3.1.1³,⁷]decanyl group, a tetracyclo [6.2.1.1³,⁶.0²,⁷] dodecanyl group, or an adamantyl group.

Examples of the monovalent aromatic hydrocarbon group having 6 to 30 carbon atoms include a group formed by removing one hydrogen atom from an aromatic hydrocarbon ring such as benzene, biphenyl, fluorene, naphthalene, anthracene, or phenanthrene.

In a case where $Ra'^3$ is bonded to any of $Ra'^1$ and $Ra'^2$ to form a ring, the cyclic group is preferably a 4- to 7-membered ring and more preferably a 4- to 6-membered ring. Specific examples of the cyclic group include a tetrahydropyranyl group and a tetrahydrofuranyl group.

Tertiary alkyl ester type acid dissociable group:

Examples of the acid dissociable group that protects a carboxy group among the polar groups include an acid dissociable group represented by Formula (a1-r-2).

Among examples of the acid dissociable group represented by Formula (a1-r-2), for convenience, a group formed of an alkyl group is referred to as a "tertiary alkyl ester type acid dissociable group".

(a1-r-2)

[In the formula, $Ra'^4$ to $Ra'^6$ each independently represent a hydrocarbon group, and $Ra'^5$ and $Ra'^6$ may be bonded to each other to form a ring.]

Examples of the hydrocarbon group as $Ra'^4$ include a linear or branched alkyl group, a chain-like or cyclic alkenyl group, and a cyclic hydrocarbon group.

Examples of the linear or branched alkyl group and the cyclic hydrocarbon group (an aliphatic hydrocarbon group which is a monocyclic group, an aliphatic hydrocarbon group which is a polycyclic group, or an aromatic hydrocarbon group) as $Ra'^4$ include the same groups as those for $Ra'^3$.

As the chain-like or cyclic alkenyl group as $Ra'^4$, an alkenyl group having 2 to 10 carbon atoms is preferable.

Examples of the hydrocarbon group as $Ra'^5$ or $Ra'^6$ include the same groups as those for $Ra'^3$.

In a case where $Ra'^5$ and $Ra'^6$ are bonded to each other to form a ring, suitable examples thereof include a group represented by Formula (a1-r2-1), a group represented by Formula (a1-r2-2), and a group represented by Formula (a1-r2-3).

Meanwhile, in a case where $Ra'^4$ to $Ra'^6$ represent an independent hydrocarbon group without being bonded to one another, suitable examples thereof include a group represented by Formula (a1-r2-4).

(a1-r2-1)

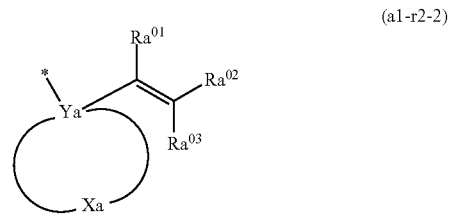

(a1-r2-2)

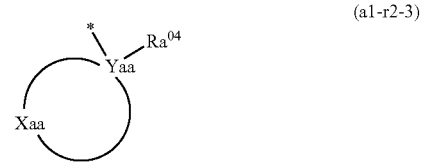

(a1-r2-3)

(a1-r2-4)

[In Formula (a1-r2-1), $Ra'^{10}$ represents an alkyl group having 1 to 10 carbon atoms or a group represented by Formula (a1-r2-r1). $Ra'^{11}$ represents a group that forms an aliphatic cyclic group with the carbon atom to which $Ra'^{10}$ has been bonded. In Formula (a1-r2-2), Ya represents a carbon atom. Xa represents a group that forms a cyclic hydrocarbon group with Ya. Some or all hydrogen atoms in this cyclic hydrocarbon group may be substituted. $Ra^{O1}$ to $Ra^{O3}$ each independently represent a hydrogen atom, a chain-like monovalent saturated hydrocarbon group having 1 to 10 carbon atoms, or a monovalent aliphatic cyclic saturated hydrocarbon group having 3 to 20 carbon atoms. Some or all hydrogen atoms in the chain-like saturated hydrocarbon group and the aliphatic cyclic saturated hydrocarbon group may be substituted. Two or more of $Ra^{O1}$ to $Ra^{O3}$ may be bonded to one another to form a cyclic structure. In Formula (a1-r2-3), Yaa represents a carbon atom. Xaa represents a group that forms an aliphatic cyclic group with Yaa. $Ra^{O4}$ represents an aromatic hydrocarbon group which may have a substituent. In Formula (a1-r2-4), $Ra'^{12}$ and $Ra'^{13}$ each independently represent a chain-like monovalent saturated hydrocarbon having 1 to 10 carbon atoms or a hydrogen atom. Some or all hydrogen atoms in this chain-like saturated hydrocarbon group may be substituted. $Ra'^{14}$ represents a hydrocarbon group which may have a substituent. The symbol * represents a bonding site.]

(a1-r2-r1)

[In the formula, $Ya^0$ represents a quaternary carbon atom. $Ra^{031}$, $Ra^{032}$, and $Ra^{033}$ each independently represent a hydrocarbon group which may have a substituent. Here, one or more of $Ra^{31}$, $Ra^{032}$, and $Ra^{033}$ represent a hydrocarbon group containing at least one polar group.]

In Formula (a1-r2-1), as the alkyl group having 1 to 10 carbon atoms as $Ra'^{10}$ the groups exemplified as the linear or branched alkyl group as $Ra'^3$ in Formula (a1-r-1) are preferable. It is preferable that $Ra'^{10}$ represents an alkyl group having 1 to 5 carbon atoms.

In Formula (a1-r2-r1), $Ya^0$ represents a quaternary carbon atom. That is, the number of adjacent carbon atoms bonded to $Ya^0$ (carbon atom) is 4.

In Formula (a1-r2-r1), $Ra^{031}$, $Ra^{032}$, and $Ra^{033}$ each independently represent a hydrocarbon group which may have a substituent. The hydrocarbon groups as $Ra^{031}$, $Ra^{032}$, and $Ra^{033}$ may each independently be a linear or branched alkyl group, a chain-like or cyclic alkenyl group, and a cyclic hydrocarbon group.

The number of carbon atoms in the linear alkyl group as $Ra^{031}$, $Ra^{032}$, and $Ra^{033}$ is preferably in a range of 1 to 5, more preferably in a range of 1 to 4, and still more preferably 1 or 2. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The number of carbon atoms in the branched alkyl group as $Ra^{031}$, $Ra^{032}$, and $Ra^{033}$ is preferably in a range of 3 to 10 and more preferably in a range of 3 to 5. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

As the chain-like or cyclic alkenyl group as $Ra^{031}$, $Ra^{032}$, and $Ra^{033}$, an alkenyl group having 2 to 10 carbon atoms is preferable.

The cyclic hydrocarbon group as $Ra^{031}$, $Ra^{032}$, and $Ra^{033}$ may be an aliphatic hydrocarbon group or an aromatic hydrocarbon group and may be a polycyclic group or a monocyclic group.

As the aliphatic hydrocarbon group which is a monocyclic group, a group in which one hydrogen atom has been removed from a monocycloalkane is preferable. The monocycloalkane has preferably 3 to 6 carbon atoms, and specific examples thereof include cyclopentane and cyclohexane.

As the aliphatic hydrocarbon group which is a polycyclic group, a group in which one hydrogen atom has been removed from a polycycloalkane is preferable. As the polycycloalkane, a group having 7 to 12 carbon atoms is preferable, and specific examples thereof include adamantane, norbornane, isobornane, tricyclodecane, and tetracyclododecane.

The aromatic hydrocarbon group as $Ra^{031}$, $Ra^{032}$, and $Ra^{033}$ is a hydrocarbon group having at least one aromatic ring. The aromatic ring is not particularly limited as long as the aromatic ring is a cyclic conjugated system having (4n+2) R electrons and may be monocyclic or polycyclic. The aromatic ring has preferably 5 to 30 carbon atoms, more preferably 5 to 20 carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring. Specific examples of the aromatic hydrocarbon group include a group in which one hydrogen atom has been removed from the above-described aromatic hydrocarbon ring or aromatic hetero ring (such as an aryl group or a heteroaryl group); a group in which one hydrogen atom has been removed from an aromatic compound having two or more aromatic rings (such as biphenyl or fluorene); and a group in which one hydrogen atom of the above-described aromatic hydrocarbon ring or aromatic hetero ring has been substituted with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group). The number of carbon atoms in the alkylene group bonded to the aromatic hydrocarbon ring or aromatic hetero ring is preferably in a range of 1 to 4, more preferably 1 or 2, and particularly preferably 1.

In a case where the hydrocarbon group represented by $Ra^{031}$, $Ra^{032}$, and $Ra^{033}$ is substituted, examples of the substituent include a hydroxy group, a carboxy group, a halogen atom (such as a fluorine atom, a chlorine atom, or a bromine atom), an alkoxy group (such as a methoxy group, an ethoxy group, a propoxy group, or a butoxy group), and an alkyloxycarbonyl group.

Among these, as the hydrocarbon group which may have a substituent as $Ra^{031}$, $Ra^{032}$, and $Ra^{033}$, a linear or branched alkyl group which may have a substituent is preferable, and a linear alkyl group is more preferable.

Here, one or more of $Ra^{031}$, $Ra^{032}$, and $Ra^{033}$ represent a hydrocarbon group containing at least a polar group.

The "hydrocarbon group containing a polar group" includes both a group in which a methylene group ($-CH_2-$) constituting a hydrocarbon group is substituted with a polar group and a group in which at least one hydrogen atom constituting a hydrocarbon group is substituted with a polar group.

As such a "hydrocarbon group containing a polar group", a functional group represented by Formula (a1-p1) is preferable.

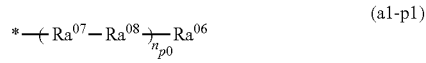

(a1-p1)

[In the formula, $Ra^{07}$ represents a divalent hydrocarbon group having 2 to 12 carbon atoms. $Ra^{08}$ represents a divalent linking group having a hetero atom. $Ra^{06}$ represents a monovalent hydrocarbon group having 1 to 12 carbon atoms. $n_{p0}$ represents an integer of 1 to 6.]

In Formula (a1-p1), $Ra^{07}$ represents a divalent hydrocarbon group having 2 to 12 carbon atoms.

The number of carbon atoms of $Ra^{07}$ is in a range of 2 to 12, preferably in a range of 2 to 8, more preferably in a range of 2 to 6, still more preferably in a range of 2 to 4, and particularly preferably 2.

As the hydrocarbon group represented by $Ra^{07}$, a chain-like or cyclic aliphatic hydrocarbon group is preferable, and a chain-like hydrocarbon group is more preferable.

Examples of $Ra^{07}$ include a linear alkanediyl group such as an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, or a dodecane-1,12-diyl group; a branched alkanediyl group such as a propane-1,2-diyl group, a 1-methylbutane-1,3-diyl group, a 2-methylpropane-1,3-diyl group, a pentane-1,4-diyl group, or a 2-methylbutane-1,4-diyl group; a cycloalkanediyl group such as a cyclobutane-1,3-diyl group, a cyclopentane-1,3-diyl group, a cyclohexane-1,4-diyl group, or a cyclooctane-1,5-diyl group; and a polycyclic divalent alicyclic hydrocarbon group such as a norbornane-1,4-diyl group, a norbornane-2,5-diyl group, an adamantane-1,5-diyl group, or an adamantane-2,6-diyl group.

Among these, an alkanediyl group is preferable, and a linear alkanediyl group is more preferable.

In Formula (a1-p1), $Ra^{08}$ represents a divalent linking group having a hetero atom.

Examples of $Ra^{08}$ include —O—, —C(=O)—O—, —C(=O)—, —O—C(=O)—O—, —C(=O)—NH—, —NH—, —NH—C(=NH)— (H may be substituted with a substituent such as an alkyl group or an acyl group), —S—, —S(=O)$_2$—, and —S(=O)$_2$—O—.

Among these, from the viewpoint of the solubility in a developing solution, —O—, —C(=O)—O—, —C(=O)—, or —O—C(=O)—O— is preferable, and —O— or —C(=O)— is particularly preferable.

In Formula (a1-p1), $Ra^{06}$ represents a monovalent hydrocarbon group having 1 to 12 carbon atoms.

The number of carbon atoms of $Ra^{06}$ is in a range of 1 to 12. From the viewpoint of the solubility in a developing solution, the number of carbon atoms thereof is preferably in a range of 1 to 8, more preferably in a range of 1 to 5, still more preferably in a range of 1 to 3, particularly preferably 1 or 2, and most preferably 1.

Examples of the hydrocarbon group as $Ra^{06}$ include a chain-like hydrocarbon group, a cyclic hydrocarbon group, and a hydrocarbon group obtained by combining a chain-like hydrocarbon group and a cyclic hydrocarbon group.

Examples of the chain-like hydrocarbon group include a methyl group, an ethyl group, an n-propyl group, an isopropyl group, an n-butyl group, a sec-butyl group, a tert-butyl group, an n-pentyl group, an n-hexyl group, an n-heptyl group, a 2-ethylhexyl group, an n-octyl group, an n-nonyl group, an n-decyl group, an n-undecyl group, and an n-dodecylgroup.

The cyclic hydrocarbon group may be an alicyclic hydrocarbon group or an aromatic hydrocarbon group.

The alicyclic hydrocarbon group may be monocyclic or polycyclic, and examples of the monocyclic alicyclic hydrocarbon group include a cycloalkyl group such as a cyclopropyl group, a cyclobutyl group, a cyclopentyl group, a cyclohexyl group, a methylcyclohexyl group, a dimethylcyclohexyl group, a cycloheptyl group, a cyclooctyl group, a cyclononyl group, or a cyclodecyl group. Examples of the polycyclic alicyclic hydrocarbon group include a decahydronaphthyl group, an adamantyl group, a 2-alkyladamantane-2-yl group, a 1-(adamantane-1-yl)alkane-1-yl group, a norbornyl group, a methylnorbonyl group, and an isobornyl group.

Examples of the aromatic hydrocarbon group include a phenyl group, a naphthyl group, an anthryl group, a p-methylphenyl group, a p-tert-butylphenyl group, a p-adamantylphenyl group, a tolyl group, a xylyl group, a cumenyl group, a mesityl group, a biphenyl group, a phenanthryl group, a 2,6-diethylphenyl group, and a 2-methyl-6-ethylphenyl group.

From the viewpoint of the solubility in a developing solution, $Ra^{06}$ represents preferably a chain-like hydrocarbon group, more preferably an alkyl group, and still more preferably a linear alkyl group.

In Formula (a1-p1), $n_{po}$ represents an integer of 1 to 6, preferably an integer of 1 to 3, more preferably 1 or 2, and still more preferably 1.

Hereinafter, specific examples of the hydrocarbon group containing at least a polar group will be described.

In the formula shown below, the symbol * represents a bonding site bonded to a quaternary carbon atom ($Ya^0$).

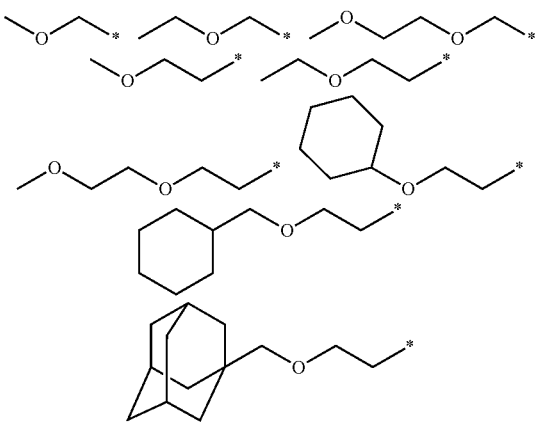

In Formula (a1-r2-r1), among $Ra^{031}$, $Ra^{032}$, and $Ra^{033}$, the number of hydrocarbon groups containing at least a polar group is 1 or more and may be appropriately determined in consideration of the solubility in a developing solution in a case of formation of a resist pattern. For example, the number of hydrocarbon groups among $Ra^{031}$, $Ra^{032}$, and $Ra^{033}$ is preferably 1 or 2 and particularly preferably 1.

The hydrocarbon group containing at least a polar group may have a substituent other than the polar group. Examples of the substituent include a halogen atom (such as a fluorine atom, a chlorine atom, or a bromine atom) and a halogenated alkyl group having 1 to 5 carbon atoms.

In Formula (a1-r2-1), preferred examples of $Ra'^{11}$ (an aliphatic cyclic group that is formed together with a carbon atom to which $Ra'^{10}$ is bonded) include the groups exemplified as the aliphatic hydrocarbon group which is a monocyclic group or a polycyclic group as $Ra^{t3}$ in Formula (a1-r-1).

In Formula (a1-r2-2), as the cyclic hydrocarbon group that is formed by Xa together with Ya, a group formed by further removing one or more hydrogen atoms from the cyclic monovalent hydrocarbon group (an aliphatic hydrocarbon group) as $Ra^{t3}$ in Formula (a1-r-1) is exemplified.

The cyclic hydrocarbon group that is formed by Xa together with Ya may have a substituent. Examples of the substituent include those which are the same as the substituents which may be included in the cyclic hydrocarbon group as $Ra^{t3}$.

In Formula (a1-r2-2), examples of the chain-like monovalent hydrocarbon group having 1 to 10 carbon atoms as $Ra^{01}$ to $Ra^{03}$ include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms as $Ra^{o1}$ to $Ra^{o3}$ include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, or a cyclododecyl group; and a polycyclic aliphatic saturated hydrocarbon group such as a bicycle[2.2.2] octanyl group, a tricycle [5.2.1.02,6] decanyl group, a tricycle[3.3.1.13,7]decanyl group, a tetracyclo[6.2.1.13,6.02,7] dodecanyl group, or an adamantyl group.

From the viewpoint of easily synthesizing a monomer compound from which the constitutional unit (a1) is derived, it is preferable that $Ra^{o1}$ to $Ra^{o3}$ represent a hydrogen atom or a chain-like monovalent saturated hydrocarbon group having 1 to 10 carbon atoms. Among these, a hydrogen atom, a methyl group, or an ethyl group is more preferable, and a hydrogen atom is particularly preferable.

Examples of the substituent included in the chain-like saturated hydrocarbon group or the aliphatic cyclic saturated hydrocarbon group represented by $Ra^{o1}$ to $Ra^{o3}$ are the same as those exemplified as $Ra^5$.

Examples of the group having a carbon-carbon double bond generated by two or more of $Ra^{o1}$ to $Ra^{o3}$ being bonded to one another to form a cyclic structure include a cyclopentenyl group, a cyclohexenyl group, a methylcyclopentenyl group, a methylcyclohexenyl group, a cyclopentylidenethenyl group, and a cyclohexylidenethenyl group. Among these, from the viewpoint of easily synthesizing a monomer compound from which the constitutional unit (a1) is derived, a cyclopentenyl group, a cyclohexenyl group, or a cyclopentylidenethenyl group is preferable.

In Formula (a1-r2-3), as the aliphatic cyclic group that is formed by Xaa together with Yaa, the group exemplified as the aliphatic hydrocarbon group which is a monocyclic group or a polycyclic group as $Ra^{'3}$ in Formula (a1-r-1) is preferable.

In Formula (a1-r2-3), examples of the aromatic hydrocarbon group as $Ra^{o4}$ include a group in which one or more hydrogen atoms have been removed from an aromatic hydrocarbon ring having 5 to 30 carbon atoms. Among the examples, $Ra^{o4}$ represents preferably a group in which one or more hydrogen atoms have been removed from an aromatic hydrocarbon ring having 6 to 15 carbon atoms, more preferably a group in which one or more hydrogen atoms have been removed from benzene, naphthalene, anthracene, or phenanthrene, still more preferably a group in which one or more hydrogen atoms have been removed from benzene, naphthalene, or anthracene, particularly preferably a group in which one or more hydrogen atoms have been removed from benzene or naphthalene, and most preferably a group in which one or more hydrogen atoms have been removed from benzene.

Examples of the substituent which may be included in $Ra^{o4}$ in Formula (a1-r2-3) include a methyl group, an ethyl group, a propyl group, a hydroxyl group, a carboxyl group, a halogen atom (such as a fluorine atom, a chlorine atom, or a bromine atom), an alkoxy group (such as a methoxy group, an ethoxy group, a propoxy group, or a butoxy group), and an alkyloxycarbonyl group.

In Formula (a1-r2-4), $Ra^{'12}$ and $Ra^{'13}$ each independently represent a chain-like monovalent saturated hydrocarbon having 1 to 10 carbon atoms or a hydrogen atom. Examples of the chain-like monovalent saturated hydrocarbon group having 1 to 10 carbon atoms as $Ra^{'12}$ and $Ra^{'13}$ include the same groups as those for the chain-like monovalent saturated hydrocarbon group having 1 to 10 carbon atoms as $Ra^{o1}$ to $Ra^{o3}$. Some or all hydrogen atoms in this chain-like saturated hydrocarbon group may be substituted.

$Ra^{'12}$ and $Ra^{'13}$ represent preferably a hydrogen atom or an alkyl group having 1 to 5 carbon atoms, more preferably an alkyl group having 1 to 5 carbon atoms, still more preferably a methyl group or an ethyl group, and particularly preferably a methyl group.

In a case where the chain-like saturated hydrocarbon group represented by $Ra^{'12}$ and $Ra^{'13}$ is substituted, examples of the substituent are the same as those exemplified as $Ra^{o5}$.

In Formula (a1-r2-4), $Ra^{'14}$ represents a hydrocarbon group which may have a substituent. Examples of the hydrocarbon group as $Ra^{'14}$ include a linear or branched alkyl group and a cyclic hydrocarbon group.

The linear alkyl group as $Ra^{'14}$ has preferably 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group as $Ra^{'14}$ has preferably 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

In a case where $Ra^{'14}$ represents a cyclic hydrocarbon group, the hydrocarbon group may be an aliphatic hydrocarbon group or an aromatic hydrocarbon group and may be polycyclic or monocyclic.

As the aliphatic hydrocarbon group which is a monocyclic group, a group in which one hydrogen atom has been removed from a monocycloalkane is preferable. The monocycloalkane has preferably 3 to 6 carbon atoms, and specific examples thereof include cyclopentane and cyclohexane.

As the aliphatic hydrocarbon group which is a polycyclic group, a group in which one hydrogen atom has been removed from a polycycloalkane is preferable. As the polycycloalkane, a group having 7 to 12 carbon atoms is preferable, and specific examples thereof include adamantane, norbornane, isobornane, tricyclodecane, and tetracyclododecane.

Examples of the aromatic hydrocarbon group as $Ra^{'14}$ include the same groups as those for the aromatic hydrocarbon group as $Ra^{o4}$. Among these, $Ra^{'14}$ represents preferably a group in which one or more hydrogen atoms have been removed from an aromatic hydrocarbon ring having 6 to 15 carbon atoms, more preferably a group in which one or more hydrogen atoms have been removed from benzene, naphthalene, anthracene, or phenanthrene, still more preferably a group in which one or more hydrogen atoms have been removed from benzene, naphthalene, or anthracene, particularly preferably a group in which one or more hydrogen atoms have been removed from naphthalene or anthracene, and most preferably a group in which one or more hydrogen atoms have been removed from naphthalene.

Examples of the substituent which may be included in $Ra^{'14}$ include the same groups as those for the substituent which may be included in $Ra^{o4}$.

In a case where $Ra^{'14}$ in Formula (a1-r2-4) represents a naphthyl group, the position bonded to the tertiary carbon atom in Formula (a1-r2-4) may be the 1-position or the 2-position of the naphthyl group.

In a case where $Ra^{l14}$ in Formula (a1-r2-4) represents an anthryl group, the position bonded to the tertiary carbon atom in Formula (a1-r2-4) may be the 1-position, the 2-position, or the 9-position of the anthryl group.

Specific examples of the group represented by Formula (a1-r2-1) are shown below.

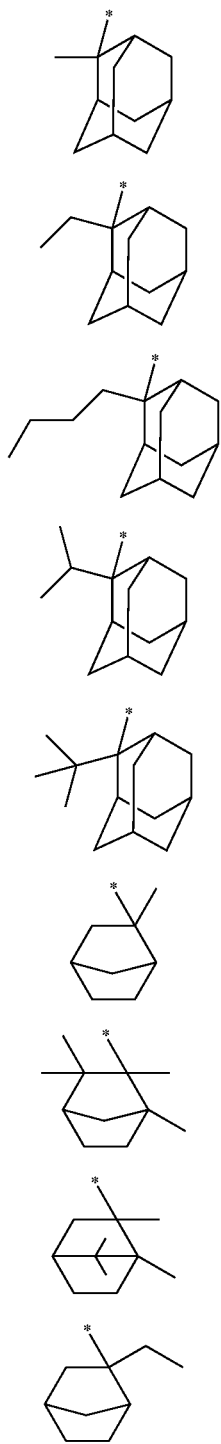

(r-pr-m1)

(r-pr-m2)

(r-pr-m3)

(r-pr-m4)

(r-pr-m5)

(r-pr-m6)

(r-pr-m7)

(r-pr-m8)

(r-pr-m9)

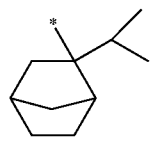

(r-pr-m10)

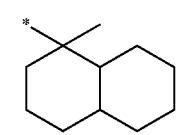

(r-pr-m11)

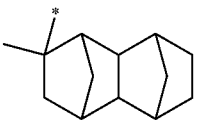

(r-pr-m12)

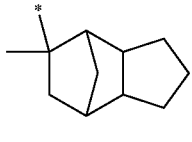

(r-pr-m13)

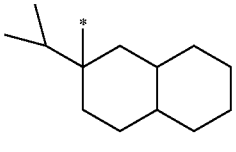

(r-pr-m14)

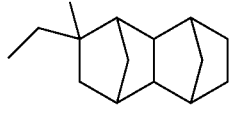

(r-pr-m15)

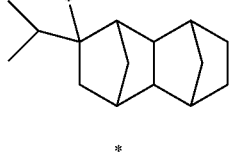

(r-pr-m16)

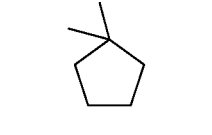

(r-pr-m17)

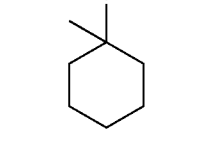

(r-pr-s1)

(r-pr-s2)

(r-pr-s3)

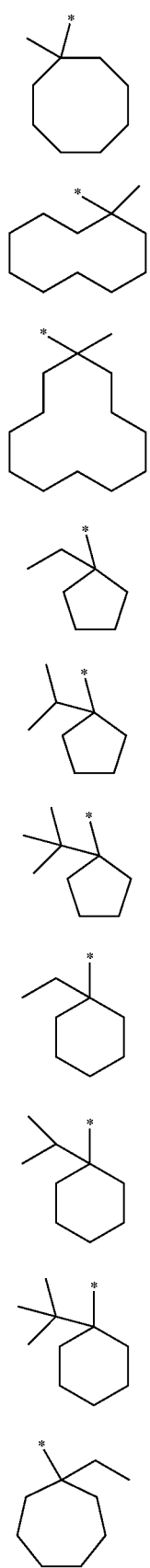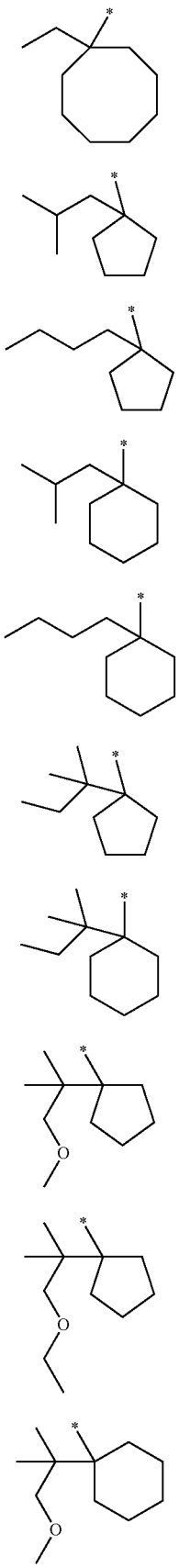

(r-pr-sp4)
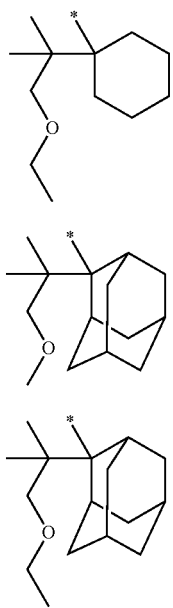
(r-pr-mp1)
(r-pr-mp2)
Specific examples of the group represented by Formula (a1-r2-2) are shown below.
(r-pr-sv1)
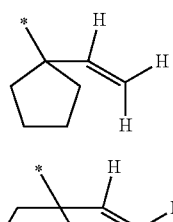
(r-pr-sv2)
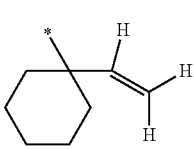
(r-pr-sv3)
(r-pr-sv4)
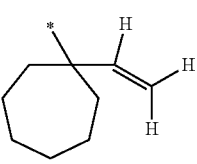
(r-pr-sv5)
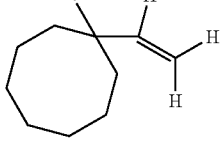
(r-pr-sv6)
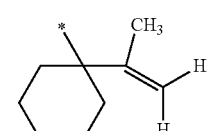
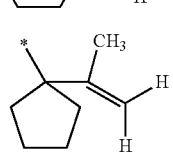
(r-pr-sv7)
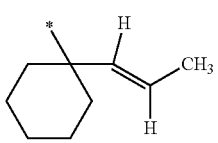
(r-pr-sv8)
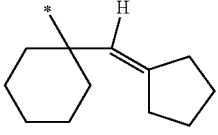
(r-pr-sv9)
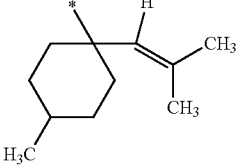
(r-pr-sv10)
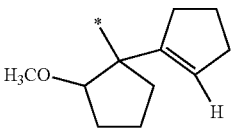
(r-pr-sv11)
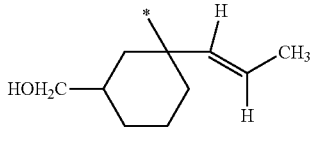
(r-pr-sv12)
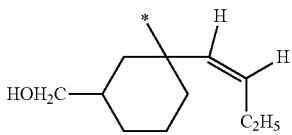
(r-pr-mv1)
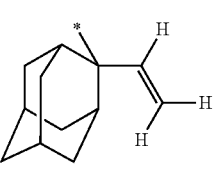
(r-pr-mv2)
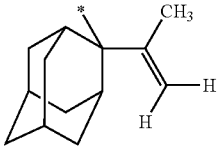
(r-pr-mv3)
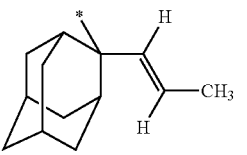
(r-pr-mv4)
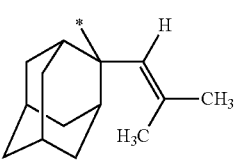

-continued
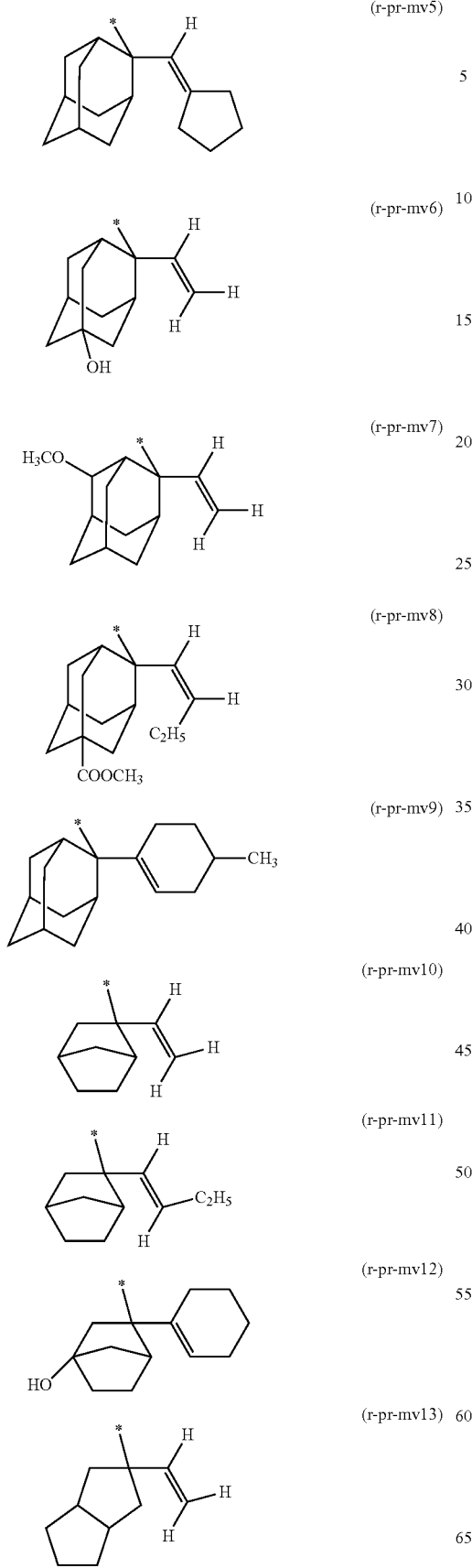
(r-pr-mv5)
(r-pr-mv6)
(r-pr-mv7)
(r-pr-mv8)
(r-pr-mv9)
(r-pr-mv10)
(r-pr-mv11)
(r-pr-mv12)
(r-pr-mv13)
-continued
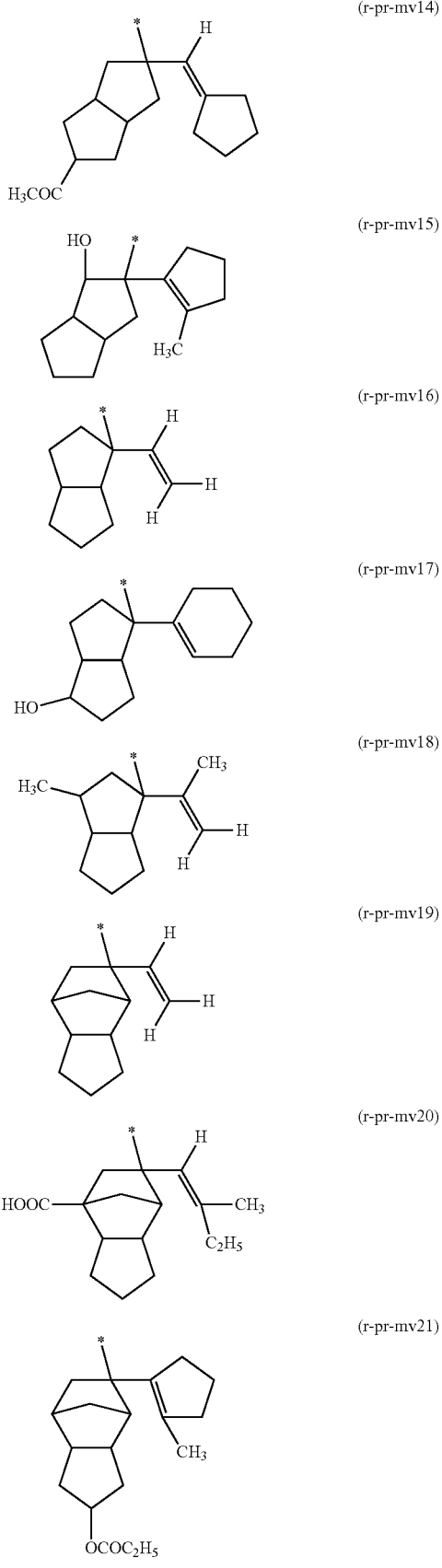
(r-pr-mv14)
(r-pr-mv15)
(r-pr-mv16)
(r-pr-mv17)
(r-pr-mv18)
(r-pr-mv19)
(r-pr-mv20)
(r-pr-mv21)

Specific examples of the group represented by Formula (a1-r2-3) are shown below.
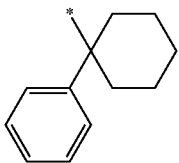 (r-pr-sa1)
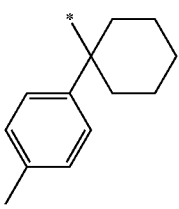 (r-pr-sa2)
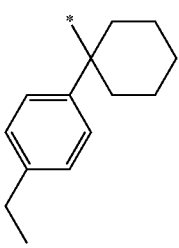 (r-pr-sa3)
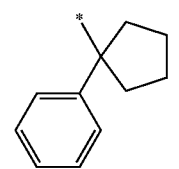 (r-pr-sa4)
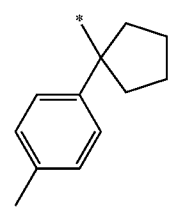 (r-pr-sa5)
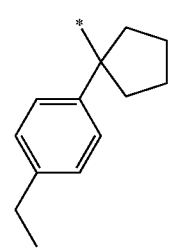 (r-pr-sa6)
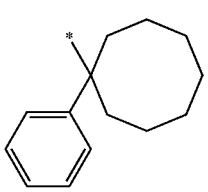 (r-pr-sa7)
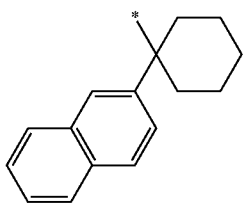 (r-pr-sa8)
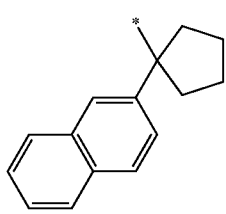 (r-pr-sa9)
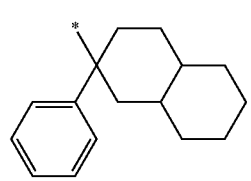 (r-pr-ma1)
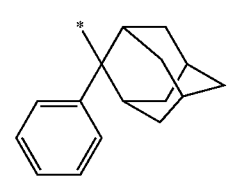 (r-pr-ma2)
Specific examples of the group represented by Formula (a1-r2-4) are shown below.
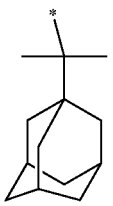 (r-pr-cm1)
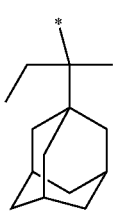 (r-pr-cm2)
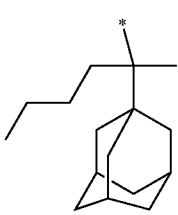 (r-pr-cm3)

(r-pr-cm4) 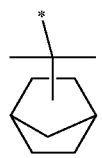

(r-pr-cm5) 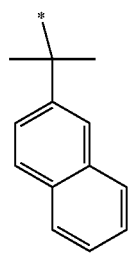

(r-pr-cm6) 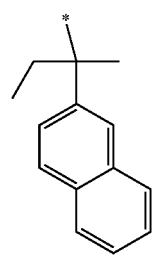

(r-pr-cm7) 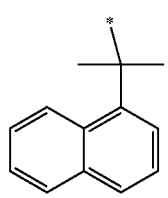

(r-pr-cm8) 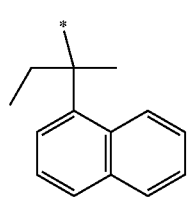

(r-pr-cs1) 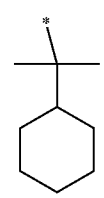

(r-pr-cs2) 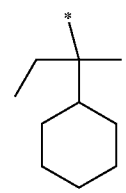

(r-pr-cs3) 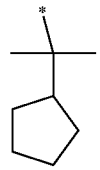

(r-pr-cs4) 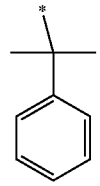

(r-pr-cs5) 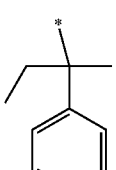

(r-pr-c1) 

(r-pr-c2)

(r-pr-c3)

Tertiary Alkyloxycarbonyl Acid Dissociable Group:

Examples of the acid dissociable group that protects a hydroxyl group among the polar groups include an acid dissociable group (hereinafter, for convenience, also referred to as a "tertiary alkyloxycarbonyl acid dissociable group") represented by Formula (a1-r-3) shown below.

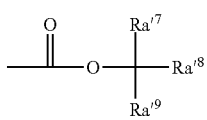

(a1-r-3)

[In the formula, $Ra'^7$ to $Ra'^9$ each independently represent an alkyl group.]

In Formula (a1-r-3), $Ra'^7$ to $Ra'^9$ each independently represent preferably an alkyl group having 1 to 5 carbon atoms and more preferably an alkyl group having 1 to 3 carbon atoms.

Further, the total number of carbon atoms in each alkyl group is preferably in a range of 3 to 7, more preferably in a range of 3 to 5, and most preferably 3 or 4.

Examples of the constitutional unit (a1) include a constitutional unit derived from acrylic acid ester in which the hydrogen atom bonded to the carbon atom at the α-position may be substituted with a substituent; a constitutional unit derived from acrylamide; a constitutional unit in which at least some hydrogen atoms in a hydroxyl group of a constitutional unit derived from hydroxystyrene or a hydroxystyrene derivative are protected by a substituent containing the acid decomposable group; and a constitutional unit in which at least some hydrogen atoms in —C(=O)—OH of a constitutional unit derived from vinylbenzoic acid or a vinylbenzoic acid derivative are protected by a substituent containing the acid decomposable group.

Among the examples, as the constitutional unit (a1), a constitutional unit derived from acrylic acid ester in which the hydrogen atom bonded to the carbon atom at the α-position may be substituted with a substituent is preferable.

Specific preferred examples of such a constitutional unit (a1) include constitutional units represented by Formula (a1-1) or (a1-2) shown below.

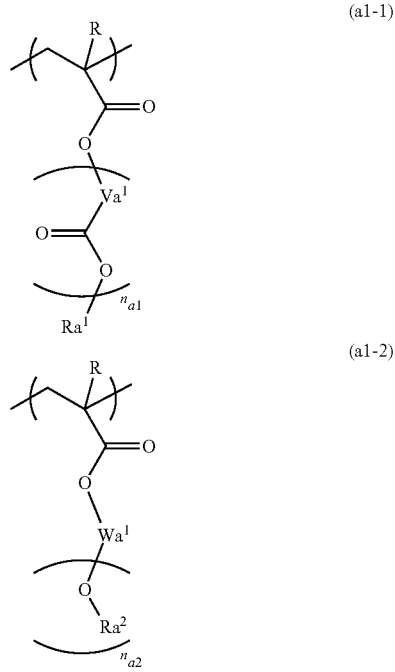

[In the formulae, R represents a hydrogen atom, an alkyl group having 1 to 5 carbon atoms, or a halogenated alkyl group having 1 to 5 carbon atoms. $Va^1$ represents a divalent hydrocarbon group which may contain an ether bond. $n_{a1}$ represents an integer of 0 to 2. $Ra^1$ represents an acid dissociable group represented by Formula (a1-r-1) or (a1-r-2). $Wa^1$ represents a ($n_{a2}$+1)-valent hydrocarbon group, $n_{a2}$ represents an integer of 1 to 3, and $Ra^2$ represents an acid dissociable group represented by Formula (a1-r-1) or (a1-r-3)].

In Formula (a1-1), as the alkyl group having 1 to 5 carbon atoms as R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which some or all hydrogen atoms in the alkyl group having 1 to 5 carbon atoms have been substituted with halogen atoms. Examples of the halogen atom include a fluorine atom, a chlorine atom, a bromine atom, and an iodine atom. Among these, a fluorine atom is particularly preferable.

As R, a hydrogen atom, an alkyl group having 1 to 5 carbon atoms, or a fluorinated alkyl group having 1 to 5 carbon atoms is preferable, and a hydrogen atom or a methyl group is most preferable from the viewpoint of the industrial availability.

In Formula (a1-1), the divalent hydrocarbon group as $Va^1$ may be an aliphatic hydrocarbon group or an aromatic hydrocarbon group.

The aliphatic hydrocarbon group as the divalent hydrocarbon group represented by $Va^1$ may be saturated or unsaturated. In general, it is preferable that the aliphatic hydrocarbon group is saturated.

More specific examples of the aliphatic hydrocarbon group include a linear or branched aliphatic hydrocarbon group and an aliphatic hydrocarbon group having a ring in the structure thereof.

The linear aliphatic hydrocarbon group has preferably 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—], and a pentamethylene group [—(CH$_2$)$_5$—].

The branched aliphatic hydrocarbon group has preferably 2 to 10 carbon atoms, more preferably 3 to 6 carbon atoms, still more preferably 3 or 4 carbon atoms, and most preferably 3 carbon atoms.

As the branched aliphatic hydrocarbon group, a branched alkylene group is preferable, and specific examples thereof include alkylalkylene groups, for example, alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group in the alkylalkylene group, a linear alkyl group having 1 to 5 carbon atoms is preferable.

Examples of the aliphatic hydrocarbon group having a ring in the structure thereof include an alicyclic hydrocarbon group (a group in which two hydrogen atoms have been removed from an aliphatic hydrocarbon ring), a group in which the alicyclic hydrocarbon group is bonded to the terminal of the linear or branched aliphatic hydrocarbon group, and a group in which the alicyclic hydrocarbon group is interposed in the linear or branched aliphatic hydrocarbon group. Examples of the linear or branched aliphatic hydrocarbon group include the same groups as those for the linear aliphatic hydrocarbon group or the branched aliphatic hydrocarbon group.

The alicyclic hydrocarbon group has preferably 3 to 20 carbon atoms and more preferably 3 to 12 carbon atoms.

The alicyclic hydrocarbon group may be monocyclic or polycyclic. As the monocyclic alicyclic hydrocarbon group, a group in which two hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which two hydrogen atoms have been removed from a polycycloalkane is preferable. As the polycycloalkane, a group having 7 to 12 carbon atoms is preferable. Specific examples thereof include adamantane, norbornane, isobornane, tricyclodecane, and tetracyclododecane.

The aromatic hydrocarbon group as the divalent hydrocarbon group represented by $Va^1$ is a hydrocarbon group having an aromatic ring.

The aromatic hydrocarbon group has preferably 3 to 30 carbon atoms, more preferably 5 to 30 carbon atoms, still more preferably 5 to 20 carbon atoms, particularly preferably 6 to 15 carbon atoms, and most preferably 6 to 12 carbon atoms. Here, the number of carbon atoms in a substituent is not included in the number of carbon atoms.

Specific examples of the aromatic ring contained in the aromatic hydrocarbon group include aromatic hydrocarbon rings such as benzene, biphenyl, fluorene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom.

Specific examples of the aromatic hydrocarbon group include a group in which two hydrogen atoms have been removed from the above-described aromatic hydrocarbon ring (an arylene group); and a group in which one hydrogen atom of a group (an aryl group) formed by removing one hydrogen atom from the aromatic hydrocarbon ring has been substituted with an alkylene group (for example, a group formed by further removing one more hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group). The alkylene group (an alkyl chain in the arylalkyl group) has preferably 1 to 4 carbon atoms, more preferably 1 or 2 carbon atoms, and particularly preferably 1 carbon atom.

In Formula (a1-1), $Ra^1$ represents an acid dissociable group represented by Formula (a1-r-1) or (a1-r-2).

In Formula (a1-2), the $(n_{a2}+1)$-valent hydrocarbon group as $Wa^1$ may be an aliphatic hydrocarbon group or an aromatic hydrocarbon group. The aliphatic hydrocarbon group indicates a hydrocarbon group that has no aromaticity and may be saturated or unsaturated. In general, it is preferable that the aliphatic hydrocarbon group is saturated. Examples of the aliphatic hydrocarbon group include a linear or branched aliphatic hydrocarbon group, an aliphatic hydrocarbon group having a ring in the structure thereof, and a group obtained by combining the linear or branched aliphatic hydrocarbon group and the aliphatic hydrocarbon group having a ring in the structure thereof.

The valency of $n_{a2}+1$ is preferably divalent, trivalent, or tetravalent and more preferably divalent or trivalent.

In Formula (a1-2), $Ra^2$ represents an acid dissociable group represented by Formula (a1-r-1) or (a1-r-3).

Specific examples of the constitutional unit represented by Formula (a1-1) are shown below. In the formulae shown below, Ra represents a hydrogen atom, a methyl group, or a trifluoromethyl group.

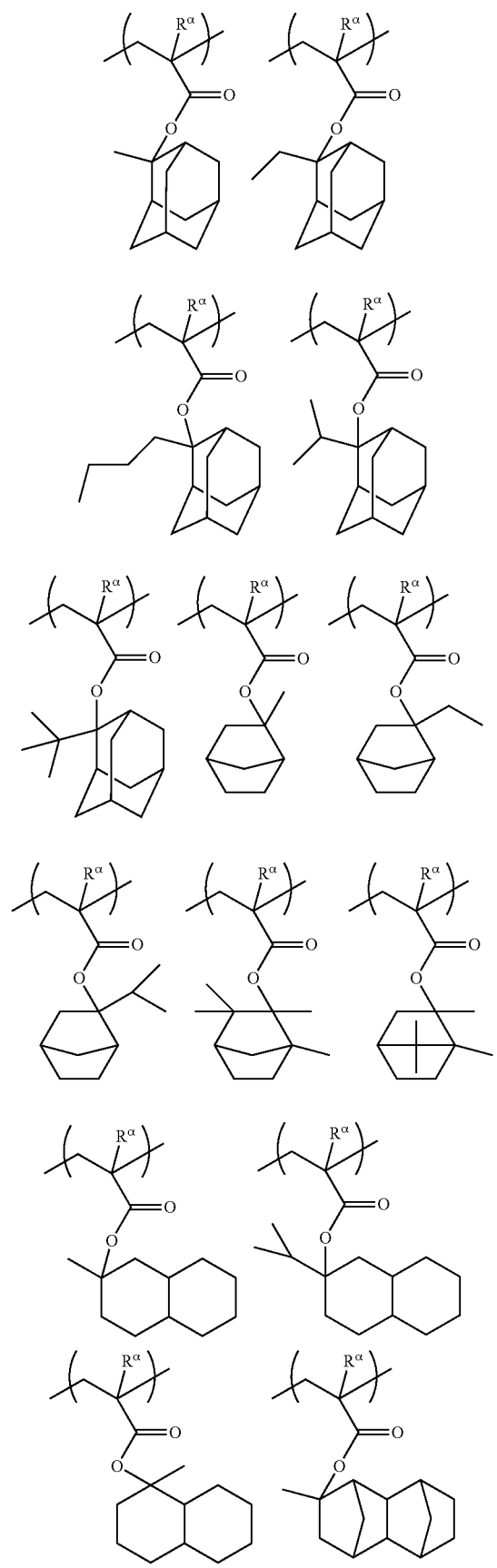

-continued
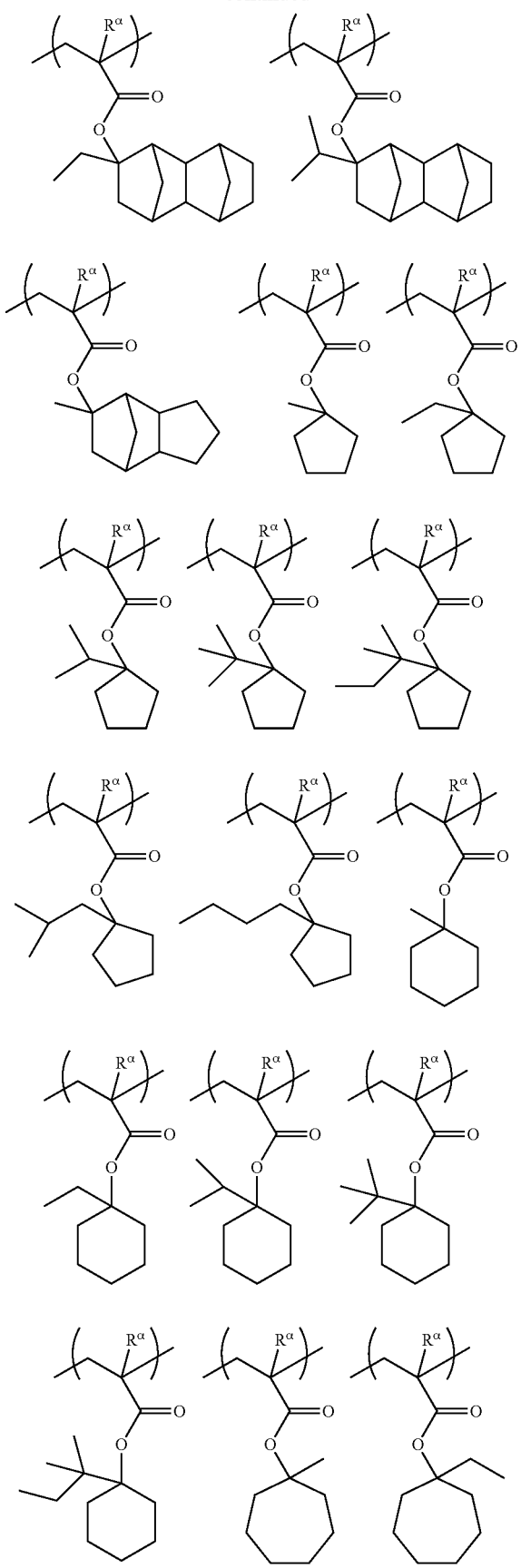
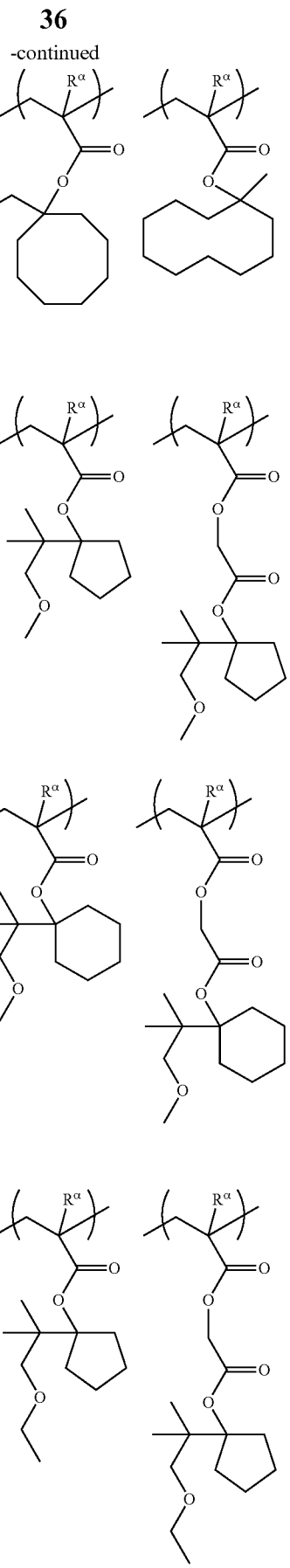

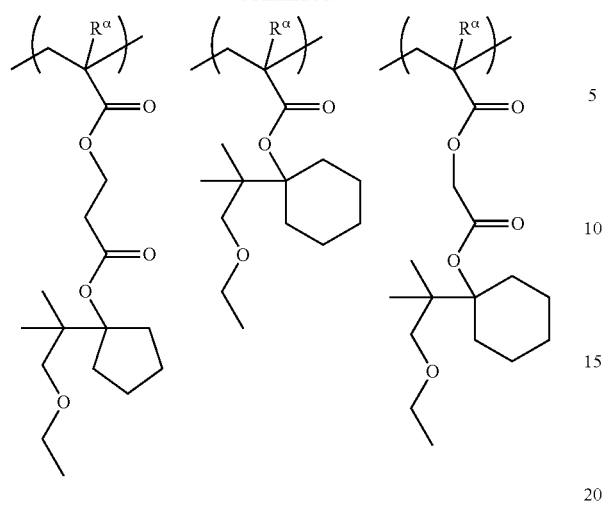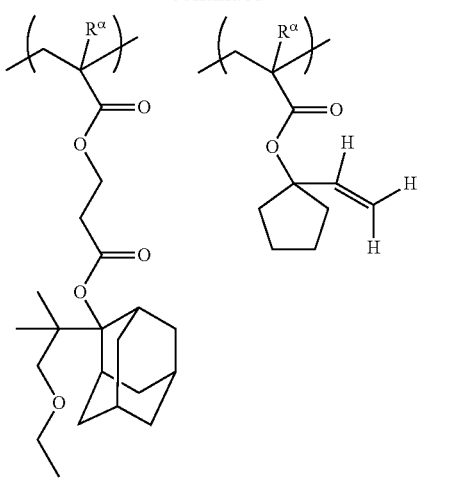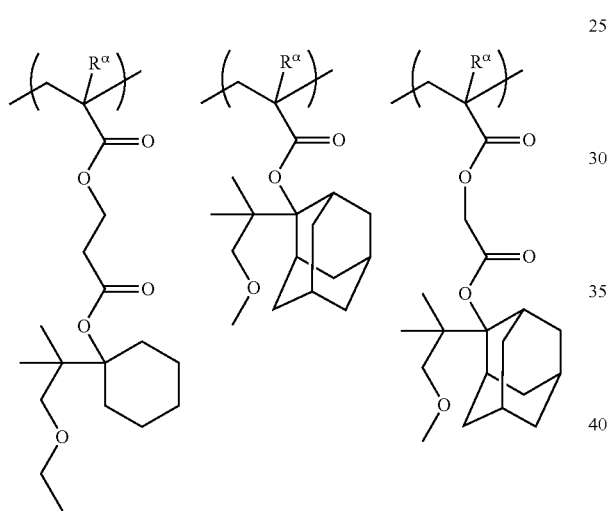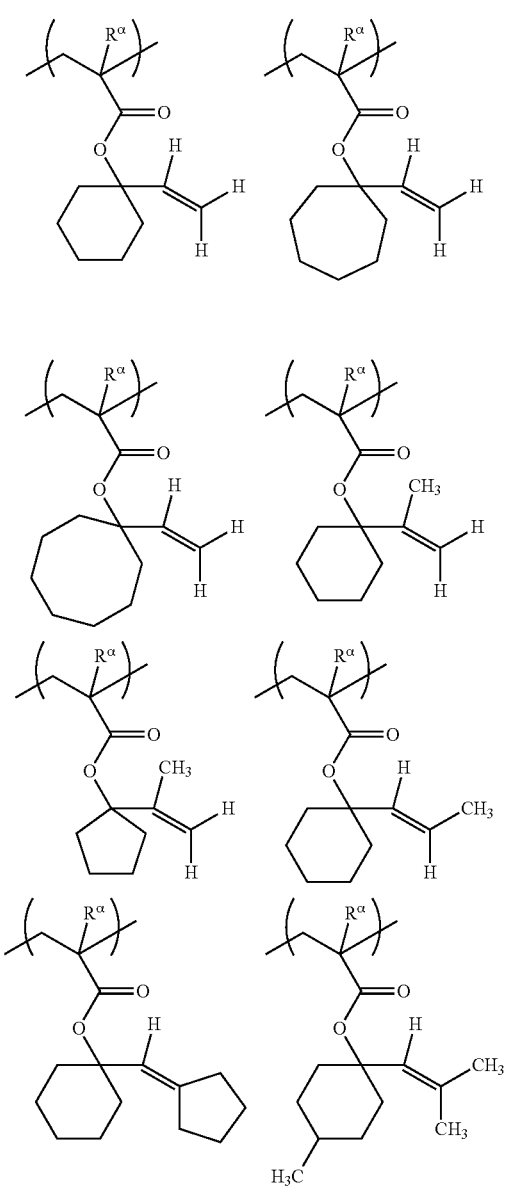

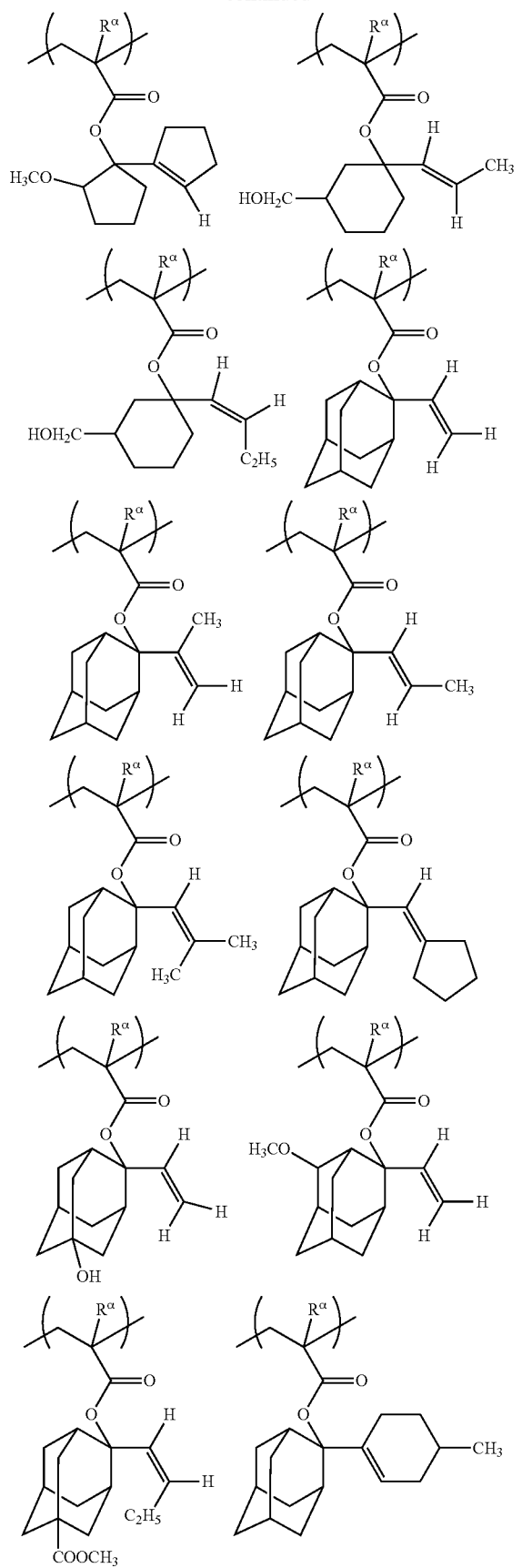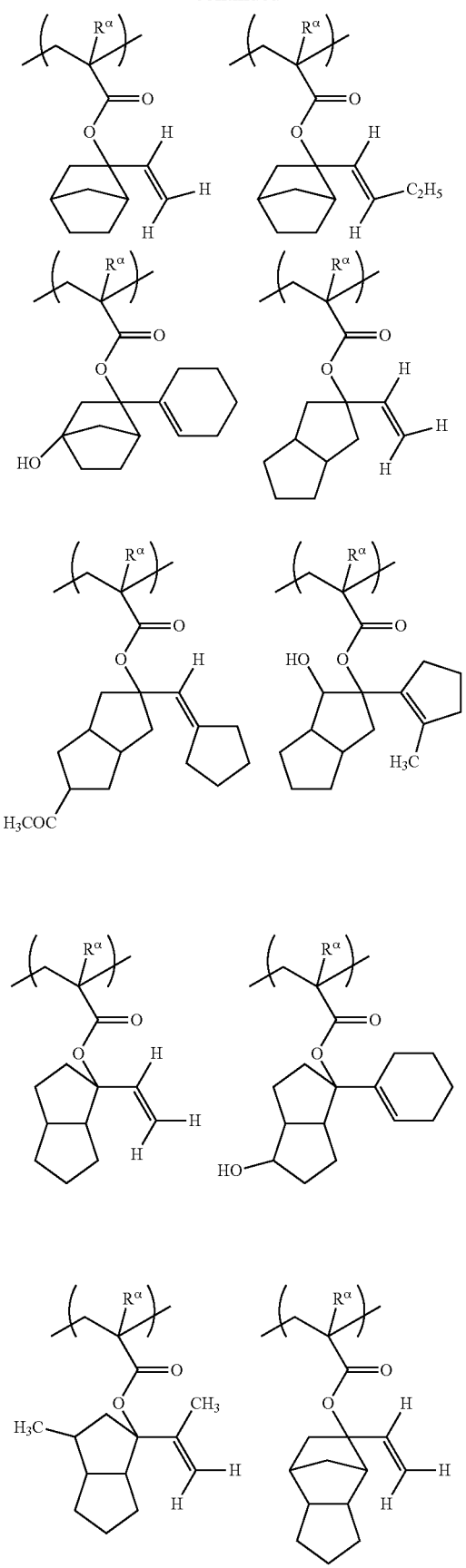

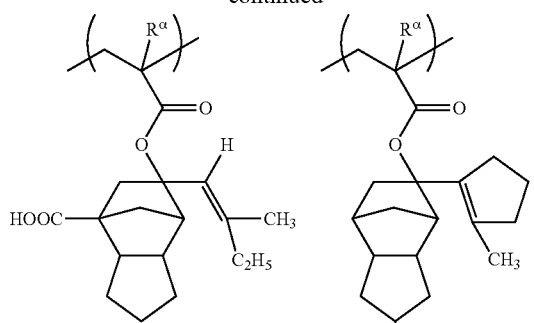
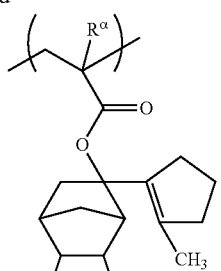
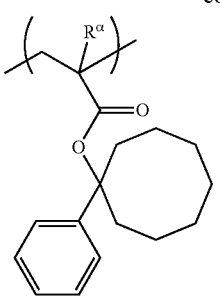
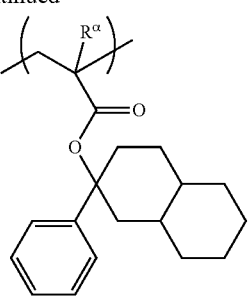
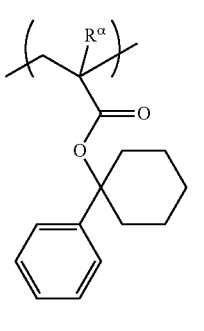
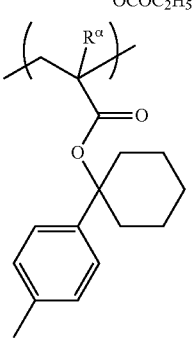
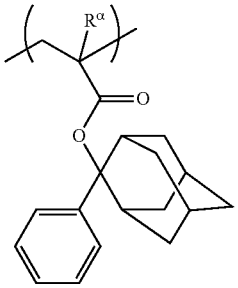
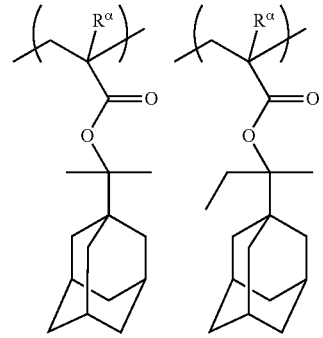
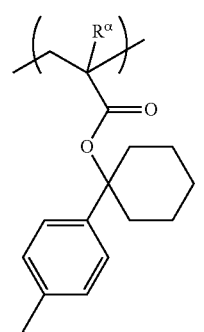
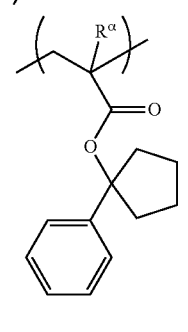
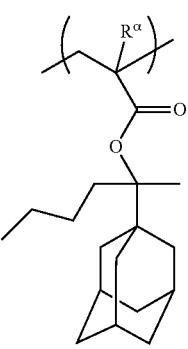
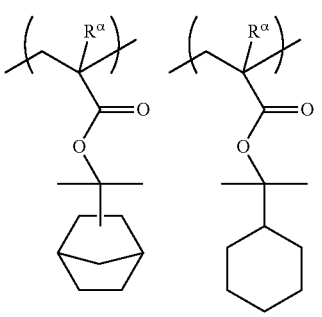
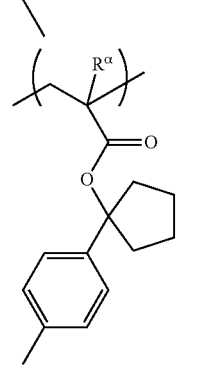
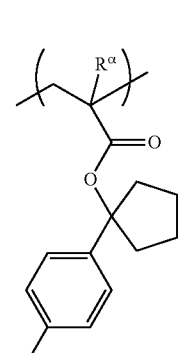
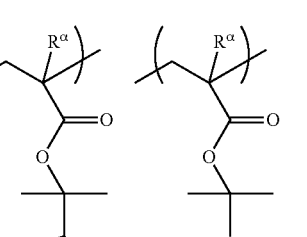
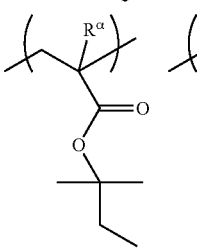
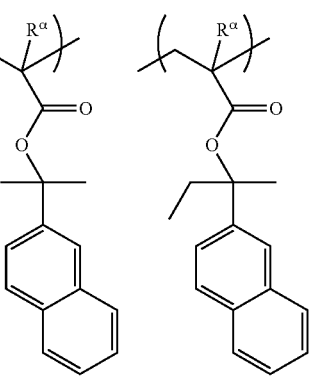
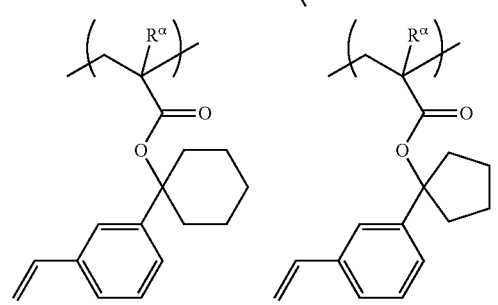

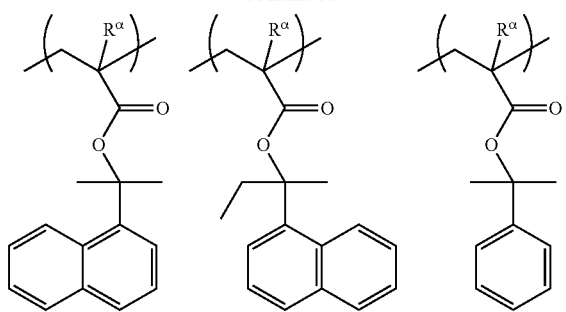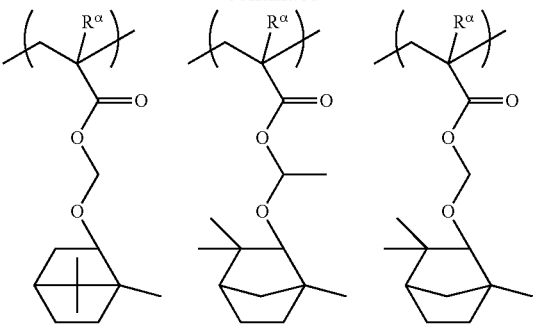

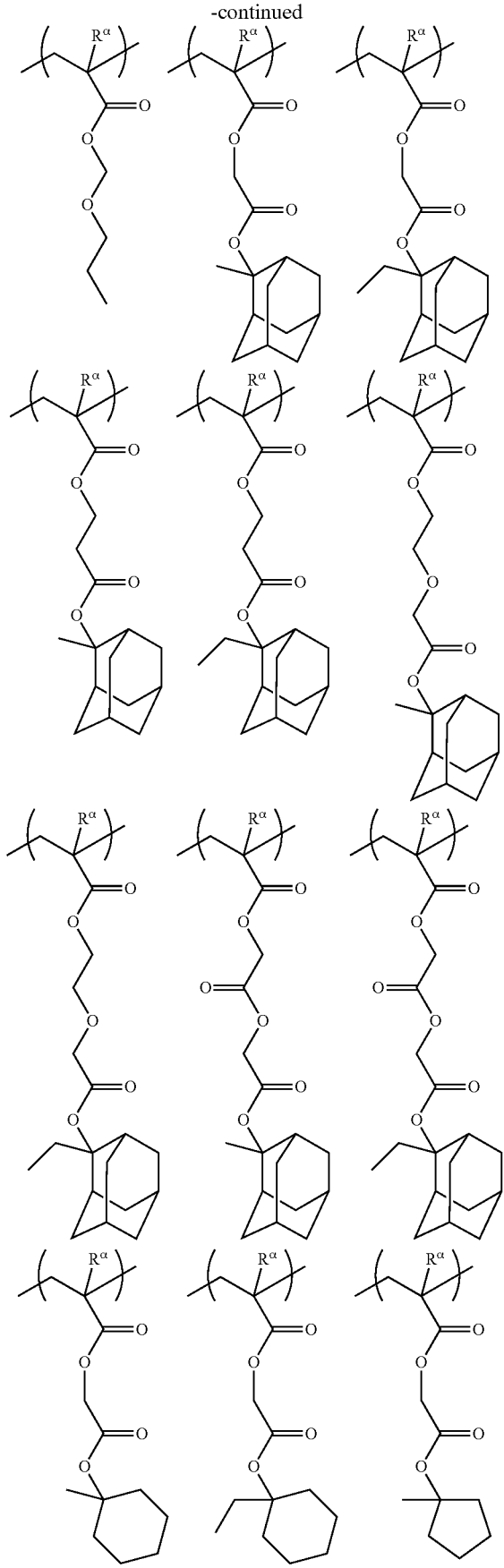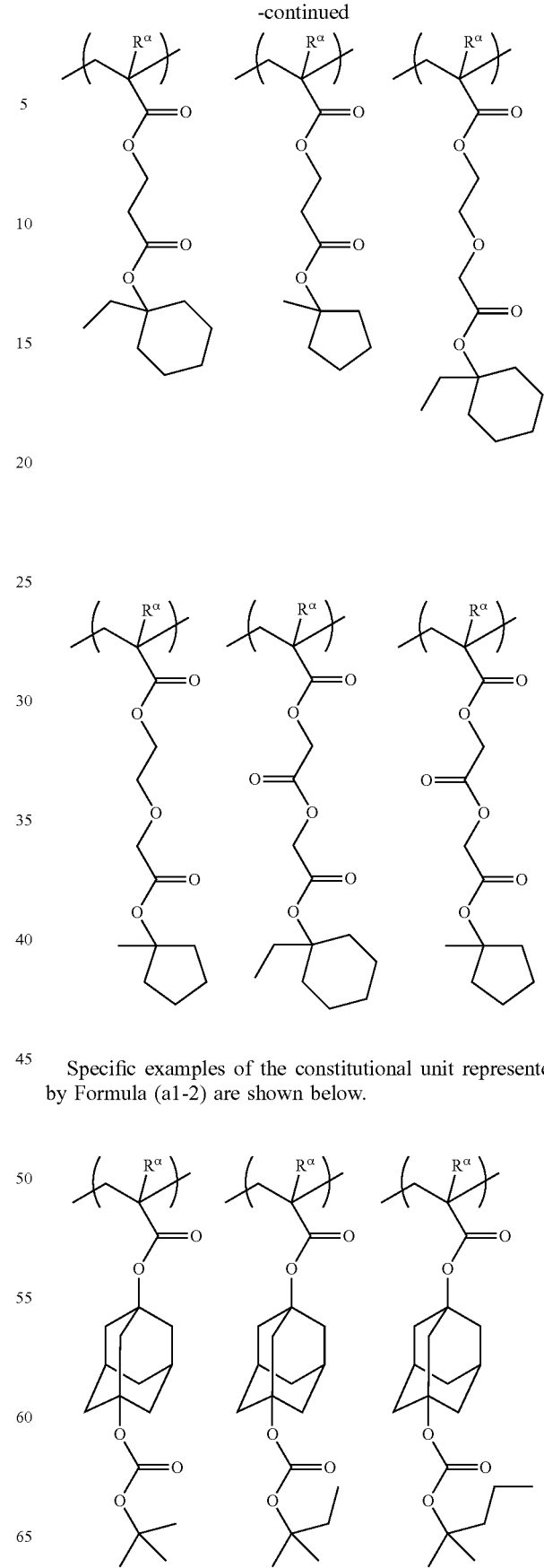
Specific examples of the constitutional unit represented by Formula (a1-2) are shown below.

-continued

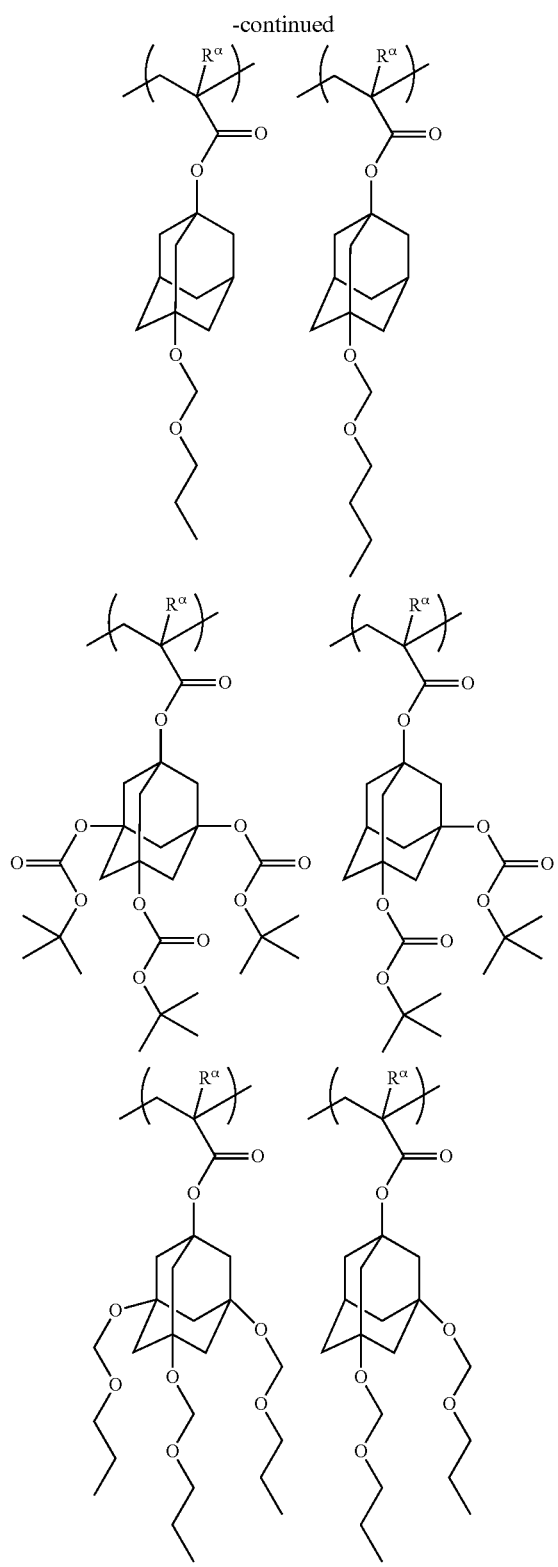

The constitutional unit (a1) included in the component (A1) may be used alone or two or more kinds thereof.

Since the lithography characteristics (the sensitivity, the shape, and the like) are easily improved using electron beams or EUV, a constitutional unit represented by Formula (a1-1) is preferable as the constitutional unit (a1).

Among the examples, as the constitutional unit (a1), those having a constitutional unit represented by Formula (a1-1-1) are particularly preferable.

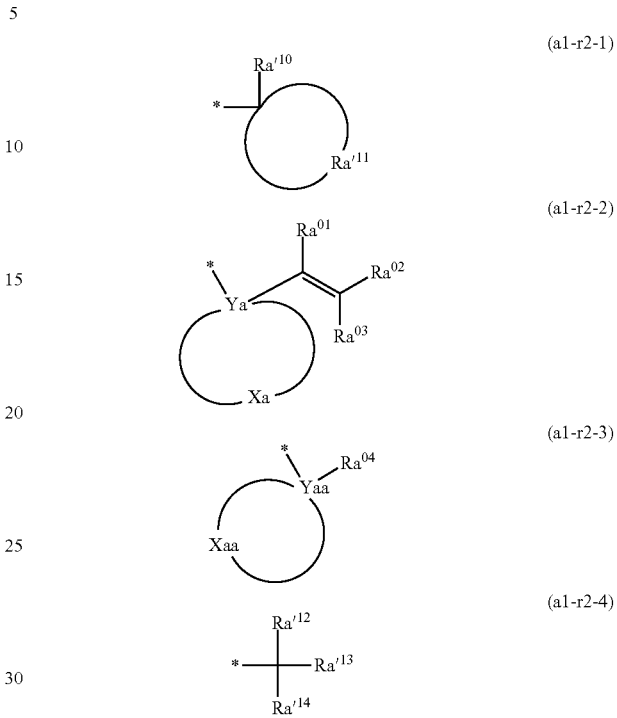

[In the formulae, $Ra^{1''}$ represents an acid dissociable group represented by Formula (a1-r2-1), (a1-r2-3), or (a1-r2-4).

In Formula (a1-1-1), R, $Va^1$, and $n_{a1}$ each have the same definition as that for R, $Va^1$, and $n_{a1}$ in Formula (a1-1).

The description of the acid dissociable group represented by Formula (a1-r2-1), (a1-r2-3), or (a1-r2-4) is the same as described above. Among these, it is preferable to select those in which the acid dissociable group is a cyclic group because the reactivity is enhanced for EB or EUV, which is preferable.

The proportion of the constitutional unit (a1) in the component (A1) is preferably in a range of 5% to 80% by mole, more preferably in a range of 10% to 75% by mole, still more preferably in a range of 30% to 70% by mole, and particularly preferably in a range of 30% to 60% by mole with respect to the total amount (100% by mole) of all constitutional units constituting the component (A1).

By setting the proportion of the constitutional unit (a1) to be greater than or equal to the lower limit of the above-described preferable range, lithography characteristics of enhancement of the sensitivity and the resolution and reduction of the roughness are improved. Further, in a case where the proportion of the constitutional unit (a1) is less than or equal to the upper limit of the above-described preferable range, the constitutional unit (a1) and other constitutional units can be balanced, and the lithography characteristics are improved.

<<Other Constitutional Units>>

Further, the component (A1) may have other constitutional units as necessary in addition to the constitutional unit (a1).

Examples of other constitutional units include a constitutional unit (a2) that contains a lactone-containing cyclic group, a —SO$_2$-containing cyclic group, or a carbonate-containing cyclic group; a constitutional unit (a3) that contains a polar group-containing aliphatic hydrocarbon group; a constitutional unit (a4) that contains an acid non-dissociable aliphatic cyclic group; a constitutional unit derived from styrene; and a constitutional unit derived from a styrene derivative.

In regard to constitutional unit (a2):

The component (A1) may have a constitutional unit (a2) (here, a constitutional unit corresponding to the constitutional unit (a1) is excluded) containing a lactone-containing cyclic group, a —SO$_2$-containing cyclic group, or a carbonate-containing cyclic group, in addition to the constitutional unit (a1).

In a case where the component (A1) is used for forming a resist film, the lactone-containing cyclic group, the —SO$_2$-containing cyclic group, or the carbonate-containing cyclic group in the constitutional unit (a2) is effective for improving the adhesiveness of the resist film to the substrate. Further, in a case where the component (A1) contains the constitutional unit (a2), the lithography characteristics and the like are improved due to the effects of appropriately adjusting the acid diffusion length, increasing the adhesiveness of the resist film to the substrate, and appropriately adjusting the solubility during the development.

The "lactone-containing cyclic group" indicates a cyclic group that has a ring (lactone ring) containing —O—C(=O)— in the ring skeleton. In a case where the lactone ring is counted as the first ring and the group contains only the lactone ring, the group is referred to as a monocyclic group. Further, in a case where the group has other ring structures, the group is referred to as a polycyclic group regardless of the structures. The lactone-containing cyclic group may be a monocyclic group or a polycyclic group.

The lactone-containing cyclic group in the constitutional unit (a2) is not particularly limited, and an optional constitutional unit can be used. Specific examples thereof include groups respectively represented by Formulae (a2-r-1) to (a2-r-7).

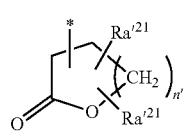
(a2-r-1)

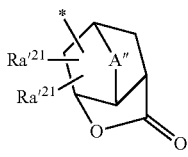
(a2-r-2)

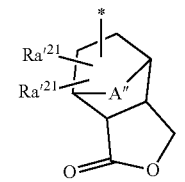
(a2-r-3)

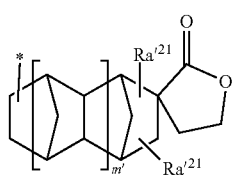
(a2-r-4)

-continued

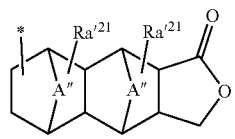
(a2-r-5)

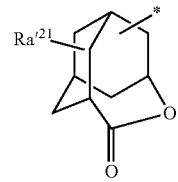
(a2-r-6)

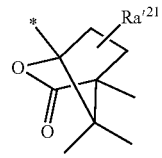
(a2-r-7)

[In the formulae, each Ra'$^{21}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO$_2$-containing cyclic group; A" represents an alkylene group having 1 to 5 carbon atoms which may have an oxygen atom (—O—) or a sulfur atom (—S—), an oxygen atom, or a sulfur atom; n' represents an integer of 0 to 2; and m' represents 0 or 1.]

In Formulae (a2-r-1) to (a2-r-7), it is preferable that the alkyl group as Ra'$^{21}$ is an alkyl group having 1 to 6 carbon atom. Further, it is preferable that the alkyl group is linear or branched. Specific examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Among these, a methyl group or ethyl group is preferable, and a methyl group is particularly preferable.

It is preferable that the alkoxy group as Ra'$^{21}$ is an alkoxy group having 1 to 6 carbon atoms. Further, it is preferable that the alkoxy group is linear or branched. Specific examples of the alkoxy groups include a group formed by linking the above-described alkyl group exemplified as the alkyl group represented by Ra'$^{21}$ to an oxygen atom (—O—).

Examples of the halogen atom as Ra'$^{21}$ include a fluorine atom, a chlorine atom, a bromine atom, and an iodine atom. Among these, a fluorine atom is preferable.

Examples of the halogenated alkyl group as Ra'$^{21}$ include groups in which some or all hydrogen atoms in the alkyl group as Ra'$^{21}$ have been substituted with the halogen atoms. As the halogenated alkyl group, a fluorinated alkyl group is preferable, and a perfluoroalkyl group is particularly preferable.

In —COOR" and —OC(=O)R" as Ra'$^{21}$, R" represents a hydrogen atom, an alkyl group, a lactone-containing cyclic group, a carbonate-containing cyclic group, or a —SO$_2$— containing cyclic group.

The alkyl group as R" may be linear, branched, or cyclic and preferably has 1 to 15 carbon atoms.

In a case where R" represents a linear or branched alkyl group, an alkyl group having 1 to 10 carbon atoms is preferable, an alkyl group having 1 to 5 carbon atoms is more preferable, and a methyl group or an ethyl group is particularly preferable.

In a case where R″ represents a cyclic alkyl group, the number of carbon atoms thereof is preferably in a range of 3 to 15, more preferably in a range of 4 to 12, and most preferably in a range of 5 to 10. Specific examples thereof include groups in which one or more hydrogen atoms have been removed from a monocycloalkane, which may or may not be substituted with a fluorine atom or a fluorinated alkyl group; and groups in which one or more hydrogen atoms have been removed from a polycycloalkane such as bicycloalkane, tricycloalkane, or tetracycloalkane. More specific examples thereof include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane, or tetracyclododecane.

Examples of the lactone-containing cyclic group as R″ include the same groups as those for the groups respectively represented by Formulae (a2-r-1) to (a2-r-7).

The carbonate-containing cyclic group as R″ has the same definition as that for the carbonate-containing cyclic group described below. Specific examples of the carbonate-containing cyclic group include groups respectively represented by Formulae (ax3-r-1) to (ax3-r-3).

The —SO$_2$-containing cyclic group as R″ has the same definition as that for the —SO$_2$-containing cyclic group described below. Specific examples of the —SO$_2$-containing cyclic group include groups respectively represented by Formulae (a5-r-1) to (a5-r-4).

As the hydroxyalkyl group as Ra$'^{21}$, a hydroxyalkyl group having 1 to 6 carbon atoms is preferable, and specific examples thereof include a group in which at least one hydrogen atom in the alkyl group as Ra$'^{21}$ has been substituted with a hydroxyl group.

In Formulae (a2-r-2), (a2-r-3) and (a2-r-5), as the alkylene group having 1 to 5 carbon atoms as A″, a linear or branched alkylene group is preferable, and examples thereof include a methylene group, an ethylene group, an n-propylene group, and an isopropylene group. In a case where the alkylene group has an oxygen atom or a sulfur atom, specific examples thereof include groups in which —O— or —S— is interposed in the terminal of the alkylene group or between the carbon atoms of the alkylene group. Further, examples thereof include —O—CH$_2$—, —CH$_2$—O—CH$_2$—, —S—CH$_2$—, and —CH$_2$—S—CH$_2$—. As A″, an alkylene group having 1 to 5 carbon atoms or —O— is preferable, an alkylene group having 1 to 5 carbon atoms is more preferable, and a methylene group is most preferable.

Specific examples of the groups respectively represented by Formulae (a2-r-1) to (a2-r-7) are shown below.

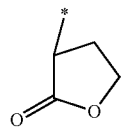
(r-lc-1-1)

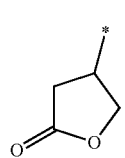
(r-lc-1-2)

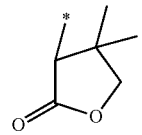
(r-lc-1-3)

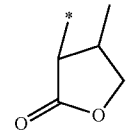
(r-lc-1-4)

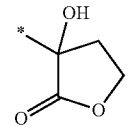
(r-lc-1-5)

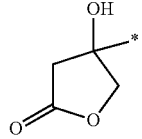
(r-lc-1-6)

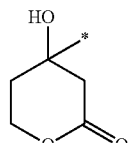
(r-lc-1-7)

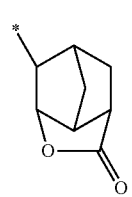
(r-lc-2-1)

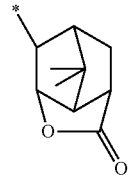
(r-lc-2-2)

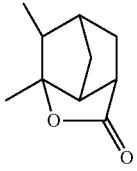
(r-lc-2-3)

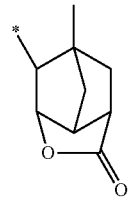
(r-lc-2-4)

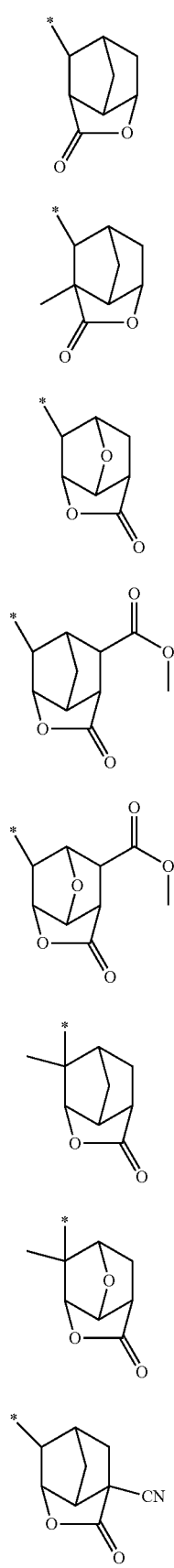
(r-lc-2-5)
(r-lc-2-6)
(r-lc-2-7)
(r-lc-2-8)
(r-lc-2-9)
(r-lc-2-10)
(r-lc-2-11)
(r-lc-2-12)
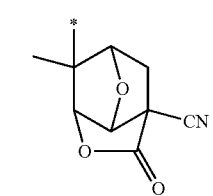
(r-lc-2-13)
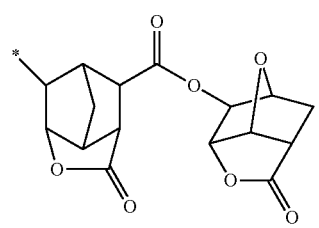
(r-lc-2-14)
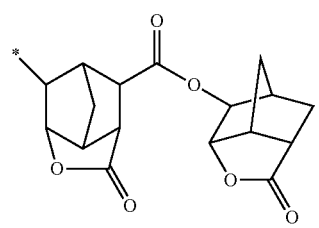
(r-lc-2-15)
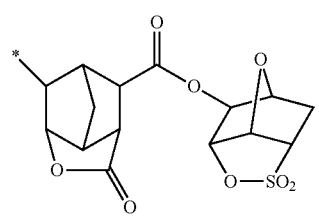
(r-lc-2-16)
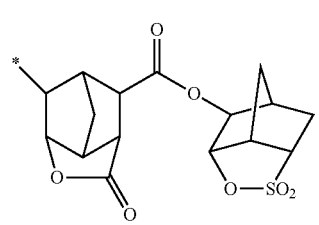
(r-lc-2-17)
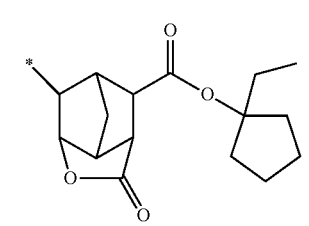
(r-lc-2-18)
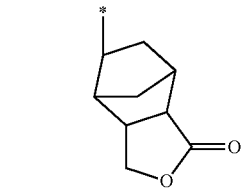
(r-lc-3-1)

(r-lc-3-2)
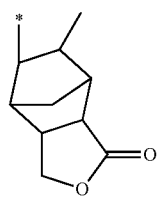
(r-lc-3-3)
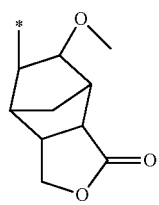
(r-lc-3-4)
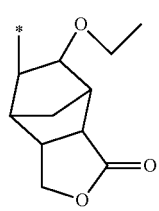
(r-lc-3-5)
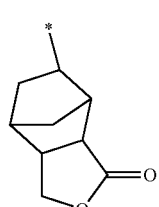
(r-lc-4-1)
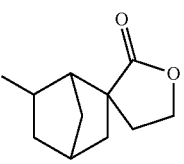
(r-lc-4-2)
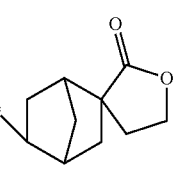
(r-lc-4-3)
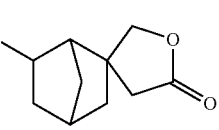
(r-lc-4-4)
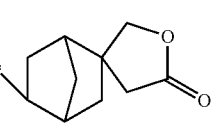
(r-lc-4-5)
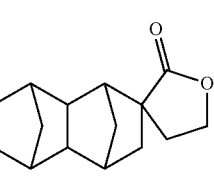
(r-lc-4-6)
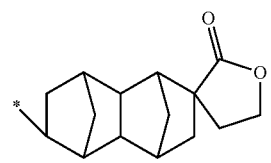
(r-lc-4-7)
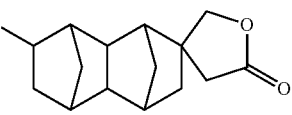
(r-lc-4-8)
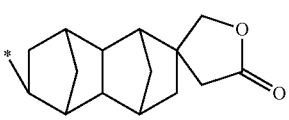
(r-lc-4-9)
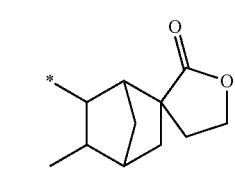
(r-lc-5-1)
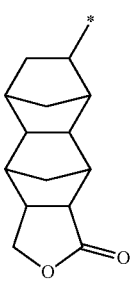
(r-lc-5-2)
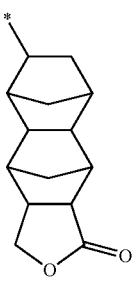
(r-lc-5-3)
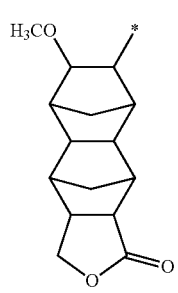

-continued (r-lc-5-4)

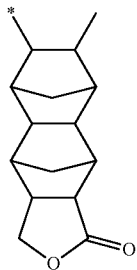

(r-lc-6-1)

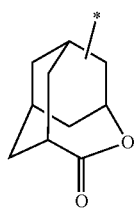

(r-lc-7-1)

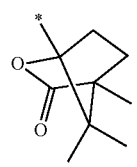

The "—$SO_2$-containing cyclic group" indicates a cyclic group that has a ring containing —$SO_2$— in the ring skeleton thereof. Specifically, the —$SO_2$-containing cyclic group is a cyclic group in which the sulfur atom (S) in —$SO_2$— forms a part of the ring skeleton of the cyclic group. In a case where the ring containing —$SO_2$— in the ring skeleton thereof is counted as the first ring and the group contains only the ring, the group is referred to as a monocyclic group. Further, in a case where the group has other ring structures, the group is referred to as a polycyclic group regardless of the structures. The —$SO_2$-containing cyclic group may be a monocyclic group or a polycyclic group.

As the —$SO_2$-containing cyclic group, a cyclic group containing —O—$SO_2$— in the ring skeleton thereof, that is, a cyclic group having a sultone ring in which —O—S— in —O—$SO_2$— forms a part of the ring skeleton thereof is particularly preferable.

More specific examples of the —$SO_2$-containing cyclic group include groups respectively represented by Formulae (a5-r-1) to (a5-r-4) shown below.

(a5-r-1)

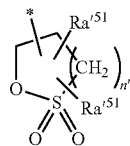

(a5-r-2)

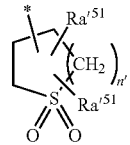

-continued (a5-r-3)

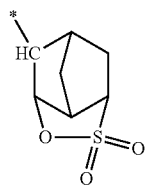

(a5-r-4)

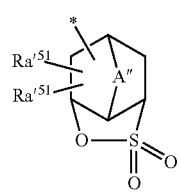

[In the formulae, each $Ra'^{51}$ independently represents a hydrogen atom, an alkyl group, an alkoxy group, a halogen atom, a halogenated alkyl group, a hydroxyl group, —COOR", —OC(═O)R", a hydroxyalkyl group, or a cyano group, R" represents a hydrogen atom, an alkyl group, a lactone-containing cyclic group, a carbonate-containing cyclic group, or a —$SO_2$-containing cyclic group, A" represents an alkylene group having 1 to 5 carbon atoms which may contain an oxygen atom or a sulfur atom, an oxygen atom, or a sulfur atom, and n' represents an integer of 0 to 2.]

In Formulae (a5-r-1) and (a5-r-2), A" has the same definition as that for A" in Formulae (a2-r-2), (a2-r-3) and (a2-r-5).

Examples of the alkyl group, the alkoxy group, the halogen atom, the halogenated alkyl group, —COOR", —OC(═O)R", and the hydroxyalkyl group as $Ra'^{51}$ include the same groups as those for $Ra'^{21}$ in Formulae (a2-r-1) to (a2-r-7).

Specific examples of the groups respectively represented by Formulae (a5-r-1) to (a5-r-4) are shown below. In the formulae shown below, "Ac" represents an acetyl group.

(r-sl-1-1)

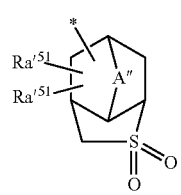

(r-sl-1-2)

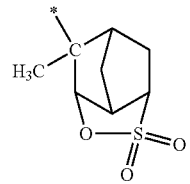

(r-sl-1-3)

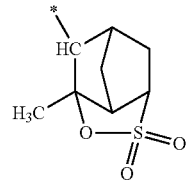

(r-sl-1-4)
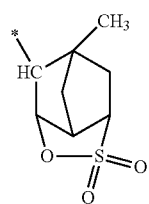
(r-sl-1-5)
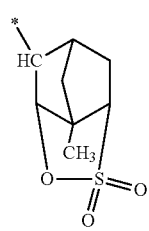
(r-sl-1-6)
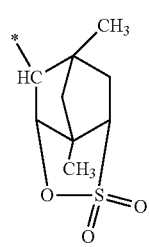
(r-sl-1-7)
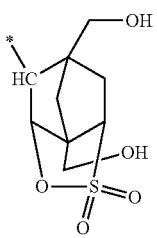
(r-sl-1-8)
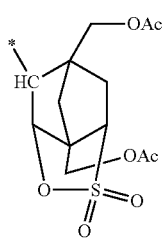
(r-sl-1-9)
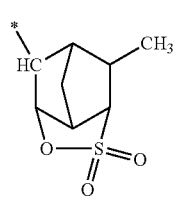
(r-sl-1-10)
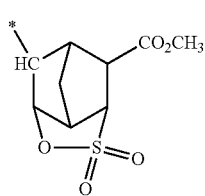
(r-sl-1-11)
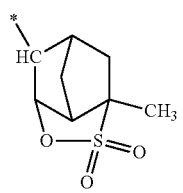
(r-sl-1-12)
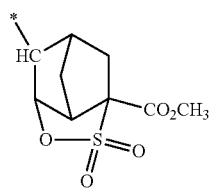
(r-sl-1-13)
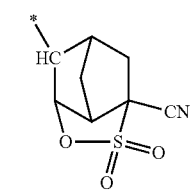
(r-sl-1-14)
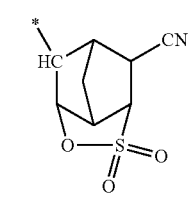
(r-sl-1-15)
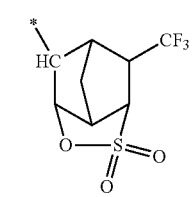
(r-sl-1-16)
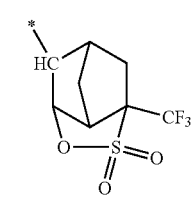
(r-sl-1-17)
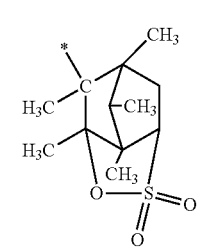
(r-sl-1-18)
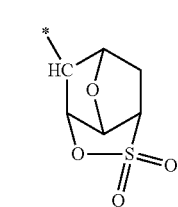

(r-sl-1-19)
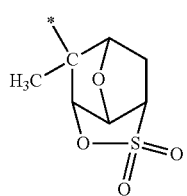
(r-sl-1-20)
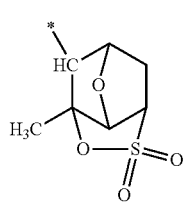
(r-sl-1-21)
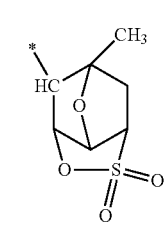
(r-sl-1-22)
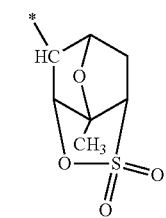
(r-sl-1-23)
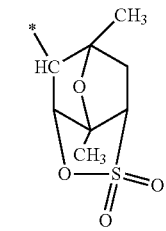
(r-sl-1-24)
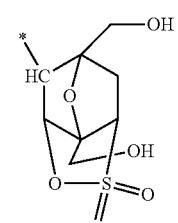
(r-sl-1-25)
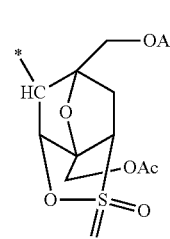
(r-sl-1-26)
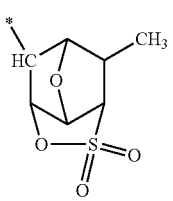
(r-sl-1-27)
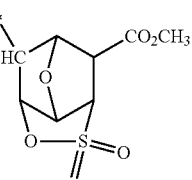
(r-sl-1-28)
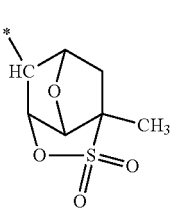
(r-sl-1-29)
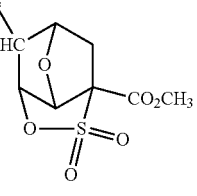
(r-sl-1-30)
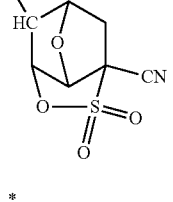
(r-sl-1-31)
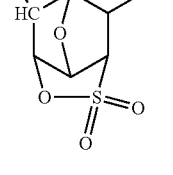
(r-sl-1-32)
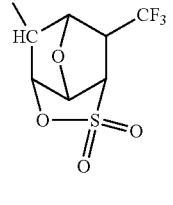
(r-sl-1-33)
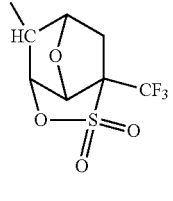

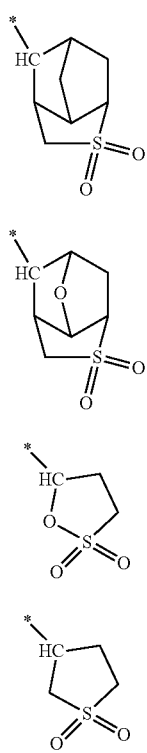

(r-sl-2-1)

(r-sl-2-2)

(r-sl-3-1)

(r-sl-4-1)

The "carbonate-containing cyclic group" indicates a cyclic group that has a ring (a carbonate ring) containing —O—C(=O)—O— in the ring skeleton thereof. In a case where the carbonate ring is counted as the first ring and the group has only the carbonate ring, the group is referred to as a monocyclic group. Further, in a case where the group has other ring structures, the group is referred to as a polycyclic group regardless of the structures. The carbonate-containing cyclic group may be a monocyclic group or a polycyclic group.

The carbonate ring-containing cyclic group is not particularly limited, and an optional group can be used. Specific examples thereof include groups respectively represented by Formulae (ax3-r-1) to (ax3-r-3) shown below.

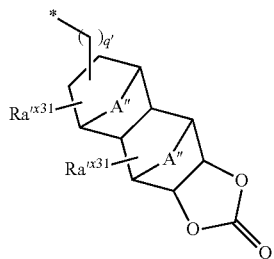

(ax3-r-1)

(ax3-r-2)

(ax3-r-3)

[In the formulae, each $Ra'^{x31}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group, R" represents a hydrogen atom, an alkyl group, a lactone-containing cyclic group, a carbonate-containing cyclic group, or a —SO$_2$-containing cyclic group, A" represents an alkylene group having 1 to 5 carbon atoms which may contain an oxygen atom or a sulfur atom, an oxygen atom, or a sulfur atom, p' represents an integer of 0 to 3, and q' represents 0 or 1.]

In Formulae (ax3-r-2) and (ax3-r-3), A" has the same definition as that for A" in Formulae (a2-r-2), (a2-r-3) and (a2-r-5).

Examples of the alkyl group, the alkoxy group, the halogen atom, the halogenated alkyl group, —COOR", —OC(=O)R", and the hydroxyalkyl group as $Ra'^{31}$ include the same groups as those for $Ra'^{21}$ in Formulae (a2-r-1) to (a2-r-7).

Specific examples of the groups respectively represented by Formulae (ax3-r-1) to (ax3-r-3) are shown below.

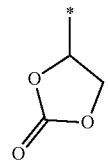

(r-cr-1-1)

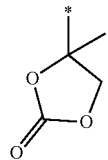

(r-cr-1-2)

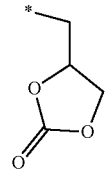

(r-cr-1-3)

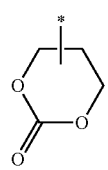

(r-cr-1-4)

(r-cr-1-5)
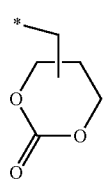
(r-cr-1-6)
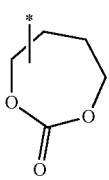
(r-cr-1-7)
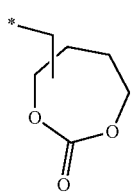
(r-cr-2-1)
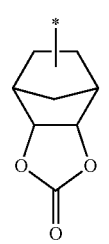
(r-cr-2-2)
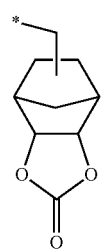
(r-cr-2-3)
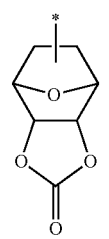
(r-cr-2-4)
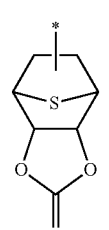
(r-cr-3-1)
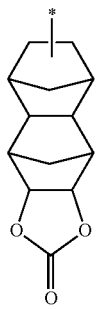
(r-cr-3-2)
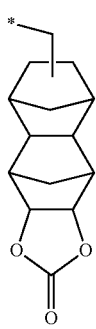
(r-cr-3-3)
(r-cr-3-4)
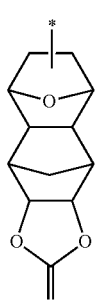
(r-cr-3-5)
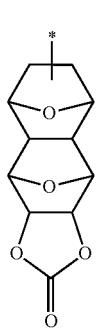
As the constitutional unit (a2), a constitutional unit derived from acrylic acid ester in which the hydrogen atom bonded to the carbon atom at the α-position may be substituted with a substituent is preferable.

It is preferable that such a constitutional unit (a2) is a constitutional unit represented by Formula (a2-1).

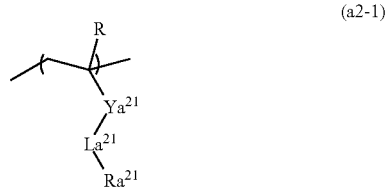

(a2-1)

[In the formula, R represents a hydrogen atom, an alkyl group having 1 to 5 carbon atoms, or a halogenated alkyl group having 1 to 5 carbon atoms. $Ya^{21}$ represents a single bond or a divalent linking group. $La^{21}$ represents —O—, —COO—, —CON(R')—, —OCO—, —CONHCO—, or —CONHCS—, and R' represents a hydrogen atom or a methyl group. In a case where $La^{21}$ represents —O—, $Ya^{21}$ does not represents —CO—. $Ra^{21}$ represents a lactone-containing cyclic group, a carbonate-containing cyclic group, or a —$SO_2$-containing cyclic group.]

In Formula (a2-1), R has the same definition as described above. As R, a hydrogen atom, an alkyl group having 1 to 5 carbon atoms, or a fluorinated alkyl group having 1 to 5 carbon atoms is preferable, and a hydrogen atom or a methyl group is particularly preferable from the viewpoint of the industrial availability.

In Formula (a2-1), the divalent linking group as $Ya^{21}$ is not particularly limited, and suitable examples thereof include a divalent hydrocarbon group which may have a substituent and a divalent linking group having hetero atoms.

Divalent Hydrocarbon Group which May have Substituent:

In a case where $Ya^{21}$ represents a divalent hydrocarbon group which may have a substituent, the hydrocarbon group may be an aliphatic hydrocarbon group or an aromatic hydrocarbon group.

Aliphatic Hydrocarbon Group as $Ya^{21}$

The aliphatic hydrocarbon group indicates a hydrocarbon group that has no aromaticity. The aliphatic hydrocarbon group may be saturated or unsaturated. In general, it is preferable that the aliphatic hydrocarbon group is saturated.

Examples of the aliphatic hydrocarbon group include a linear or branched aliphatic hydrocarbon group, and an aliphatic hydrocarbon group having a ring in the structure thereof.

Linear or Branched Aliphatic Hydrocarbon Group

The linear aliphatic hydrocarbon group has preferably 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group has preferably 2 to 10 carbon atoms, more preferably 3 to 6 carbon atoms, still more preferably 3 or 4 carbon atoms, and most preferably 3 carbon atoms.

As the branched aliphatic hydrocarbon group, a branched alkylene group is preferable, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

The linear or branched aliphatic hydrocarbon group may or may not have a substituent. Examples of the substituent include a fluorine atom, a fluorinated alkyl group having 1 to 5 carbon atoms which has been substituted with a fluorine atom, and a carbonyl group.

Aliphatic Hydrocarbon Group Having Ring in Structure Thereof

Examples of the aliphatic hydrocarbon group having a ring in the structure thereof include a cyclic aliphatic hydrocarbon group which may have a substituent having a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed in a linear or branched aliphatic hydrocarbon group. Examples of the linear or branched aliphatic hydrocarbon group include the same groups as those described above.

The cyclic aliphatic hydrocarbon group has preferably 3 to 20 carbon atoms and more preferably 3 to 12 carbon atoms.

The cyclic aliphatic hydrocarbon group may be a polycyclic group or a monocyclic group. As the monocyclic alicyclic hydrocarbon group, a group in which two hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which two hydrogen atoms have been removed from a polycycloalkane is preferable. As the polycycloalkane, a group having 7 to 12 carbon atoms is preferable. Specific examples of the polycycloalkane include adamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

As the alkyl group as the substituent, an alkyl group having 1 to 5 carbon atoms is preferable, and a methyl group, an ethyl group, a propyl group, an n-butyl group, or a tert-butyl group is more preferable.

As the alkoxy group as the substituent, an alkoxy group having 1 to 5 carbon atoms is preferable, and a methoxy group, an ethoxy group, an n-propoxy group, an iso-propoxy group, an n-butoxy group, or a tert-butoxy group is more preferable, and a methoxy group or an ethoxy group is still more preferable.

Examples of the halogen atom as the substituent include a fluorine atom, a chlorine atom, a bromine atom, and an iodine atom. Among these, a fluorine atom is preferable.

Examples of the halogenated alkyl group as the substituent include groups in which some or all hydrogen atoms in the above-described alkyl groups have been substituted with the above-described halogen atoms.

In the cyclic aliphatic hydrocarbon group, some carbon atoms constituting the ring structure thereof may be substituted with a substituent having a hetero atom. As the substituent having a hetero atom, —O—, —C(=O)—O—, —S—, —S(=O)$_2$—, or —S(=O)$_2$—O— is preferable.

Aromatic hydrocarbon group as Ya$^{21}$

The aromatic hydrocarbon group is a hydrocarbon group having at least one aromatic ring.

The aromatic ring is not particularly limited as long as the aromatic ring is a cyclic conjugated system having (4n+2) 1 electrons and may be monocyclic or polycyclic. The aromatic ring has preferably 5 to 30 carbon atoms, more preferably 5 to 20 carbon atoms, still more preferably 6 to 15 carbon atoms, and particularly preferably 6 to 12 carbon atoms. Here, the number of carbon atoms in a substituent is not included in the number of carbon atoms.

Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

Specific examples of the aromatic hydrocarbon group include a group in which two hydrogen atoms have been removed from the above-described aromatic hydrocarbon ring or aromatic hetero ring (an arylene group or a heteroarylene group); a group in which two hydrogen atoms have been removed from an aromatic compound having two or more aromatic rings (such as biphenyl or fluorene); and a group in which one hydrogen atom of a group (an aryl group or a heteroaryl group) obtained by removing one hydrogen atom from the above-described aromatic hydrocarbon ring or aromatic hetero ring has been substituted with an alkylene group (for example, a group obtained by further removing one hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group). The number of carbon atoms in the alkylene group bonded to the aryl group or the heteroaryl group is preferably in a range of 1 to 4, more preferably 1 or 2, and particularly preferably 1.

In the aromatic hydrocarbon group, the hydrogen atom in the aromatic hydrocarbon group may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

As the alkyl group as the substituent, an alkyl group having 1 to 5 carbon atoms is preferable, and a methyl group, an ethyl group, a propyl group, an n-butyl group, or a tert-butyl group is more preferable.

As the alkoxy group, the halogen atom, and the halogenated alkyl group as the substituents, the same groups as the above-described substituent groups that substitute a hydrogen atom in the cyclic aliphatic hydrocarbon group can be exemplified.

Divalent Linking Group Having Hetero Atom:

In a case where Ya$^{21}$ represents a divalent linking group having a hetero atom, preferred examples of the linking group include —O—, —C(=O)—O—, —O—C(=O)—, —C(=O)—, —O—C(=O)—O—, —C(=O)—NH—, —NH—, —NH—C(=NH)— (H may be substituted with a substituent such as an alkyl group, an acyl group, or the like), —S—, —S(=O)$_2$—, —S(=O)$_2$—O—, and a group represented by Formula: —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$—, or —Y$^{21}$—S(=O)$_2$—O—Y$^{22}$— [in the formulae, Y$^{21}$ and Y$^{22}$ each independently represent a divalent hydrocarbon group which may have a substituent, O represents an oxygen atom, and m" represents an integer of 0 to 3].

In a case where the divalent linking group containing a hetero atom is —C(=O)—NH—, —C(=O)—NH—C(=O)—, —NH—, or —NH—C(=NH)—, H may be substituted with a substituent such as an alkyl group, an acyl group, or the like. The substituent (an alkyl group, an acyl group, or the like) has preferably 1 to 10 carbon atoms, more preferably 1 to 8 carbon atoms, and particularly preferably 1 to 5 carbon atoms.

In Formula —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$—, or —Y$^{21}$—S(=O)$_2$—O—Y$^{22}$—, Y$^{21}$ and Y$^{22}$ each independently represent a divalent hydrocarbon group which may have a substituent. Examples of the divalent hydrocarbon group include the same groups (the divalent hydrocarbon groups which may have a substituent) as those for the above-described divalent linking group as Ya$^{21}$.

As Y$^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As Y$^{22}$, a linear or branched aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[Y$^{21}$—C(=O)—O]$_{m''}$—Y$^{22}$—, m" represents an integer of 0 to 3, preferably an integer of 0 to 2, more preferably 0 or 1, and particularly preferably 1. That is, a group represented by Formula —Y$^{21}$—C(=O)—O—Y$^{22}$— is preferable as the group represented by Formula —[Y$^{21}$—C(=O)—O]$_{m''}$—Y$^{22}$—. Among these, a group represented by Formula —(CH$_2$)$_{a'}$—C(=O)—O—(CH$_2$)$_{b'}$— is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

It is preferable that Ya$^{21}$ represents a single bond, an ester bond [—C(=O)—O—], an ether bond (—O—), a linear or branched alkylene group, or a combination thereof.

In Formula (a2-1), Ra$^{21}$ represents a lactone-containing cyclic group, a —SO$_2$— containing cyclic group, or a carbonate-containing cyclic group.

Suitable examples of the lactone-containing cyclic group, the —SO$_2$-containing cyclic group, and the carbonate-containing cyclic group as Ra$^{21}$ include groups respectively represented by Formulae (a2-r-1) to (a2-r-7), groups respectively represented by Formulae (a5-r-1) to (a5-r-4), and groups respectively represented by Formulae (ax3-r-1) to (ax3-r-3).

Among the examples, $Ra^{21}$ represents preferably a lactone-containing cyclic group or a —$SO_2$-containing cyclic group and more preferably a group represented by Formula (a2-r-1), (a2-r-2), (a2-r-6) or (a5-r-1). Specifically, a group represented by any of Chemical Formulae (r-1c-1-1) to (r-1c-1-7), (r-1c-2-1) to (r-1c-2-18), (r-1c-6-1), (r-s1-1-1), and (r-s1-1-18) is more preferable.

The constitutional unit (a2) included in the component (A1) may be used alone or two or more kinds thereof.

In a case where the component (A1) has the constitutional unit (a2), the proportion of the constitutional unit (a2) in the component (A1) is preferably in a range of 5% to 60% by mole, more preferably in a range of 10% to 60% by mole, still more preferably in a range of 20% to 55% by mole, and particularly preferably in a range of 30% to 50% by mole with respect to the total amount (100% by mole) of all constitutional units constituting the component (A1).

In a case where the proportion of the constitutional unit (a2) is greater than or equal to the lower limit of the above-described preferable range, the effect obtained by allowing the component (A1) to have the constitutional unit (a2) can be satisfactorily achieved. On the contrary, in a case where the proportion of the constitutional unit (a2) is less than or equal to the upper limit thereof, the constitutional unit (a2) and other constitutional units can be balanced, and various lithography characteristics are improved.

In regard to constitutional unit (a3):

The component (A1) may further have a constitutional unit (a3) containing a polar group-containing aliphatic hydrocarbon group (here, a constitutional unit corresponding to the constitutional unit (a1) or the constitutional unit (a2) is excluded) in addition to the constitutional unit (a1). In a case where the component (A1) has the constitutional unit (a3), the hydrophilicity of the component (A) is increased, which contributes to improvement of the resolution. Further, the acid diffusion length can be appropriately adjusted.

Examples of the polar group include a hydroxyl group, a cyano group, a carboxy group, or a hydroxyalkyl group in which some hydrogen atoms in the alkyl group have been substituted with fluorine atoms. Among these, a hydroxyl group is particularly preferable.

Examples of the aliphatic hydrocarbon group include a linear or branched hydrocarbon group (preferably an alkylene group) having 1 to 10 carbon atoms and a cyclic aliphatic hydrocarbon group (a cyclic group). The cyclic group may be a monocyclic group or a polycyclic group. For example, the cyclic group can be appropriately selected from the plurality of groups that have been proposed in the resins for resist compositions for ArF excimer lasers.

In a case where the cyclic group is a monocyclic group, the number of carbon atoms is preferably in a range of 3 to 10. Among the examples, constitutional units derived from acrylic acid ester that include an aliphatic monocyclic group containing a hydroxyl group, a cyano group, a carboxy group, or a hydroxyalkyl group in which some hydrogen atoms in the alkyl group have been substituted with fluorine atoms are more preferable. Examples of the monocyclic group include groups obtained by removing two or more hydrogen atoms from a monocycloalkane. Specific examples include groups obtained by removing two or more hydrogen atoms from monocycloalkanes such as cyclopentane, cyclohexane, and cyclooctane. Among these monocyclic groups, a group obtained by removing two or more hydrogen atoms from cyclopentane and a group obtained by removing two or more hydrogen atoms from cyclohexane are industrially preferable.

In a case where the cyclic group is a polycyclic group, the number of carbon atoms in the polycyclic group is more preferably in a range of 7 to 30. Among the examples, constitutional units derived from acrylic acid ester that include an aliphatic polycyclic group containing a hydroxyl group, a cyano group, a carboxy group, or a hydroxyalkyl group in which some hydrogen atoms in the alkyl group have been substituted with fluorine atoms are more preferable. Examples of the polycyclic group include groups in which two or more hydrogen atoms have been removed from bicycloalkane, tricycloalkane, tetracycloalkane, or the like. Specific examples thereof include groups in which two or more hydrogen atoms have been removed from a polycycloalkane such as adamantane, norbornane, isobornane, tricyclodecane, or tetracyclododecane. Among these polycyclic groups, a group in which two or more hydrogen atoms have been removed from adamantane, a group in which two or more hydrogen atoms have been removed from norbornane, or a group in which two or more hydrogen atoms have been removed from tetracyclododecane is industrially preferable.

The constitutional unit (a3) is not particularly limited as long as the constitutional unit contains a polar group-containing aliphatic hydrocarbon group, and an optional constitutional unit can be used.

As the constitutional unit (a3), a constitutional unit derived from acrylic acid ester in which the hydrogen atom bonded to the carbon atom at the α-position may be substituted with a substituent, which is a constitutional unit containing a polar group-containing aliphatic hydrocarbon group is preferable.

In a case where the hydrocarbon group in the polar group-containing aliphatic hydrocarbon group is a linear or branched hydrocarbon group having 1 to 10 carbon atoms, a constitutional unit derived from hydroxyethyl ester of acrylic acid is preferable as the constitutional unit (a3).

Further, in a case where the hydrocarbon group in the polar group-containing aliphatic hydrocarbon group is a polycyclic group, a constitutional unit represented by Formula (a3-1), a constitutional unit represented by Formula (a3-2), or a constitutional unit represented by Formula (a3-3) is preferable as the constitutional unit (a3). Further, in a case where the hydrocarbon group in the polar group-containing aliphatic hydrocarbon group is a monocyclic group, a constitutional unit represented by Formula (a3-4) is preferable as the constitutional unit (a3).

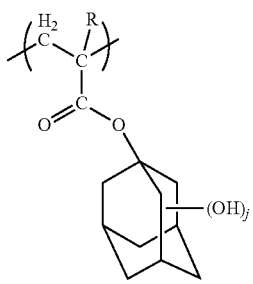

(a3-1)

(a3-2)

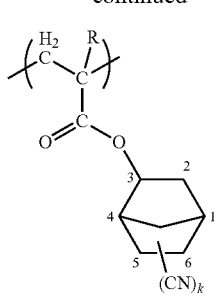

(a3-3)

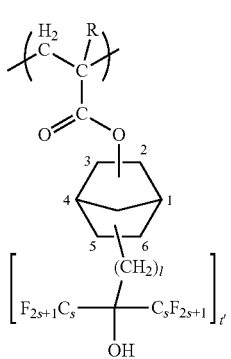

(a3-4)

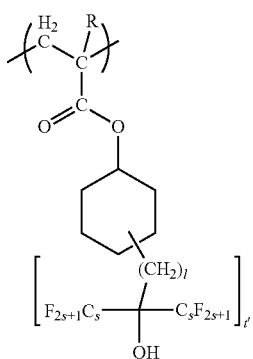

[In the formulae, R has the same definition as described above, j represents an integer of 1 to 3, k represents an integer of 1 to 3, t' represents an integer of 1 to 3, l represents an integer of 0 to 5, and s represents an integer of 1 to 3.]

In Formula (a3-1), j represents preferably 1 or 2 and more preferably 1. In a case where j represents 2, it is preferable that the hydroxyl groups is bonded to the 3- and 5-positions of the adamantyl group. In a case where j represents 1, it is preferable that the hydroxyl group is bonded to the 3-position of the adamantyl group.

It is preferable that j represents 1, and it is particularly preferable that the hydroxyl group is bonded to the 3-position of the adamantyl group.

In Formula (a3-2), it is preferable that k represents 1. It is preferable that the cyano group is bonded to the 5th or 6th position of the norbornyl group.

In Formula (a3-3), it is preferable that t' represents 1. It is preferable that l represents 1. It is preferable that s represents 1. Further, it is preferable that a 2-norbornyl group or 3-norbornyl group is bonded to the terminal of the carboxy group of the acrylic acid. It is preferable that the fluorinated alkyl alcohol is bonded to the 5- or 6-position of the norbornyl group.

In Formula (a3-4), it is preferable that t' represents 1 or 2. It is preferable that l represents 0 or 1. It is preferable that s represents 1. It is preferable that the fluorinated alkyl alcohol is bonded to the 3- or 5-position of the cyclohexyl group.

The constitutional unit (a3) included in the component (A1) may be used alone or two or more kinds thereof.

In a case where the component (A1) has the constitutional unit (a3), the proportion of the constitutional unit (a3) is preferably in a range of 1% to 30% by mole, more preferably in a range of 2% to 25% by mole, and still more preferably in a range of 5% to 20% by mole with respect to the total amount (100% by mole) of all constitutional units constituting the component (A1).

In a case where the proportion of the constitutional unit (a3) is greater than or equal to the lower limit of the above-described preferable range, the effect obtained by allowing the component (A1) to have the constitutional unit (a3) can be satisfactorily achieved. On the contrary, in a case where the proportion of the constitutional unit (a3) is less than or equal to the upper limit of the above-described preferable range, the constitutional unit (a3) and other constitutional units can be balanced, and various lithography characteristics are improved.

In regard to constitutional unit (a4):

The component (A1) may further have a constitutional unit (a4) containing an acid non-dissociable aliphatic cyclic group in addition to the constitutional unit (a1).

In a case where the component (A1) has the constitutional unit (a4), the dry etching resistance of a resist pattern to be formed is improved. Further, the hydrophobicity of the component (A) is increased. The improvement of the hydrophobicity contributes to improvement of the resolution, the resist pattern shape, and the like particularly in a case of the solvent developing process.

The "acid non-dissociable cyclic group" in the constitutional unit (a4) is a cyclic group remaining in the constitutional unit without being dissociated due to the action of an acid in a case of generation of an acid in the resist composition upon exposure (for example, an acid is generated from the component (B) or a constitutional unit that generates an acid upon exposure).

As the constitutional unit (a4), for example, a constitutional unit derived from acrylic acid ester containing an acid non-dissociable aliphatic cyclic group is preferable. As the cyclic group, a plurality of cyclic groups which have been known in the related art as those used for resin components of resist compositions for an ArF excimer laser, a KrF excimer laser (preferably an ArF excimer laser), and the like can be used.

It is preferable that the cyclic group is at least one selected from a tricyclodecyl group, an adamantyl group, a tetracyclododecyl group, an isobornyl group, and a norbornyl group from the viewpoint of the industrial availability. These polycyclic groups may have a linear or branched alkyl group having 1 to 5 carbon atoms as a substituent.

Specific examples of the constitutional unit (a4) include constitutional units respectively represented by Formulae (a4-1) to (a4-7).

(a4-1) 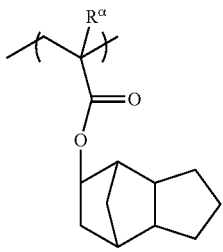

(a4-2) 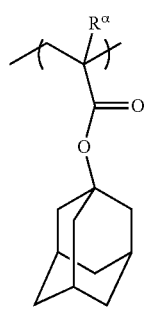

(a4-3) 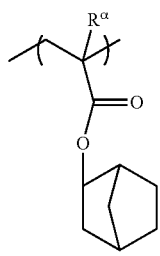

(a4-4) 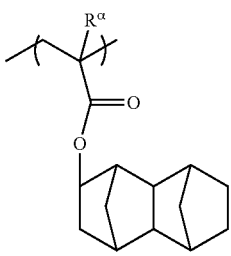

(a4-5) 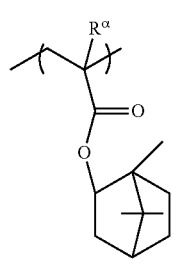

(a4-6) 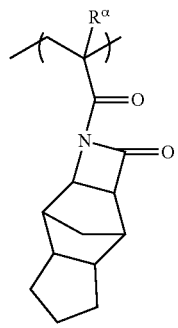

(a4-7) 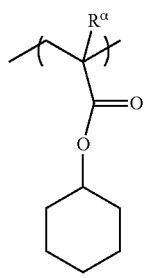

[In the formulae, Ra has the same definition as described above.]

The constitutional unit (a4) included in the component (A1) may be used alone or two or more kinds thereof.

In a case where the component (A1) contains the constitutional unit (a4), the proportion of the constitutional unit (a4) is preferably in a range of 1% to 40% by mole and more preferably in a range of 5% to 20% by mole with respect to the total amount (100% by mole) of all constitutional units constituting the component (A1).

In a case where the proportion of the constitutional unit (a4) is set to greater than or equal to the lower limit of the above-described preferable range, the effect obtained by allowing the component (A1) to have the constitutional unit (a4) can be satisfactorily achieved. On the contrary, in a case where the proportion thereof is set to less than or equal to the upper limit of the above-described preferable range, the constitutional unit (a4) and other constitutional units are likely to be balanced.

The component (A1) contained in the resist composition may be used alone or in combination of two or more kinds thereof.

In the resist composition of the present embodiment, a polymer compound having a repeating structure of the constitutional unit (a1) is exemplified as the component (A1).

Preferred examples of the component (A1) include a polymer compound having a repeating structure of the constitutional unit (a1) and the constitutional unit (a2).

Such a component (A1) can be produced by dissolving a monomer, from which each constitutional unit is derived, in a polymerization solvent and adding a radical polymerization initiator such as azobisisobutylonitrile (AIBN) or dimethyl azobisisobutyrate (for example, V-601) to the solution so that the polymerization is carried out.

Alternatively, such a component (A1) can be produced by dissolving a monomer from which the constitutional unit (a1) is derived and a monomer from which constitutional units other than the constitutional unit (a1) are derived as necessary in a polymerization solvent, adding the above-described radical polymerization initiator to the solution, and performing a deprotection reaction.

Further, a —C(CF$_3$)$_2$—OH group may be introduced into the terminal of the component (A1) during the polymerization using a combination of chain transfer agents such as HS—CH$_2$—CH$_2$—CH$_2$—C(CF$_3$)$_2$—OH. As described above, a copolymer into which a hydroxyalkyl group, formed by substitution of some hydrogen atoms in the alkyl group with fluorine atoms, has been introduced is effective for reducing development defects and reducing line edge roughness (LER: uneven irregularities of a line side wall).

The weight-average molecular weight (Mw) (in terms of polystyrene according to gel permeation chromatography (GPC)) of the component (A1) is not particularly limited, but is preferably in a range of 1000 to 50000, more preferably in a range of 2000 to 30000, and still more preferably in a range of 3000 to 20000.

In a case where the Mw of the component (A1) is less than or equal to the upper limit of the above-described preferable range, the resist composition exhibits a satisfactory solubility in a resist solvent for a resist enough to be used as a resist. On the contrary, in a case where the Mw of the component (A1) is greater than or equal to the lower limit of the above-described preferable range, the dry etching resistance and the cross-sectional shape of the resist pattern are excellent.

Further, the dispersity (Mw/Mn) of the component (A1) is not particularly limited, but is preferably in a range of 1.0 to 4.0, more preferably in a range of 1.0 to 3.0, and particularly preferably in a range of 1.0 to 2.0. Further, Mn represents the number average molecular weight.

In regard to base material components other than component (A1) In the resist composition of the present embodiment, base material components which do not correspond to the component (A1) and whose solubility in a developing solution is changed due to the action of an acid may be used in combination as the component (A). The base material components that do not correspond to the component (A1) are not particularly limited and can be optionally selected from a plurality of components which have been known in the related art as the base material components for a chemically amplified resist composition and then used. Further, polymer compounds or low-molecular-weight compounds may be used alone or in combination of two or more kinds thereof.

In the resist composition of the present embodiment, the content of the component (A) may be adjusted according to the thickness of the resist film intended to be formed.

<Component (B1)>

The resist composition of the present embodiment further contains, in addition to the component (A), an acid generator component (B) that generates an acid upon exposure (hereinafter, referred to as a "component (B)").

In the resist composition of the present embodiment, the component (B) contains an acid generator (B1) represented by Formula (b1-1) (hereinafter, also referred to as a "component (B1)").

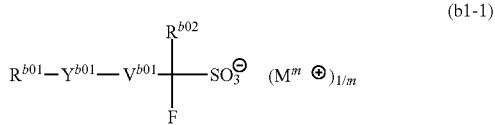

(b1-1)

[In Formula (b1-1), $R^{b01}$ represents a cyclic group which may have a substituent, a chain-like alkyl group which may have a substituent, or a chain-like alkenyl group which may have a substituent. $Y^{b01}$ represents a divalent linking group having an oxygen atom or a single bond. $V^{b01}$ represents a fluorinated alkylene group. $R^{b02}$ represents a fluorine atom or a hydrogen atom. Here, a total number of fluorine atoms as $V^{b01}$ and $R^{b02}$ is 2 or 3. m represents an integer of 1 or greater, and $M^{m+}$ represents an m-valent organic cation.]

{Anion Moiety}

In Formula (b1-1), $R^{b01}$ represents a cyclic group which may have a substituent, a chain-like alkyl group which may have a substituent, or a chain-like alkenyl group which may have a substituent.

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. Further, the aliphatic hydrocarbon group may be saturated or unsaturated. In general, it is preferable that the aliphatic hydrocarbon group is saturated.

The aromatic hydrocarbon group as $R^{b01}$ is a hydrocarbon group having an aromatic ring. The aromatic hydrocarbon group has preferably 3 to 30 carbon atoms, more preferably 5 to 30, still more preferably 5 to 20, particularly preferably 6 to 15, and most preferably 6 to 10. Here, the number of carbon atoms in a substituent is not included in the number of carbon atoms.

Specific examples of the aromatic ring contained in the aromatic hydrocarbon group as $R^{b01}$ include benzene, fluorene, naphthalene, anthracene, phenanthrene, biphenyl, and an aromatic hetero ring in which some carbon atoms constituting any of these aromatic rings have been substituted with hetero atoms. Examples of the hetero atom in the aromatic hetero rings include an oxygen atom, a sulfur atom, and a nitrogen atom.

Specific examples of the aromatic hydrocarbon group as $R^{b01}$ include a group in which one hydrogen atom has been removed from the above-described aromatic ring (an aryl group such as a phenyl group or a naphthyl group), and a group in which one hydrogen atom in the aromatic ring has been substituted with an alkylene group (for example, an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) has preferably 1 to 4 carbon atoms, more preferably 1 or 2 carbon atoms, and particularly preferably 1 carbon atom.

Examples of the cyclic aliphatic hydrocarbon group as $R^{b01}$ include an aliphatic hydrocarbon group having a ring in the structure thereof.

Examples of the aliphatic hydrocarbon group having a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group has preferably 3 to 20 carbon atoms and more preferably 3 to 12 carbon atoms.

The alicyclic hydrocarbon group may be a polycyclic group or a monocyclic group. As the monocyclic alicyclic hydrocarbon group, a group in which one or more hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the number of carbon atoms of the polycycloalkane is preferably in a range of 7 to 30. Among these, a polycycloalkane having a crosslinked ring polycyclic skeleton such as adamantane, norbornane, isobornane, tricyclodecane, or tetracyclododecane; and a polycycloalkane having a fused ring polycyclic skeleton such as a cyclic group having a steroid skeleton are preferable as the polycycloalkane.

Among these examples, as the cyclic aliphatic hydrocarbon group as $R^{b01}$, a group in which one or more hydrogen atoms have been removed from a monocycloalkane or a polycycloalkane is preferable, a group in which one hydrogen atom has been removed from a polycycloalkane is more preferable, an adamantyl group or a norbornyl group is particularly preferable, and an adamantyl group is most preferable.

The linear aliphatic hydrocarbon group which may be bonded to the alicyclic hydrocarbon group has preferably 1 to 10 carbon atoms, more preferably 1 to 6 carbon atoms, still more preferably 1 to 4 carbon atoms, and most preferably 1 to 3 carbon atoms. As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group which may be bonded to the alicyclic hydrocarbon group has preferably 2 to 10 carbon atoms, more preferably 3 to 6 carbon atoms, still more preferably 3 or 4 carbon atoms, and most preferably 3 carbon atoms. As the branched aliphatic hydrocarbon group, a branched alkylene group is preferable, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

Further, the cyclic hydrocarbon group as $R^{b01}$ may have a hetero atom such as a hetero ring. Specific examples thereof include lactone-containing cyclic groups respectively represented by Formulae (a2-r-1) to (a2-r-7), —$SO_2$-containing cyclic group respectively represented by Formulae (a5-r-1) to (a5-r-4), and other heterocyclic groups represented by Chemical Formulae (r-hr-1) to (r-hr-16).

Examples of the substituent for the cyclic group as $R^{b01}$ include an alkyl group, an alkoxy group, a halogen atom, a halogenated alkyl group, a hydroxyl group, a carbonyl group, and a nitro group.

As the alkyl group as the substituent, an alkyl group having 1 to 5 carbon atoms is preferable, and a methyl group, an ethyl group, a propyl group, an n-butyl group, or a tert-butyl group is most preferable.

As the alkoxy group as the substituent, an alkoxy group having 1 to 5 carbon atoms is preferable, a methoxy group, an ethoxy group, an n-propoxy group, an iso-propoxy group, an n-butoxy group, or a tert-butoxy group is more preferable, and a methoxy group or an ethoxy group is most preferable.

Examples of the halogen atom as the substituent include a fluorine atom, a chlorine atom, a bromine atom, and an iodine atom. Among these, a fluorine atom is preferable.

Example of the halogenated alkyl group as the substituent includes a group in which some or all hydrogen atoms in an alkyl group having 1 to 5 carbon atoms such as a methyl group, an ethyl group, a propyl group, an n-butyl group, or a tert-butyl group have been substituted with the halogen atoms.

The carbonyl group as the substituent is a group that substitutes a methylene group (—$CH_2$—) constituting the cyclic hydrocarbon group.

Chain-Like Alkyl Group which May have Substituent:

The chain-like alkyl group as $R^{b01}$ may be linear or branched.

The linear alkyl group has preferably 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched alkyl group has preferably 3 to 20 carbon atoms, more preferably 3 to 15, and most preferably 3 to 10. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

Such a chain-like alkenyl group as $R^{b01}$ may be linear or branched, and the number of carbon atoms thereof is preferably in a range of 2 to 10, more preferably in a range of 2 to 5, still more preferably in a range of 2 to 4, and particularly preferably 3. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the examples, as the chain-like alkenyl group, a linear alkenyl group is preferable, a vinyl group or a propenyl group is more preferable, and a vinyl group is particularly preferable.

Examples of the substituent for the chain-like alkyl group or alkenyl group as $R^{b01}$ include an alkoxy group, a halogen atom, a halogenated alkyl group, a hydroxyl group, a carbonyl group, a nitro group, an amino group, and a cyclic group as $R^{b01}$.

Among these, $R^{b01}$ represents preferably a cyclic group which may have a substituent, more preferably a cyclic hydrocarbon group which may have a substituent, and still more preferably an alicyclic hydrocarbon group which may have a substituent.

More specifically, as the alicyclic hydrocarbon group, a group in which one or more hydrogen atoms have been removed from a monocycloalkane or a polycycloalkane is preferable, a group in which one hydrogen atom has been removed from a polycycloalkane is more preferable, an adamantyl group or a norbornyl group is particularly preferable, and an adamantyl group is most preferable.

As the substituent, a hydroxyl group is preferable. That is, it is preferable that $R^{b01}$ represents an alicyclic hydrocarbon group containing a hydroxyl group.

In Formula (b1-1), $Y^{b01}$ represents a divalent linking group having an oxygen atom or a single bond. In a case where $Y^{b01}$ represents a divalent linking group having an oxygen atom, $Y^{b01}$ may contain an atom other than the oxygen atom. Examples of the atom other than the oxygen atom include a carbon atom, a hydrogen atom, a sulfur atom, and a nitrogen atom.

Examples of the divalent linking group having an oxygen atom include linking groups respectively represented by Formulae (y-a1-1) to (y-a1-7).

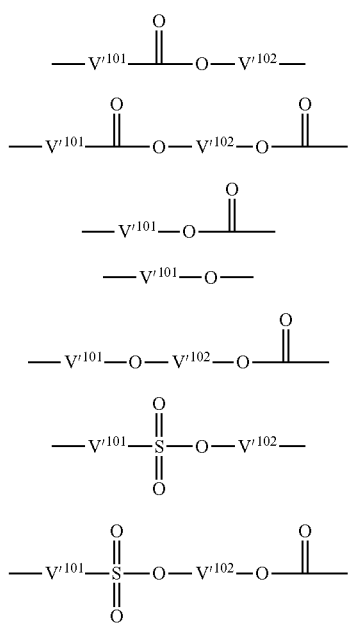

[In the formulae, $V'^{101}$ represents a single bond or an alkylene group having 1 to 5 carbon atoms, and $V'^{102}$ represents a divalent saturated hydrocarbon group having 1 to 30 carbon atoms.]

The divalent saturated hydrocarbon group as $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group as $V'^{101}$ and $V'^{102}$ may be a linear alkylene group or a branched alkylene group, and a linear alkylene group is preferable.

Specific examples of the alkylene group as $V'^{101}$ and $V'^{102}$ include a methylene group [—$CH_2$—]; an alkylmethylene group such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, or —C($CH_2CH_3$)$_2$—; an ethylene group [—$CH_2CH_2$—]; an alkylethylene group such as —CH($CH_3$)$CH_2$—, —CH($CH_3$)CH($CH_3$)—, —C($CH_3$)$_2CH_2$—, or —CH($CH_2CH_3$)$CH_2$—; a trimethylene group (n-propylene group) [—$CH_2CH_2CH_2$—]; an alkyltrimethylene group such as —CH($CH_3$)$CH_2CH_2$— or —$CH_2$CH($CH_3$)$CH_2$—; a tetramethylene group [—$CH_2CH_2CH_2CH_2$—]; an alkyltetramethylene group such as —CH($CH_3$)$CH_2CH_2CH_2$— or —$CH_2$CH($CH_3$)$CH_2CH_2$—; and a pentamethylene group [—$CH_2CH_2CH_2CH_2CH_2$—].

Further, a part of methylene group in the alkylene group as $V'^{101}$ and $V'^{102}$ may be substituted with a divalent aliphatic cyclic group having 5 to 10 carbon atoms.

Among these, it is preferable that $V'^{101}$ represents a single bond.

$Y^{b01}$ represents preferably a divalent linking group having an ester bond or a divalent linking group having an ether bond, more preferably linking groups respectively represented by Formulae (y-a1-1) to (y-a1-5), and still more preferably a linking group represented by Formula (y-a1-1).

In Formula (b1-1), $V^{b01}$ represents a fluorinated alkylene group. Examples of the fluorinated alkylene group as $V^{b01}$ include a group in which some or all hydrogen atoms in the alkylene group have been substituted with fluorine atoms.

The fluorinated alkylene group has preferably 1 to 9 carbon atoms and more preferably 1 to 4 carbon atoms.

In Formula (b1-1), $R^{b02}$ represents a fluorine atom or a hydrogen atom and preferably a fluorine atom. Here, the total number of fluorine atoms of $V^{b01}$ and $R^{b02}$ is 2 or 3, and the total number of fluorine atoms of $V^{b01}$ and $R^{b02}$ is preferably 2.

Specific examples of the anion moiety in the component (B1) are described below. Further, the anion moiety in the component (B1) is not limited to these specific examples.

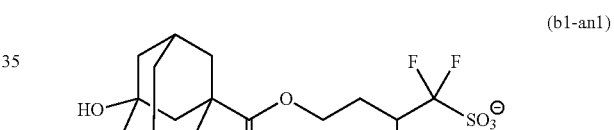

(b1-an1)

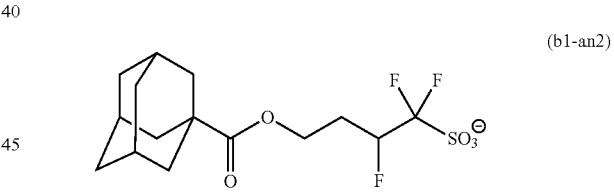

(b1-an2)

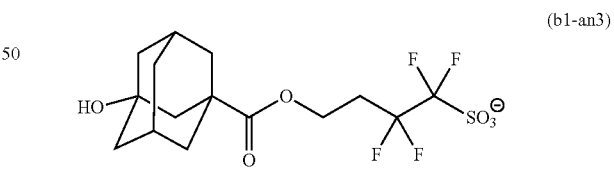

(b1-an3)

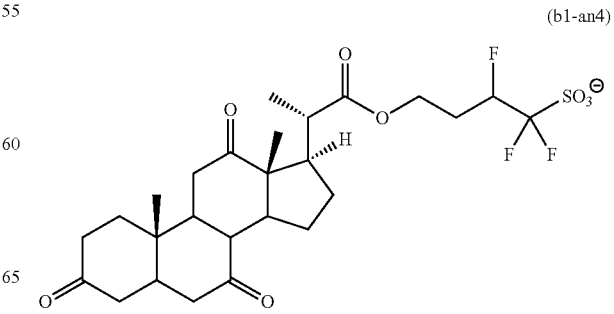

(b1-an4)

-continued

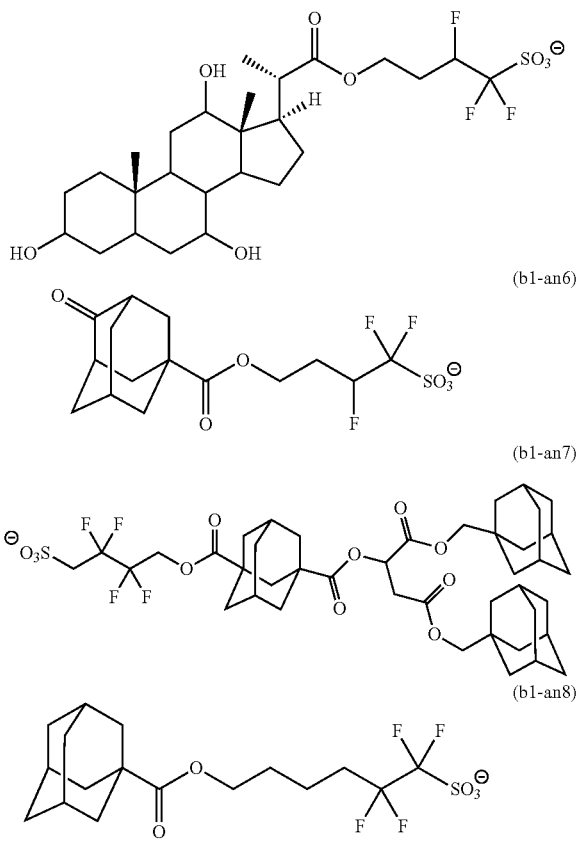

(b1-an5)

(b1-an6)

(b1-an7)

(b1-an8)

{Cation Moiety}

In Formulae (b-1), (b-2) and (b-3), $M^{m+}$ represents an m-valent onium cation. Among these, a sulfonium cation and an iodonium cation are preferable.

m represents an integer of 1 or greater.

Preferred examples of the cation moiety $((M^{m+})_{1/m})$ include organic cations respectively represented by Formulae (ca-1) to (ca-4).

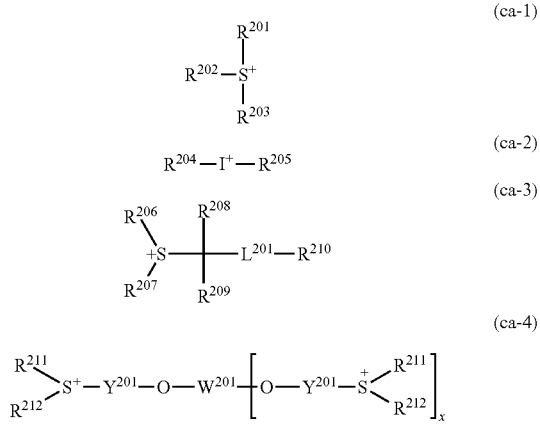

(ca-1)

(ca-2)

(ca-3)

(ca-4)

[In the formulae, $R^{201}$ to $R^{207}$, $R^{211}$, and $R^{212}$ each independently represent an aryl group, an alkyl group or an alkenyl group which may have a substituent. $R^{201}$ to $R^{203}$, $R^{206}$ and $R^{207}$, and $R^{211}$ and $R^{212}$ may be bonded to each other to form a ring with the sulfur atom in the formula. $R^{208}$ and $R^{209}$ each independently represent a hydrogen atom or an alkyl group having 1 to 5 carbon atoms. $R^{210}$ represents an aryl group which may have a substituent, an alkyl group which may have a substituent, an alkenyl group which may have a substituent, or a —$SO_2$-containing cyclic group which may have a substituent. $L^{201}$ represents —C(=O)— or —C(=O)—O—. $Y^{201}$'s each independently represent an arylene group, an alkylene group, or an alkenylene group. x represents 1 or 2. $W^{201}$ represents a (x+1)-valent linking group.]

In Formulae (ca-1) to (ca-4), examples of the aryl group as R to $R^{207}$, $R^{211}$, and $R^{212}$ include an unsubstituted aryl group having 6 to 20 carbon atoms. Among these, a phenyl group or a naphthyl group is preferable.

The alkyl group as $R^{201}$ to $R^{207}$, $R^{211}$, and $R^{212}$ is a chain-like or cyclic alkyl group, and the number of carbon atoms thereof is preferably in a range of 1 to 30.

It is preferable that the alkenyl group as $R^{201}$ to $R^{207}$, $R^{211}$, and $R^{212}$ has 2 to 10 carbon atoms.

Examples of the substituent which may be included in $R^{201}$ to $R^{207}$, $R^{211}$, and $R^{212}$ include an alkyl group, a halogen atom, a halogenated alkyl group, a carbonyl group, a cyano group, an amino group, an aryl group, and groups respectively represented by Formulae (ca-r-1) to (ca-r-7).

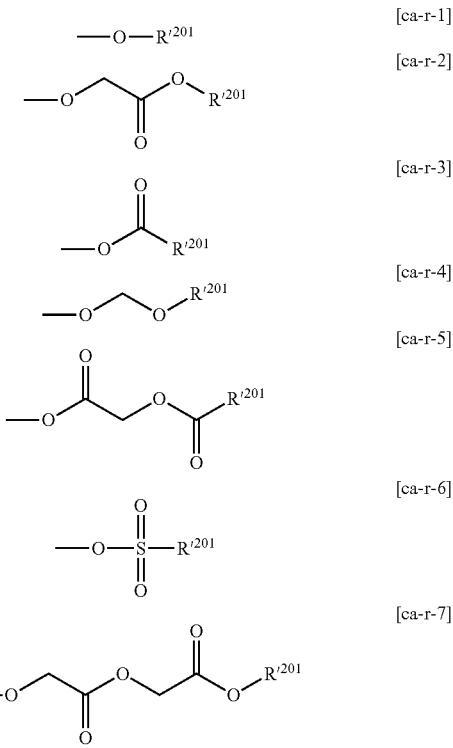

[ca-r-1]

[ca-r-2]

[ca-r-3]

[ca-r-4]

[ca-r-5]

[ca-r-6]

[ca-r-7]

[In the formulae, each $R'^{201}$ independently represents a hydrogen atom, a cyclic group which may have a substituent, a chain-like alkyl group which may have a substituent, or a chain-like alkenyl group which may have a substituent.]

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. Further, the aliphatic hydrocarbon group may be saturated or unsaturated. In general, it is preferable that the aliphatic hydrocarbon group is saturated.

The aromatic hydrocarbon group as $R'^{201}$ is a hydrocarbon group having an aromatic ring. The aromatic hydrocarbon group has preferably 3 to 30 carbon atoms, more preferably 5 to 30, still more preferably 5 to 20, particularly preferably 6 to 15, and most preferably 6 to 10. Here, the number of carbon atoms in a substituent is not included in the number of carbon atoms.

Specific examples of the aromatic ring contained in the aromatic hydrocarbon group as $R'^{201}$ include benzene, fluorene, naphthalene, anthracene, phenanthrene, biphenyl, or an aromatic hetero ring in which some carbon atoms constituting any of these aromatic rings have been substituted with hetero atoms. Examples of the hetero atom in the aromatic hetero rings include an oxygen atom, a sulfur atom, and a nitrogen atom.

Specific examples of the aromatic hydrocarbon group as $R'^{201}$ include a group in which one hydrogen atom has been removed from the aromatic ring (an aryl group such as a phenyl group or a naphthyl group), and a group in which one hydrogen atom in the aromatic ring has been substituted with an alkylene group (for example, an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) has preferably 1 to 4 carbon atoms, more preferably 1 or 2 carbon atoms, and particularly preferably 1 carbon atom.

Examples of the cyclic aliphatic hydrocarbon group as $R'^{201}$ include an aliphatic hydrocarbon group having a ring in the structure thereof.

Examples of the aliphatic hydrocarbon group having a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group has preferably 3 to 20 carbon atoms and more preferably 3 to 12 carbon atoms.

The alicyclic hydrocarbon group may be a polycyclic group or a monocyclic group. As the monocyclic alicyclic hydrocarbon group, a group in which one or more hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the number of carbon atoms of the polycycloalkane is preferably in a range of 7 to 30. Among these, a polycycloalkane having a crosslinked ring polycyclic skeleton such as adamantane, norbornane, isobornane, tricyclodecane, or tetracyclododecane; and a polycycloalkane having a fused ring polycyclic skeleton such as a cyclic group having a steroid skeleton are preferable as the polycycloalkane.

Among these examples, as the cyclic aliphatic hydrocarbon group as $R'^{201}$, a group in which one or more hydrogen atoms have been removed from a monocycloalkane or a polycycloalkane is preferable, a group in which one hydrogen atom has been removed from a polycycloalkane is more preferable, an adamantyl group or a norbornyl group is particularly preferable, and an adamantyl group is most preferable.

The linear or branched aliphatic hydrocarbon group which may be bonded to the alicyclic hydrocarbon group has preferably 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

As the branched aliphatic hydrocarbon group, a branched alkylene group is preferable, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

Further, the cyclic hydrocarbon group as $R'^{201}$ may have a hetero atom such as a hetero ring. Specific examples thereof include lactone-containing cyclic groups respectively represented by Formulae (a2-r-1) to (a2-r-7), —$SO_2$-containing cyclic group respectively represented by Formulae (a5-r-1) to (a5-r-4), and other heterocyclic groups represented by Chemical Formulae (r-hr-1) to (r-hr-16).

Examples of the substituent for the cyclic group as $R'^{201}$ include an alkyl group, an alkoxy group, a halogen atom, a halogenated alkyl group, a hydroxyl group, a carbonyl group, and a nitro group.

As the alkyl group as the substituent, an alkyl group having 1 to 5 carbon atoms is preferable, and a methyl group, an ethyl group, a propyl group, an n-butyl group, or a tert-butyl group is most preferable.

As the alkoxy group as the substituent, an alkoxy group having 1 to 5 carbon atoms is preferable, a methoxy group, an ethoxy group, an n-propoxy group, an iso-propoxy group, an n-butoxy group, or a tert-butoxy group is more preferable, and a methoxy group or an ethoxy group is most preferable.

Examples of the halogen atom as the substituent include a fluorine atom, a chlorine atom, a bromine atom, and an iodine atom. Among these, a fluorine atom is preferable.

Example of the above-described halogenated alkyl group as the substituent includes a group in which some or all hydrogen atoms in an alkyl group having 1 to 5 carbon atoms such as a methyl group, an ethyl group, a propyl group, an n-butyl group, or a tert-butyl group have been substituted with the above-described halogen atoms.

The carbonyl group as the substituent is a group that substitutes a methylene group (—$CH_2$—) constituting the cyclic hydrocarbon group.

Chain-Like Alkyl Group which May have Substituent:

The chain-like alkyl group as $R'^{201}$ may be linear or branched.

The linear alkyl group has preferably 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched alkyl group has preferably 3 to 20 carbon atoms, more preferably 3 to 15, and most preferably 3 to 10. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

Such a chain-like alkenyl group as $R'^{201}$ may be linear or branched, and the number of carbon atoms thereof is preferably in a range of 2 to 10, more preferably in a range of 2 to 5, still more preferably in a range of 2 to 4, and particularly preferably 3. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the examples, as the chain-like alkenyl group, a linear alkenyl group is preferable, a vinyl group or a propenyl group is more preferable, and a vinyl group is particularly preferable.

Examples of the substituent for the chain-like alkyl group or alkenyl group as $R'^{201}$ include an alkoxy group, a halogen atom, a halogenated alkyl group, a hydroxyl group, a carbonyl group, a nitro group, an amino group, and a cyclic group as $R'^{201}$.

Examples of the cyclic group which may have a substituent, the chain-like alkyl group which may have a substituent, and the chain-like alkenyl group which may have a substituent as $R'^{201}$ include the same groups as those for the acid dissociable group represented by Formula (a1-r-2) which are the exemplary examples of the cyclic group which may have a substituent and the chain-like alkyl group which may have a substituent, in addition to those described above.

Among the examples, $R'^{201}$ represents preferably a cyclic group which may have a substituent and more preferably a cyclic hydrocarbon group which may have a substituent. More specific preferred examples thereof include a phenyl group, a naphthyl group, a group in which one or more hydrogen atoms have been removed from a polycycloalkane, a lactone-containing cyclic group represented by any of Formulae (a2-r-1) to (a2-r-7), and a —SO$_2$-containing cyclic group represented by any of Formulae (a5-r-1) to (a5-r-4).

In Formulae (ca-1) to (ca-4), in a case where $R^{201}$ to $R^{203}$, $R^{206}$ and $R^{207}$, and $R^{211}$ and $R^{212}$ are bonded to each other to form a ring with a sulfur atom in the formula, these groups may be bonded to one another through a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (here, R$_N$ represents an alkyl group having 1 to 5 carbon atoms). As a ring to be formed, a ring containing the sulfur atom in the formula in the ring skeleton thereof is preferably a 3- to 10-membered ring and particularly preferably a 5- to 7-membered ring including the sulfur atom. Specific examples of the ring to be formed include a thiophene ring, a thiazole ring, a benzothiophene ring, a thianthrene ring, a benzothiophene ring, a dibenzothiophene ring, a 9H-thioxanthene ring, a thioxanthone ring, a thianthrene ring, a phenoxathiin ring, a tetrahydrothiophenium ring, and a tetrahydrothiopyranium ring.

$R^{208}$ and $R^{209}$ each independently represent a hydrogen atom or an alkyl group having 1 to 5 carbon atoms and preferably a hydrogen atom or an alkyl group having 1 to 3 carbon atoms. In a case where $R^{208}$ and $R^{209}$ each represent an alkyl group, $R^{208}$ and $R^{209}$ may be bonded to each other to form a ring.

$R^{210}$ represents an aryl group which may have a substituent, an alkyl group which may have a substituent, an alkenyl group which may have a substituent, or a —SO$_2$— containing cyclic group which may have a substituent.

Examples of the aryl group as $R^{210}$ include an unsubstituted aryl group having 6 to 20 carbon atoms. Among these, a phenyl group or a naphthyl group is preferable.

As the alkyl group as $R^{210}$, a chain-like or cyclic alkyl group having 1 to 30 carbon atoms is preferable.

It is preferable that the alkenyl group as $R^{210}$ has 2 to 10 carbon atoms.

As the —SO$_2$-containing cyclic group as $R^{210}$ which may have a substituent, the "—SO$_2$-containing polycyclic group" is preferable, and a group represented by Formula (a5-r-1) is more preferable.

$Y^{201}$'s each independently represent an arylene group, an alkylene group, or an alkenylene group.

Examples of the arylene group as $Y^{201}$ include a group in which one hydrogen atom has been removed from an aryl group exemplified as the aromatic hydrocarbon group represented by $R^{101}$ in Formula (b-1).

Examples of the alkylene group and alkenylene group as $Y^{201}$ include a group in which one hydrogen atom has been removed from the chain-like alkyl group or the chain-like alkenyl group as $R^{101}$ in Formula (b-1).

In Formula (ca-4), x represents 1 or 2.

$W^{201}$ represents a (x+1)-valent linking group, that is, a divalent or trivalent linking group.

As the divalent linking group represented by $W^{201}$, a divalent hydrocarbon group which may have a substituent is preferable, and examples thereof include the same divalent hydrocarbon groups which may have a substituent as those for $Ya^{21}$ in Formula (a2-1). The divalent linking group as $W^{201}$ may be linear, branched, or cyclic and cyclic is more preferable. Among these, a group in which two carbonyl groups are combined with both ends of the arylene group is preferable. Examples of the arylene group include a phenylene group and a naphthylene group. Among these, a phenylene group is particularly preferable.

Examples of the trivalent linking group as $W^{201}$ include a group in which one hydrogen atom has been removed from a divalent linking group as $W^{201}$ and a group in which the divalent linking group has been further bonded to the divalent linking group. As the trivalent linking group as $W^{201}$, a group in which two carbonyl groups are bonded to an arylene group is preferable.

Specific examples of suitable cations represented by Formula (ca-1) include cations respectively represented by Chemical Formulae (ca-1-1) to (ca-1-70).

(ca-1-1) 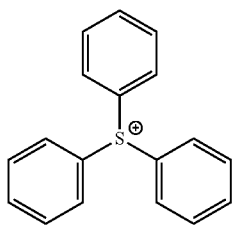
(ca-1-2) 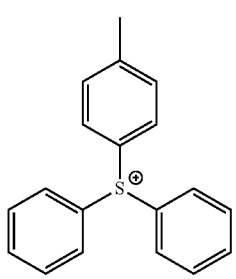
(ca-1-3) 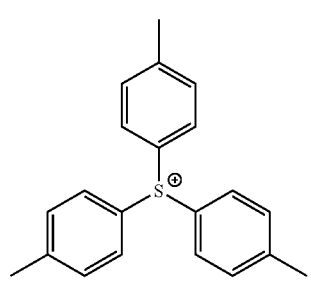
(ca-1-4) 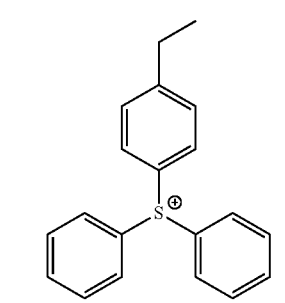
(ca-1-5) 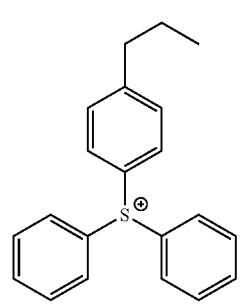
-continued
(ca-1-6) 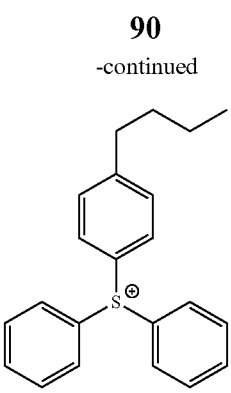
(ca-1-7) 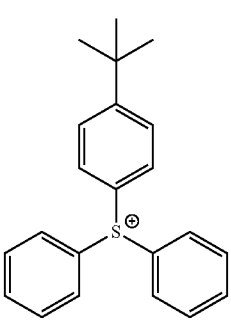
(ca-1-8) 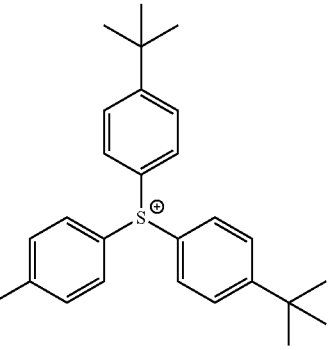
(ca-1-9) 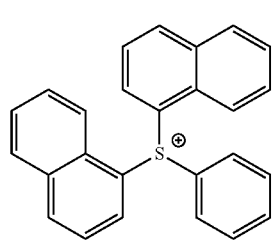
(ca-1-10) 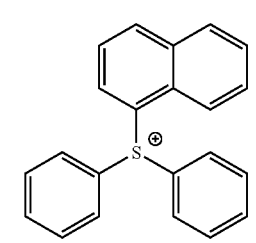

(ca-1-11)
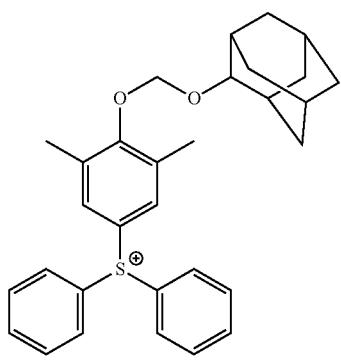
(ca-1-12)
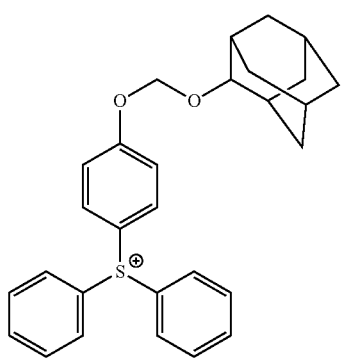
(ca-1-13)
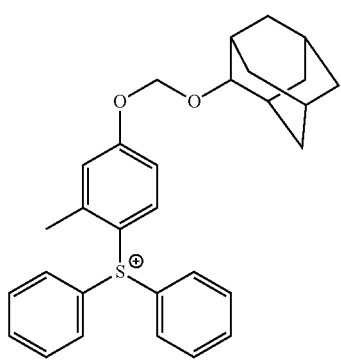
(ca-1-14)
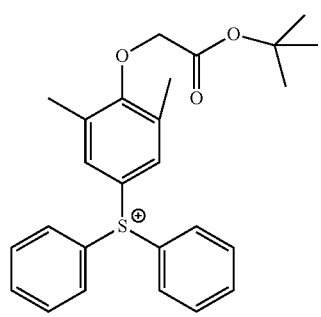
(ca-1-15)
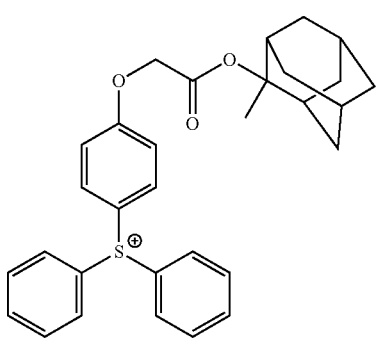
(ca-1-16)
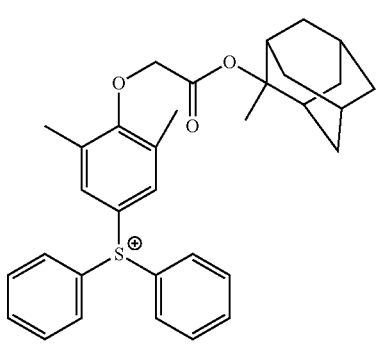
(ca-1-17)
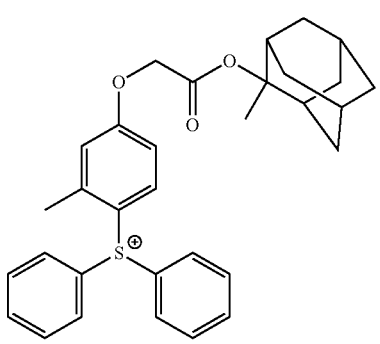
(ca-1-18)
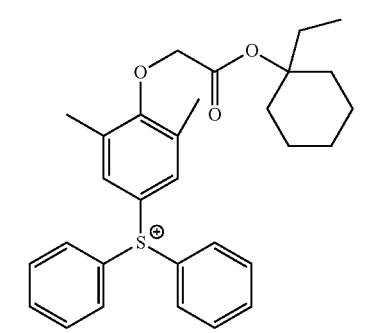

-continued
(ca-1-19)
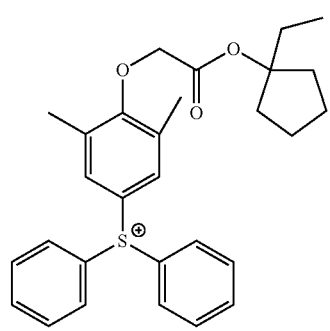
(ca-1-20)
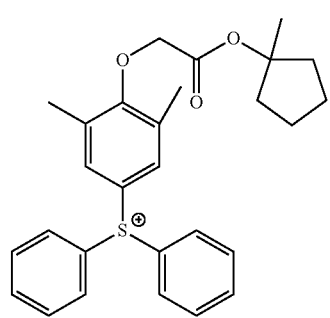
(ca-1-21)
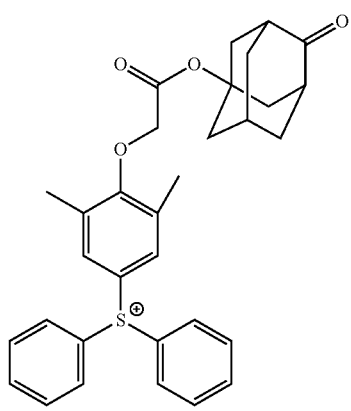
(ca-1-22)
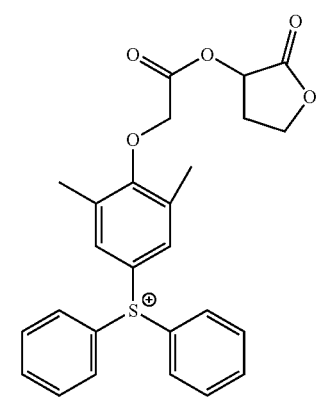
-continued
(ca-1-23)
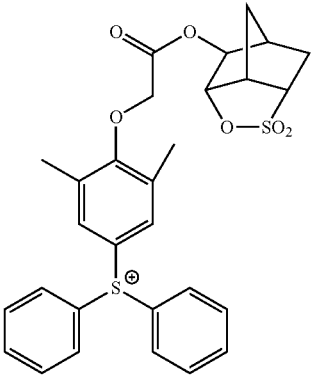
(ca-1-24)
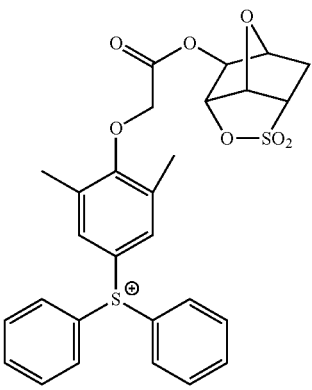
(ca-1-25)
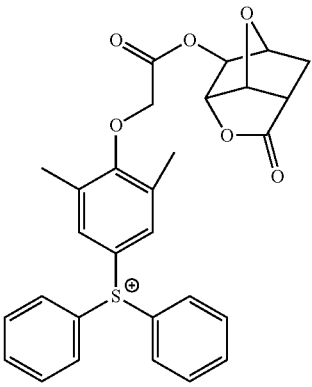
(ca-1-26)
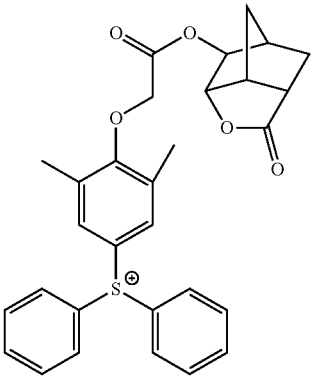

(ca-1-27)
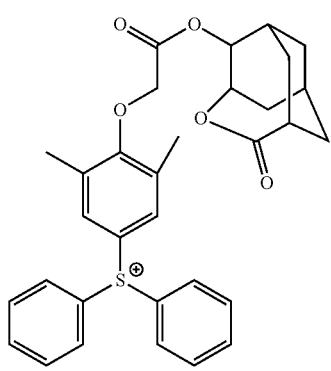
(ca-1-32)
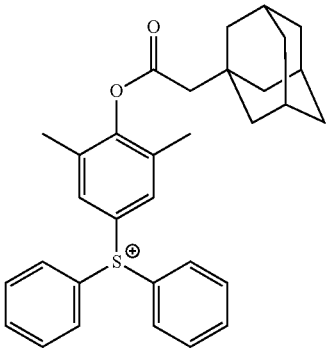
(ca-1-28)
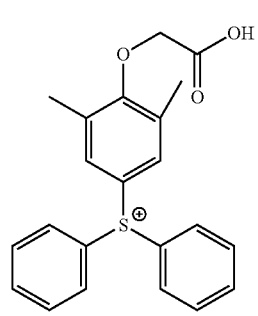
(ca-1-33)
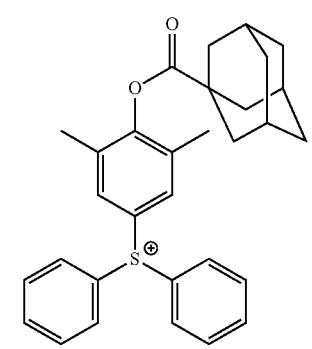
(ca-1-29)
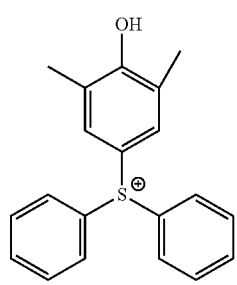
(ca-1-34)
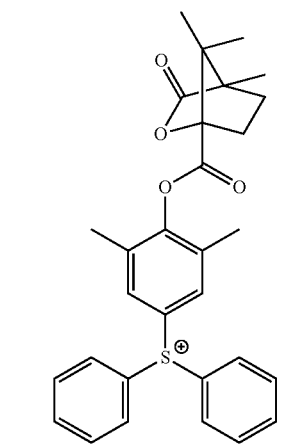
(ca-1-30)
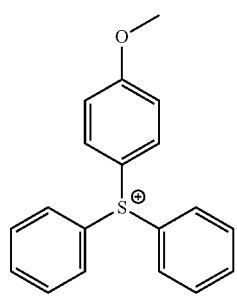
(ca-1-35)
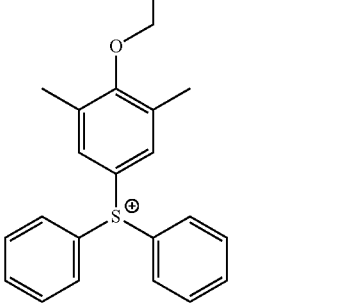
(ca-1-31)
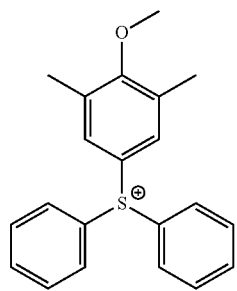

(ca-1-36)
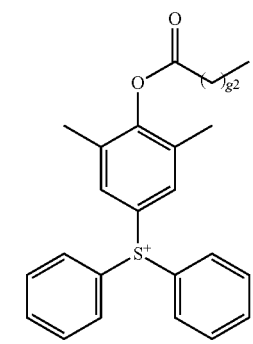
(ca-1-37)
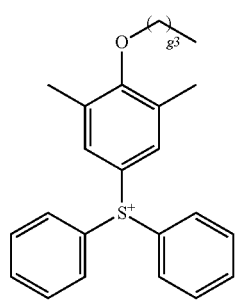
(ca-1-38)
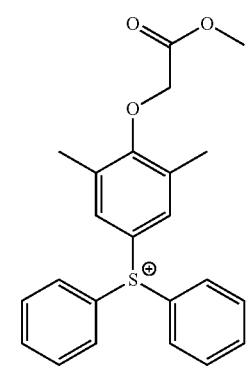
(ca-1-39)
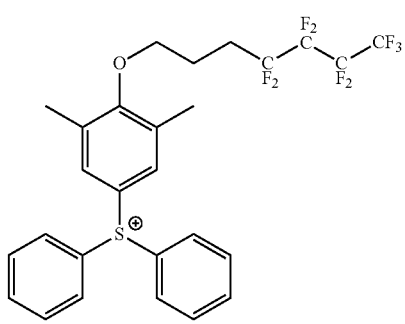
(ca-1-40)
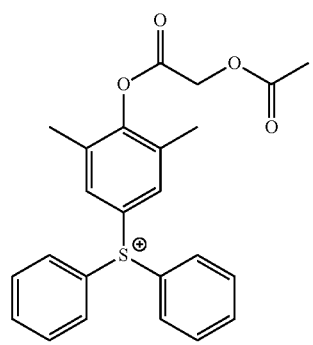
(ca-1-41)
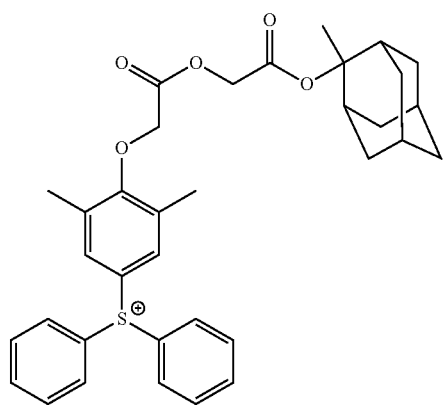
(ca-1-42)
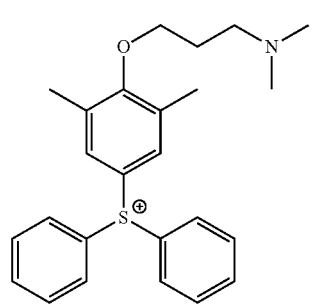
(ca-1-43)
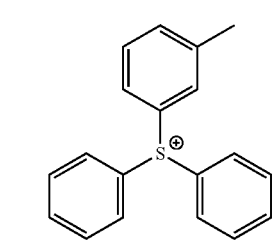
(ca-1-44)
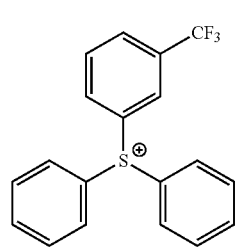

(ca-1-45)
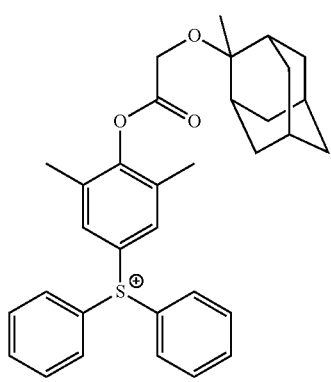
(ca-1-46)
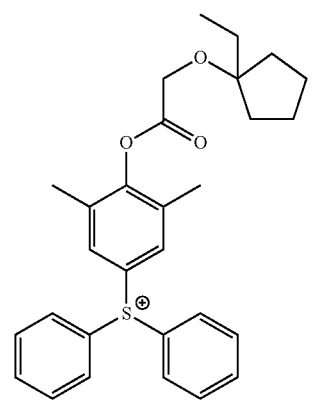
(ca-1-47)
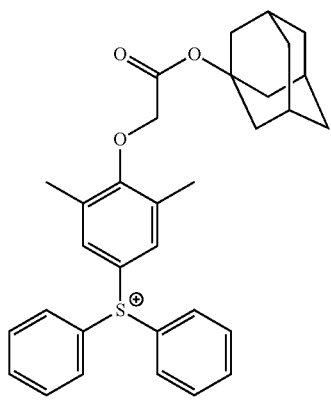
[In the formulae, g1, g2, and g3 represent a repeating number, g1 represents an integer of 1 to 5, g2 represents an integer of 0 to 20, and g3 represents an integer of 0 to 20.]
(ca-1-48)
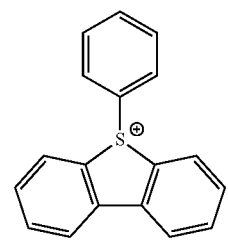
(ca-1-49)
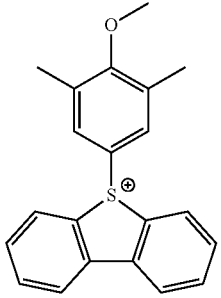
(ca-1-50)
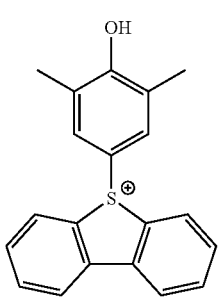
(ca-1-51)
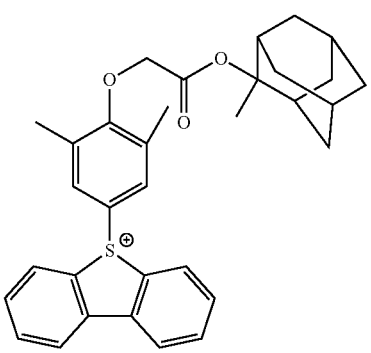
(ca-1-52)
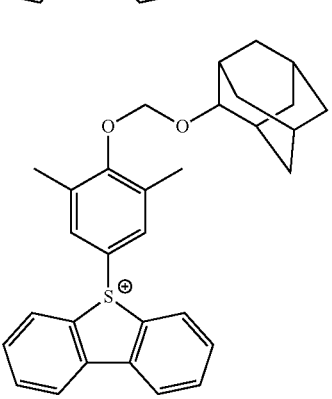
(ca-1-53)
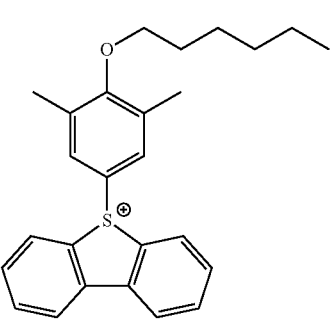

(ca-1-54)
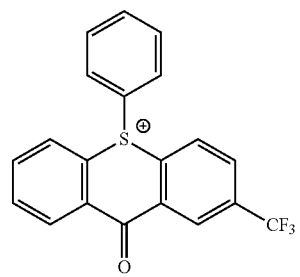
(ca-1-55)
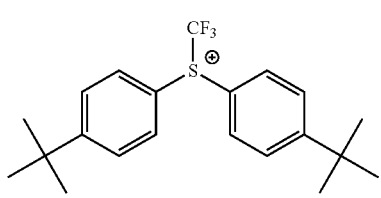
(ca-1-56)
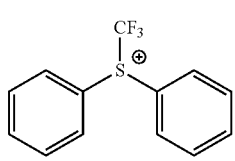
(ca-1-57)
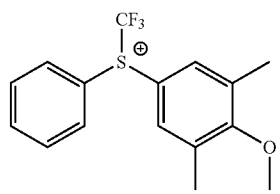
(ca-1-58)
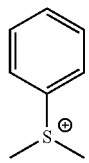
(ca-1-59)
(ca-1-60)
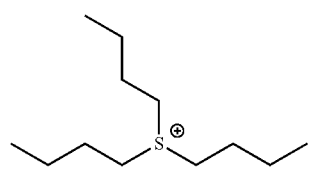
(ca-1-61)
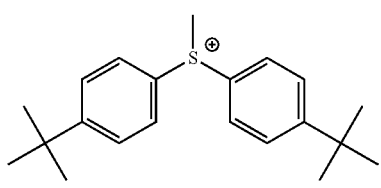
(ca-1-62)
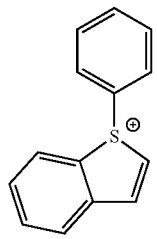
(ca-1-63)
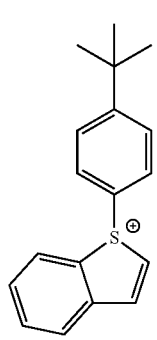
(ca-1-64)
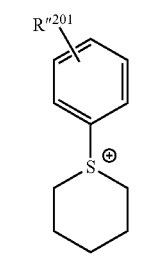
(ca-1-65)
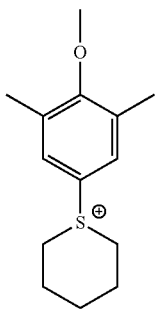
(ca-1-66)
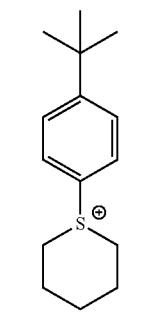

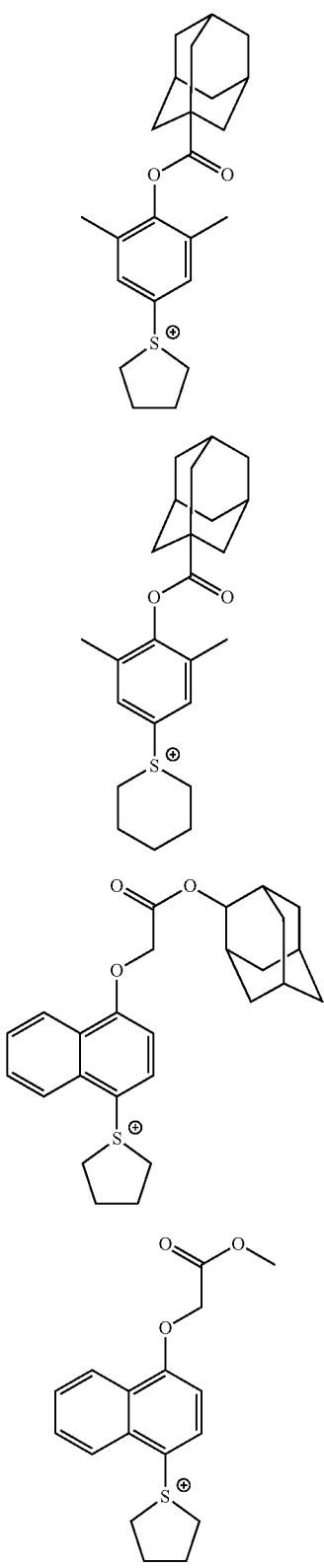

(ca-1-67)

(ca-1-68)

(ca-1-69)

(ca-1-70)

[In the formulae, $R'^{201}$ represents a hydrogen atom or a substituent, and examples of the substituent include the same groups as those for the substituents which may be included in $R^{201}$ to $R^{207}$ and $R^{210}$ to $R^{212}$.]

Specific examples of suitable cations represented by Formula (ca-2) include a diphenyliodonium cation and a bis(4-tert-butylphenyl)iodonium cation.

Specific examples of suitable cations represented by Formula (ca-3) include cations respectively represented by Formulae (ca-3-1) to (ca-3-6).

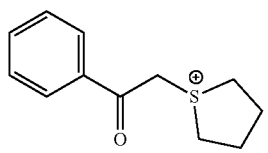

(ca-3-1)

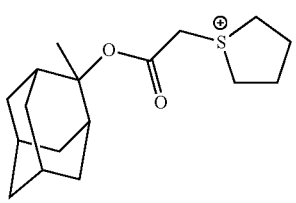

(ca-3-2)

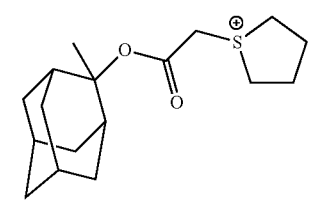

(ca-3-3)

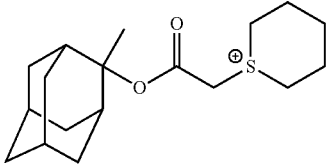

(ca-3-4)

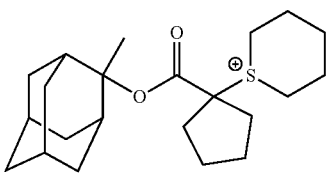

(ca-3-5)

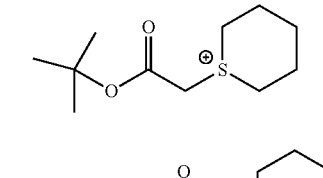

(ca-3-6)

Specific examples of suitable cations represented by Formula (ca-4) include cations respectively represented by Formulae (ca-4-1) and (ca-4-2).

(ca-4-1)
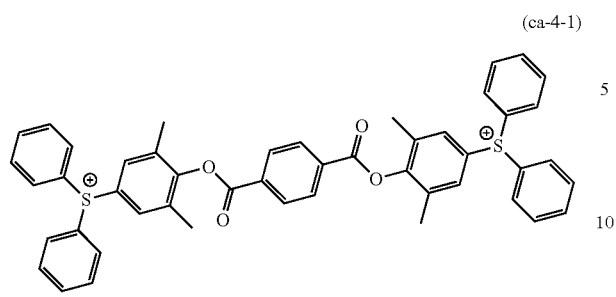
(ca-4-2)
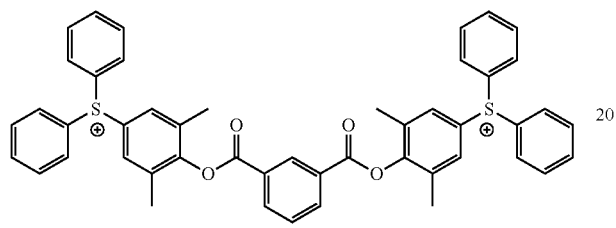
Among the examples above, as the cation moiety (($M^{m+}$)$_{1/m}$), a cation represented by Formula (ca-1) is preferable and specifically, a cation represented by Formula (ca-1) is more preferable.
Specific examples of the component (B1) in the present embodiment are described below, but the present invention is not limited thereto.
(B1-1)
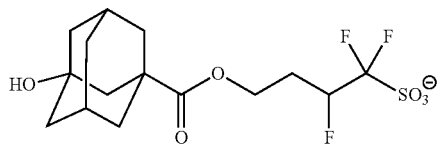
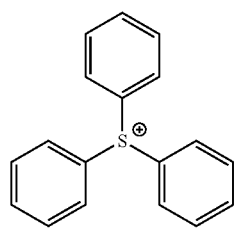
(B1-2)
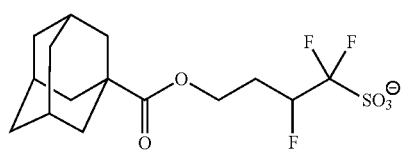
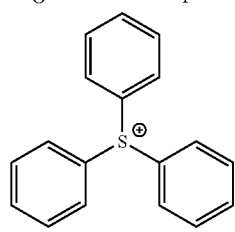
(B1-3)
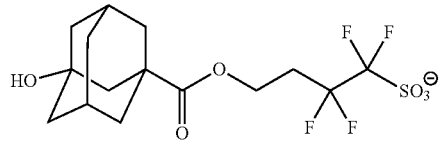
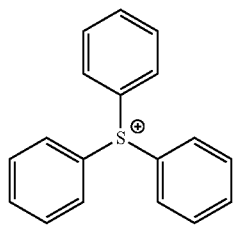
(B1-4)
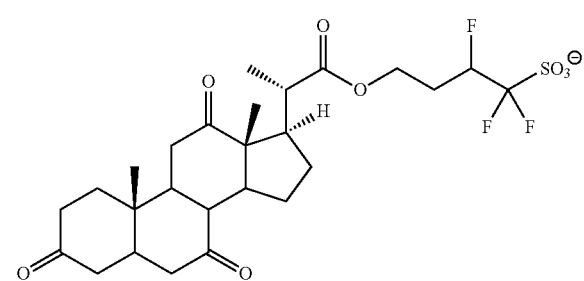
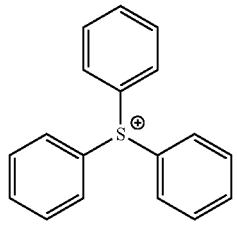
(B1-5)
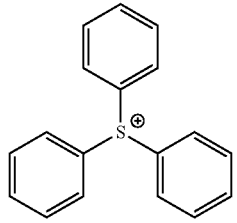
(B1-6)

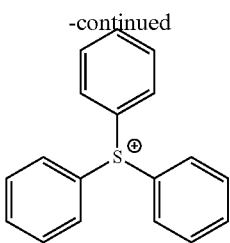

(B1-7)

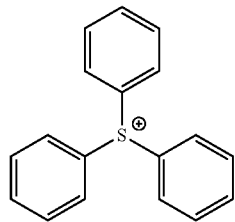

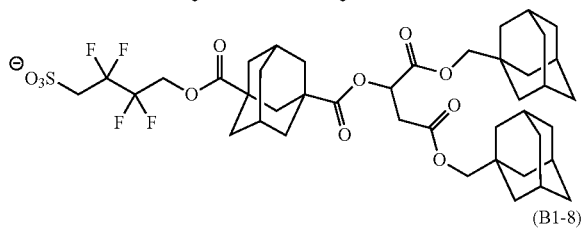

(B1-8)

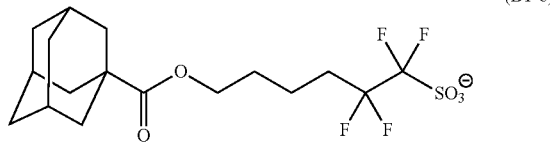

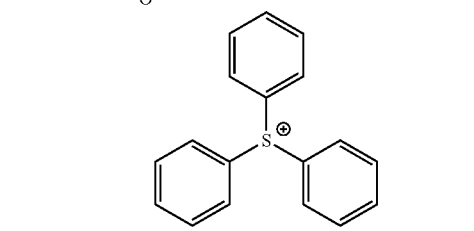

In the resist composition according to the present embodiment, the component (B1) may be used alone or in combination of two or more kinds thereof.

The content of the component (B1) is preferably less than 50 parts by mass, more preferably in a range of 1 to 40 parts by mass, and still more preferably in a range of 5 to 25 parts by mass with respect to 100 parts by mass of the component (A).

In a case where the content of the component (B1) is set to be in the preferable above-described range, pattern formation is satisfactorily performed. Further, it is preferable that each component of the resist composition is dissolved in an organic solvent from the viewpoint that a uniform solution is easily obtained and the storage stability of the resist composition is improved.

In the resist composition, the proportion of the component (B1) in the entire acid generator component (B) that generates an acid acting on the component (A) is 50% by mass or greater, preferably 70% by mass or greater, and more preferably 95% by mass or greater. In addition, the proportion thereof may be 100% by mass.

<<Component (B2)>>

The resist composition of the present embodiment may contain an acid generator component (hereinafter, referred to as a "component (B2)") other than the component (B1) in a range where the effects of the present invention are not impaired.

The component (B2) is not particularly limited, and those which have been proposed as an acid generator for a chemically amplified resist composition in the related art can be used.

Examples of the acid generator include various acid generators, for example, onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators, iminosulfonate-based acid generators, and disulfone-based acid generators.

Examples of the onium salt-based acid generators include a compound represented by Formula (b-1) (hereinafter, also referred to as a "component (b-1)"), a compound represented by Formula (b-2) (hereinafter, also referred to as a "component (b-2)"), and a compound represented by Formula (b-3) (hereinafter, also referred to as a "component (b-3)"). In the component (b-1), those corresponding to the component (B1) described above are excluded. That is, in Formula (b-1), those in which the total number of fluorine atoms in $V^{101}$ and $R^{102}$ is 2 or 3 are excluded.

(b-1)

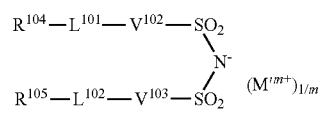

(b-2)

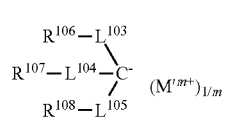

(b-3)

[In the formulae, $R^{101}$ and $R^{104}$ to $R^{108}$ each independently represent a cyclic group which may have a substituent, a chain-like alkyl group which may have a substituent, or a chain-like alkenyl group which may have a substituent. $R^{104}$ and $R^{105}$ may be bonded to each other to form a ring structure. $R^{102}$ represents a fluorinated alkyl group having 1 to 5 carbon atoms or a fluorine atom. $Y^{101}$ represents a divalent linking group having an oxygen atom or a single bond. $V^{101}$ to $V^{103}$ each independently represent a single bond, an alkylene group, or a fluorinated alkylene group. $L^{101}$ and $L^{102}$ each independently represent a single bond or an oxygen atom. $L^{103}$ to $L^{105}$ each independently represent a single bond, —CO—, or —SO$_2$—. m represents an integer of 1 or greater, and $M^{m+}$ represents an m-valent onium cation.]

{Anion Moiety}

Anions in Component (b-1)

In Formula (b-1), $R^{101}$ represents a cyclic group which may have a substituent, a chain-like alkyl group which may have a substituent, or a chain-like alkenyl group which may have a substituent.

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. Further, the aliphatic hydrocarbon group may be saturated or unsaturated. In general, it is preferable that the aliphatic hydrocarbon group is saturated.

The aromatic hydrocarbon group as $R^{101}$ is a hydrocarbon group having an aromatic ring. The aromatic hydrocarbon group has preferably 3 to 30 carbon atoms, more preferably 5 to 30, still more preferably 5 to 20, particularly preferably 6 to 15, and most preferably 6 to 10. Here, the number of carbon atoms in a substituent is not included in the number of carbon atoms.

Specific examples of the aromatic ring contained in the aromatic hydrocarbon group as $R^{101}$ include benzene, fluorene, naphthalene, anthracene, phenanthrene, biphenyl, and an aromatic hetero ring in which some carbon atoms constituting these aromatic rings have been substituted with hetero atoms. Examples of the hetero atom in the aromatic hetero rings include an oxygen atom, a sulfur atom, and a nitrogen atom.

Specific examples of the aromatic hydrocarbon group as $R^{101}$ include a group in which one hydrogen atom has been removed from the aromatic ring (for example, an aryl group such as a phenyl group or a naphthyl group), and a group in which one hydrogen atom in the aromatic ring has been substituted with an alkylene group (for example, an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) has preferably 1 to 4 carbon atoms, more preferably 1 or 2 carbon atoms, and particularly preferably 1 carbon atom.

Examples of the cyclic aliphatic hydrocarbon group as $R^{101}$ include an aliphatic hydrocarbon group having a ring in the structure thereof.

Examples of the aliphatic hydrocarbon group having a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group has preferably 3 to 20 carbon atoms and more preferably 3 to 12 carbon atoms.

The alicyclic hydrocarbon group may be a polycyclic group or a monocyclic group. As the monocyclic alicyclic hydrocarbon group, a group in which one or more hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the number of carbon atoms of the polycycloalkane is preferably in a range of 7 to 30. Among these, a polycycloalkane having a crosslinked ring polycyclic skeleton such as adamantane, norbornane, isobornane, tricyclodecane, or tetracyclododecane; and a polycycloalkane having a fused ring polycyclic skeleton such as a cyclic group having a steroid skeleton are preferable as the polycycloalkane.

Among these examples, as the cyclic aliphatic hydrocarbon group as $R^{101}$, a group in which one or more hydrogen atoms have been removed from a monocycloalkane or a polycycloalkane is preferable, a group in which one hydrogen atom has been removed from a polycycloalkane is more preferable, an adamantyl group or a norbornyl group is particularly preferable, and an adamantyl group is most preferable.

The linear aliphatic hydrocarbon group which may be bonded to the alicyclic hydrocarbon group has preferably 1 to 10 carbon atoms, more preferably 1 to 6 carbon atoms, still more preferably 1 to 4 carbon atoms, and most preferably 1 to 3 carbon atoms. As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group which may be bonded to the alicyclic hydrocarbon group has preferably 2 to 10 carbon atoms, more preferably 3 to 6 carbon atoms, still more preferably 3 or 4 carbon atoms, and most preferably 3 carbon atoms. As the branched aliphatic hydrocarbon group, a branched alkylene group is preferable, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

Further, the cyclic hydrocarbon group as $R^{101}$ may have a hetero atom such as a hetero ring. Specific examples thereof include lactone-containing cyclic groups respectively represented by Formulae (a2-r-1) to (a2-r-7), —$SO_2$-containing cyclic group respectively represented by Formulae (a5-r-1) to (a5-r-4), and other heterocyclic groups represented by Chemical Formulae (r-hr-1) to (r-hr-16).

Examples of the substituent for the cyclic group as $R^{101}$ include an alkyl group, an alkoxy group, a halogen atom, a halogenated alkyl group, a hydroxyl group, a carbonyl group, and a nitro group.

As the alkyl group as the substituent, an alkyl group having 1 to 5 carbon atoms is preferable, and a methyl group, an ethyl group, a propyl group, an n-butyl group, or a tert-butyl group is most preferable.

As the alkoxy group as the substituent, an alkoxy group having 1 to 5 carbon atoms is preferable, a methoxy group, an ethoxy group, an n-propoxy group, an iso-propoxy group, an n-butoxy group, or a tert-butoxy group is more preferable, and a methoxy group or an ethoxy group is most preferable.

Examples of the halogen atom as the substituent include a fluorine atom, a chlorine atom, a bromine atom, and an iodine atom. Among these, a fluorine atom is preferable.

Example of the halogenated alkyl group as the substituent includes a group in which some or all hydrogen atoms in an alkyl group having 1 to 5 carbon atoms such as a methyl group, an ethyl group, a propyl group, an n-butyl group, or a tert-butyl group have been substituted with the halogen atoms.

The carbonyl group as the substituent is a group that substitutes a methylene group (—$CH_2$—) constituting the cyclic hydrocarbon group.

Chain-Like Alkyl Group which May have Substituent:

The chain-like alkyl group as $R^{101}$ may be linear or branched.

The linear alkyl group has preferably 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched alkyl group has preferably 3 to 20 carbon atoms, more preferably 3 to 15, and most preferably 3 to 10. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

The chain-like alkenyl group as $R^{101}$ may be linear or branched, and the number of carbon atoms thereof is preferably in a range of 2 to 10, more preferably in a range of 2 to 5, still more preferably in a range of 2 to 4, and particularly preferably 3. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the examples, as the chain-like alkenyl group, a linear alkenyl group is preferable, a vinyl group or a propenyl group is more preferable, and a vinyl group is particularly preferable.

Examples of the substituent for the chain-like alkyl group or alkenyl group as $R^{101}$ include an alkoxy group, a halogen atom, a halogenated alkyl group, a hydroxyl group, a carbonyl group, a nitro group, an amino group, a cyclic group as $R^{101}$.

Among the examples, $R^{101}$ represents preferably a cyclic group which may have a substituent and more preferably a cyclic hydrocarbon group which may have a substituent. More specific preferred examples thereof include a phenyl group, a naphthyl group, a group in which one or more hydrogen atoms have been removed from a polycycloalkane, a lactone-containing cyclic group represented by any of Formulae (a2-r-1) to (a2-r-7), and a —$SO_2$-containing cyclic group represented by any of Formulae (a5-r-1) to (a5-r-4).

In Formula (b-1), $Y^{101}$ represents a single bond or a divalent linking group having an oxygen atom.

In a case where $Y^{101}$ represents a divalent linking group having an oxygen atom, $Y^{101}$ may have an atom other than the oxygen atom. Examples of atoms other than an oxygen atom include a carbon atom, a hydrogen atom, a sulfur atom, and a nitrogen atom.

Examples of the divalent linking group having an oxygen atom include a non-hydrocarbon oxygen atom-containing linking group such as an oxygen atom (an ether bond: —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and combinations of the above-described non-hydrocarbon oxygen atom-containing linking groups with an alkylene group. Further, a sulfonyl group (—$SO_2$—) may be further linked to the combination. Examples of the divalent linking group having an oxygen atom include linking groups respectively represented by Formulae (y-a1-1) to (y-a1-7).

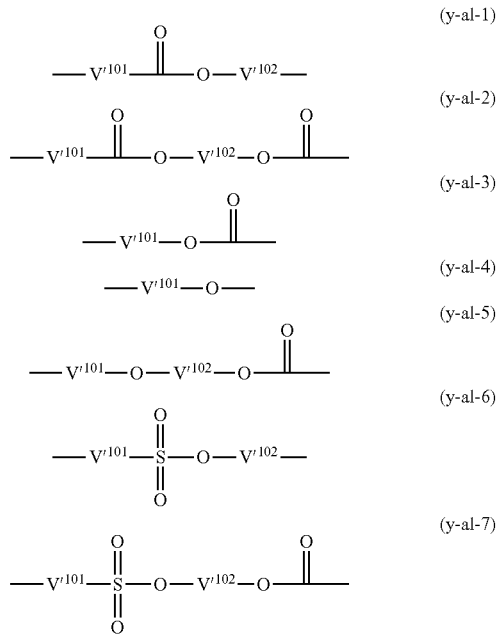

[In the formulae, $V'^{101}$ represents a single bond or an alkylene group having 1 to 5 carbon atoms, and $V'^{102}$ represents a divalent saturated hydrocarbon group having 1 to 30 carbon atoms.]

The divalent saturated hydrocarbon group as $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group as $V'^{101}$ and $V'^{102}$ may be a linear alkylene group or a branched alkylene group, and a linear alkylene group is preferable.

Specific examples of the alkylene group as $V'^{1}$ and $V'^{102}$ include a methylene group [—$CH_2$—]; an alkylmethylene group such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, or —C($CH_2CH_3$)$_2$—; an ethylene group [—$CH_2CH_2$—]; an alkylethylene group such as —CH($CH_3$)$CH_2$—, —CH($CH_3$)CH($CH_3$)—, —C($CH_3$)$_2CH_2$—, or —CH($CH_2CH_3$)$CH_2$—; a trimethylene group (n-propylene group) [—$CH_2CH_2CH_2$—]; an alkyltrimethylene group such as —CH($CH_3$)$CH_2CH_2$— or —$CH_2$CH($CH_3$)$CH_2$—; a tetramethylene group [—$CH_2CH_2CH_2CH_2$—]; an alkyltetramethylene group such as —CH($CH_3$)$CH_2CH_2CH_2$— or —$CH_2$CH($CH_3$)$CH_2CH_2$—; and a pentamethylene group [—$CH_2CH_2CH_2CH_2CH_2$—].

Further, a part of methylene group in the alkylene group as $V'^{101}$ and $V'^{102}$ may be substituted with a divalent aliphatic cyclic group having 5 to 10 carbon atoms. As the aliphatic cyclic group, a divalent group in which one hydrogen atom has been removed from the cyclic aliphatic hydrocarbon group (a monocyclic aliphatic hydrocarbon group or a polycyclic aliphatic hydrocarbon group) as $Ra'^{3}$ in Formula (a1-r-1) is preferable, and a cyclohexylene group, a 1,5-adamantylene group, or a 2,6-adamantylene group is more preferable.

$Y^{101}$ represents preferably a divalent linking group having an ester bond or a divalent linking group having an ether bond and more preferably linking groups respectively represented by Formulae (y-a1-1) to (y-a1-5).

In Formula (b-1), $V^{101}$ represents a single bond, an alkylene group, or a fluorinated alkylene group. It is preferable that the alkylene group and the fluorinated alkylene group as $V^{101}$ have 1 to 4 carbon atoms. Examples of the fluorinated alkylene group as $V^{101}$ include a group in which some or all hydrogen atoms in the alkylene group as $V^{101}$ have been substituted with fluorine atoms. Among these examples, it is preferable that $V^{101}$ represents a single bond or a fluorinated alkylene group having 1 to 4 carbon atoms.

In Formula (b-1), $R^{102}$ represents a fluorine atom or a fluorinated alkyl group having 1 to 5 carbon atoms. $R^{102}$ represents preferably a fluorine atom or a perfluoroalkyl group having 1 to 5 carbon atoms and more preferably a fluorine atom.

In a case where $Y^{101}$ represents a single bond, specific example of the anion moiety represented by Formula (b-1) include a fluorinated alkylsulfonate anion such as a trifluoromethanesulfonate anion or a perfluorobutanesulfonate anion. Further, in a case where $Y^{101}$ represents a divalent linking group having an oxygen atom, specific examples thereof include an anion represented by any of Formulae (an-1) to (an-3).

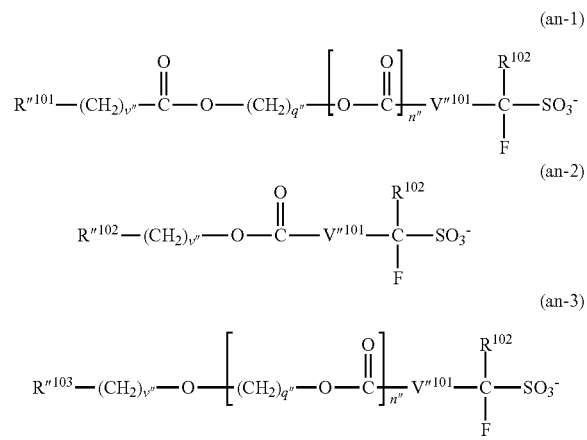

[In the formulae, $R''^{101}$ represents an aliphatic cyclic group which may have a substituent, a monovalent heterocyclic group represented by any of Chemical Formulae (r-hr-1) to (r-hr-6), or a chain-like alkyl group which may have a substituent. $R''^{102}$ represents an aliphatic cyclic group which may have a substituent, a lactone-containing cyclic group represented by any of Formulae (a2-r-1) and (a2-r-3) to (a2-r-7), or a —$SO_2$-containing cyclic group represented by any of Formulae (a5-r-11 to a5-r-4). $R''^{103}$ represents an aromatic cyclic group which may have a substituent, an aliphatic cyclic group which may have a substituent, or a chain-like alkenyl group which may have a substituent. $V''^{101}$ represents a single bond, an alkylene group having 1 to 4 carbon atoms, or a fluorinated alkylene group having 1 to 4 carbon atoms. $R^{102}$ represents a fluorine atom or a fluorinated alkyl group having 1 to 5 carbon atoms. Each v" independently represents an integer of 0 to 3, each q" independently represents an integer of 0 to 20, and n" represents 0 or 1.]

As the aliphatic cyclic group as $R''^{101}$, $R''^{102}$, and $R''^{103}$ which may have a substituent, the same groups as those for the cyclic aliphatic hydrocarbon group as $R^{101}$ in Formula (b-1) are preferable. Examples of the substituent include the same groups as those for the substituent which may substitute the cyclic aliphatic hydrocarbon group as $R^{101}$ in Formula (b-1).

As the aromatic cyclic group as $R''^{103}$ which may have a substituent, the same groups as those for the aromatic hydrocarbon group in the cyclic hydrocarbon group as $R^{101}$ in Formula (b-1) are preferable. Examples of the substituent include the same groups as those for the substituent which may substitute the aromatic hydrocarbon group as $R^{101}$ in Formula (b-1).

As the chain-like alkyl group as $R''^{101}$ which may have a substituent, the same groups as those for the chain-like alkyl group as $R^{101}$ in Formula (b-1) are preferable.

As the chain-like alkenyl group as $R''^{103}$ which may have a substituent, the same groups as those for the chain-like alkenyl group as $R^{101}$ in Formula (b-1) are preferable.

Anions in Component (b-2)

In Formula (b-2), $R^{104}$ and $R^{105}$ each independently represent a cyclic group which may have a substituent, a chain-like alkyl group which may have a substituent, or a chain-like alkenyl group which may have a substituent, and examples thereof include the same groups as those for $R^{101}$ in Formula (b-1). Here, $R^{104}$ and $R^{105}$ may be bonded to each other to form a ring.

$R^{104}$ and $R^{105}$ represent preferably a chain-like alkyl group which may have a substituent and more preferably a linear or branched alkyl group or a linear or branched fluorinated alkyl group.

The chain-like alkyl group has preferably 1 to 10 carbon atoms, more preferably 1 to 7 carbon atoms, and still more preferably 1 to 3 carbon atoms. It is preferable that the number of carbon atoms in the chain-like alkyl group as $R^{104}$ and $R^{105}$ becomes smaller within the range of the number of carbon atoms because the solubility in a solvent for a resist is also excellent. Further, in the chain-like alkyl group as $R^{104}$ and $R^{105}$, it is preferable that the number of hydrogen atoms substituted with fluorine atoms is as large as possible because the acid strength increases and the transparency to high energy light with a wavelength of 250 nm or less or electron beams is improved. The proportion of fluorine atoms in the chain-like alkyl group, that is, the fluorination ratio is preferably in a range of 70% to 100% and more preferably in a range of 90% to 100%, and it is most preferable that the chain-like alkyl group is a perfluoroalkyl group in which all hydrogen atoms are substituted with fluorine atoms.

In Formula (b-2), $V^{102}$ and $V^{103}$ each independently represent a single bond, an alkylene group, or a fluorinated alkylene group, and examples thereof include the same groups as those for $V^{101}$ in Formula (b-1).

In Formula (b-2), $L^{101}$ and $L^{102}$ each independently represent a single bond or an oxygen atom.

Anions in Component (b-3)

In Formula (b-3), $R^{106}$ to $R^{108}$ each independently represent a cyclic group which may have a substituent, a chain-like alkyl group which may have a substituent, or a chain-like alkenyl group which may have a substituent, and examples thereof include the same groups as those for $R^{101}$ in Formula (b-1).

In Formula (b-3), $L^{103}$ to $L^{105}$ each independently represent a single bond, —CO—, or —$SO_2$—.

Among the examples, as the anion moiety of the component (B), an anion in the component (b-1) is preferable. Among the examples, an anion represented by any of Formulae (an-1) to (an-3) is more preferable, an anion represented by Formula (an-1) or (an-2) is still more preferable, and an anion represented by Formula (an-2) is particularly preferable.

{Cation Moiety}

In Formulae (b-1), (b-2) and (b-3), M' represents an m-valent onium cation, and examples thereof include those for $M^{m+}$ described above.

In the resist composition of the present embodiment, the component (B2) may be used alone or in combination of two or more kinds thereof.

In a case where the resist composition contains the component (B), the content of the component (B2) in the resist composition is preferably 50 parts by mass or less, more preferably in a range of 1 to 40 parts by mass, and still more preferably in a range of 5 to 30 parts by mass with respect to 100 parts by mass of the component (A). Further, in a case where the resist composition contains the component (B2), the content of the component (B2) in the entire acid generator component (B) that generates an acid acting on the component (A) in the resist composition is, for example, 50% by mass or less, preferably 30% by mass or less, and more preferably in a range of 0% by mass to 5% by mass.

<Fluorine Additive Component (F)>

The resist composition of the present embodiment contains a fluorine additive component (hereinafter, referred to as a "component (F)") in order to impart hydrophobicity to the resist film or to improve the lithography characteristics. The component (F) contains a fluororesin component (F1) having a constitutional unit (f1) represented by Formula (f-1) and a constitutional unit (f2) represented by Formula (f-2).

<<Constitutional Unit (f1)>>

The constitutional unit (f1) is a constitutional unit represented by Formula (f1-1).

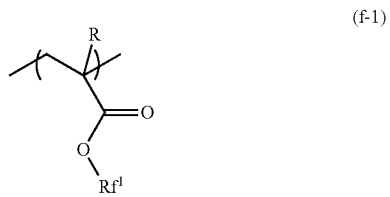

(f-1)

[In Formula (f-1), R represents a hydrogen atom, an alkyl group having 1 to 5 carbon atoms, or a halogenated alkyl group having 1 to 5 carbon atoms. $Rf^1$ represents a monovalent organic group having a fluorine atom.]

In Formula (f-1), R represents a hydrogen atom, an alkyl group having 1 to 5 carbon atoms, or a halogenated alkyl group having 1 to 5 carbon atoms.

As the alkyl group having 1 to 5 carbon atoms represented by R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms as R is a group in which some or all hydrogen atoms of the above-described alkyl group having 1 to 5 carbon atoms have been substituted with halogen atoms. Examples of the halogen atom include a fluorine atom, a chlorine atom, a bromine atom, and an iodine atom. Among these, a fluorine atom is particularly preferable.

It is preferable that R represents a hydrogen atom, an alkyl group having 1 to 5 carbon atoms, or a fluorinated alkyl group having 1 to 5 carbon atoms. Further, from the viewpoint of the industrial availability, R represents more preferably a hydrogen atom, a methyl group, or a trifluoromethyl group, still more preferably a hydrogen atom or a methyl group, and particularly preferably a methyl group.

In Formula (f-1), $Rf^1$ is a monovalent organic group having a fluorine atom.

The monovalent organic group as $Rf^1$ may or may not have an acid dissociable site, but it is preferable that the monovalent organic group does not have an acid dissociable site. Here, the "acid dissociable site" indicates a site where an acid generated upon exposure acts and is dissociated in the organic group as in a case of the above-described "acid dissociable group".

The "organic group" is a group having at least one carbon atom.

Examples of the monovalent organic group include —$Rf^{P1}$, —$Rf^{P2}$—$Rf^{P1}$, —CH(—$Rf^{P1}$)$_2$, —$Rf^{P2}$—O—$Rf^{P1}$, —$Rf^{P2}$—C(=O)—$Rf^{P1}$, —$Rf^{P2}$—C(=O)—O$Rf^{P1}$, —$Rf^{P2}$—OC(=O)—$Rf^{P1}$, —$Rf^{P2}$—OH, —$Rf^{P2}$—CN, and —$Rf^{P2}$—C(=O)OH.

Here, $Rf^{P1}$ represents a linear or branched monovalent alkyl group, a monovalent alicyclic hydrocarbon group, or a monovalent aromatic hydrocarbon group. A plurality of $Rf^{P1}$'s may be the same as or different from each other.

Some or all hydrogen atoms in the linear or branched alkyl group, the monovalent alicyclic hydrocarbon group, and the aromatic hydrocarbon group as $Rf^{P1}$ may be substituted with fluorine atoms, fluorinated alkyl groups having 1 to 5 carbon atoms which have been substituted with fluorine atoms, or carbonyl groups.

$Rf^{P2}$ represents a single bond, a linear or branched divalent alkylene group, a divalent alicyclic hydrocarbon group, or a divalent aromatic hydrocarbon group.

Some or all hydrogen atoms in the linear or branched divalent alkylene group, the divalent alicyclic hydrocarbon group, or the divalent aromatic hydrocarbon group as RfP2 may be substituted with fluorine atoms, fluorinated alkyl groups having 1 to 5 carbon atoms which have been substituted with fluorine atoms, or carbonyl groups.

The number of carbon atoms in the linear or branched monovalent alkyl group as $Rf^{P1}$ is preferably in a range of 1 to 40, more preferably in a range of 1 to 20, and still more preferably in a range of 1 to 12.

Specific examples of the linear monovalent alkyl group include a methyl group, an ethyl group, a propyl group, a butyl group, a pentyl group, a hexyl group, a heptyl group, an octyl group, a nonyl group, a decyl group, an undecyl group, and a dodecyl group.

Specific examples of the branched monovalent alkyl group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Examples of the monovalent alicyclic hydrocarbon group as $Rf^P$ include a monovalent monocyclic alicyclic hydrocarbon group and a monovalent polycyclic alicyclic hydrocarbon group. Here, an aliphatic cyclic group having a cross-linked structure is excluded.

Specific examples of the monovalent monocyclic alicyclic hydrocarbon group include a cyclopropyl group, a cyclobutyl group, a cyclopentyl group, a cyclohexyl group, a cycloheptyl group, a cyclooctyl group, a cyclodecyl group, and a cyclododecyl group.

Specific examples of the monovalent polycyclic alicyclic hydrocarbon group include a group in which one hydrogen atom has been removed from a polycycloalkane. Examples of the polycycloalkane include a polycycloalkane having a fused ring polycyclic skeleton such as decalin, perhydroazulene, perhydroanthracene, or a ring structure having a steroid skeleton.

Examples of the monovalent aromatic hydrocarbon group as $Rf^{P1}$ include a group in which one hydrogen atom has been removed from an aromatic ring. The aromatic ring is not particularly limited as long as the aromatic ring is a cyclic conjugated system having $(4n+2)$ π electrons and may be monocyclic or polycyclic. The aromatic ring has preferably 5 to 30 carbon atoms, more preferably 5 to 20 carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

$Rf^{P2}$ represents a single bond, a linear or branched divalent alkylene group, a divalent alicyclic hydrocarbon group, or a divalent aromatic hydrocarbon group.

Linear or Branched Divalent Alkylene Group as $Rf^{P2}$

The linear alkylene group has preferably 1 to 10 carbon atoms, more preferably 1 to 6 carbon atoms, and still more preferably 1 or 4 carbon atoms.

Specific examples of the linear alkylene group include a methylene group [—CH$_2$—], an ethylene group [—(CH$_2$)$_2$—], a trimethylene group [—(CH$_2$)$_3$—], a tetramethylene group [—(CH$_2$)$_4$—], and a pentamethylene group [—(CH$_2$)$_5$—].

The branched alkylene group has preferably 2 to 10 carbon atoms, more preferably 3 to 6 carbon atoms, and still more preferably 3 or 4 carbon atoms.

Specific examples of the branched alkylene group include alkylalkylene groups, for example, alkylmethylene groups such as —CH(CH$_3$)— and —CH(CH$_2$CH$_3$)—; alkylethylene groups such as —CH(CH$_3$)CH$_2$—, —CH(CH$_3$)CH (CH$_3$)—, and —CH(CH$_2$CH$_3$)CH$_2$—; alkyltrimethylene groups such as —CH(CH$_3$)CH$_2$CH$_2$— and —CH$_2$CH(CH$_3$) CH$_2$—; and alkyltetramethylene groups such as —CH(CH$_3$) CH$_2$CH$_2$CH$_2$— and —CH$_2$CH(CH$_3$)CH$_2$CH$_2$—. As the alkyl group in the alkylalkylene group, a linear alkyl group having 1 to 5 carbon atoms is preferable.

The linear or branched alkylene group may or may not have a substituent. Examples of the substituent include a fluorine atom, a fluorinated alkyl group having 1 to 5 carbon atoms which has been substituted with a fluorine atom, and a carbonyl group.

Divalent Alicyclic Hydrocarbon Group as $Rf^{P2}$

The divalent alicyclic hydrocarbon group may be monocyclic or polycyclic.

Examples of the divalent monocyclic hydrocarbon group include a group in which two hydrogen atoms have been removed from a monocycloalkane. The monocycloalkane has preferably 3 to 6 carbon atoms, and specific examples thereof include cyclopentane and cyclohexane.

Examples of the divalent polycyclic hydrocarbon group include a group in which two hydrogen atoms have been removed from a polycycloalkane. As the polycycloalkane, a group having 7 to 12 carbon atoms is preferable, and specific examples thereof include adamantane, norbornane, isobornane, tricyclodecane, and tetracyclododecane.

As the constitutional unit (f1), a constitutional unit (f11) represented by Formula (f1-1), a constitutional unit (f12) represented by Formula (f1-2), or a constitutional unit (f13) represented by Formula (f1-3) is preferable.

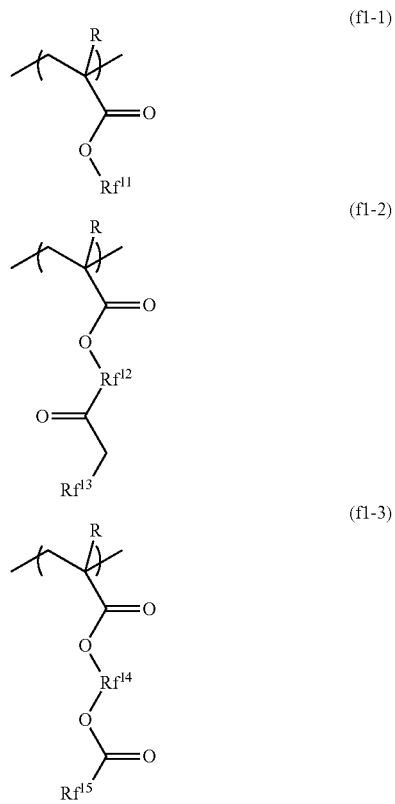

[In Formula (f1-1), R represents a hydrogen atom, an alkyl group having 1 to 5 carbon atoms, or a halogenated alkyl group having 1 to 5 carbon atoms. $Rf^{11}$ represents a fluorinated alkyl group that does not have an acid dissociable site.

In Formula (f1-2), R represents a hydrogen atom, an alkyl group having 1 to 5 carbon atoms, or a halogenated alkyl group having 1 to 5 carbon atoms. $Rf^{12}$ represents a divalent linking group that does not have an acid dissociable site. $Rf^{13}$ represents an alkyl group or a fluorinated alkyl group that does not have an acid dissociable site. Here, in a case where $Rf^{13}$ represents an alkyl group, $Rf^{12}$ represents a divalent linking group having a fluorine atom.

In Formula (f1-3), R represents a hydrogen atom, an alkyl group having 1 to 5 carbon atoms, or a halogenated alkyl group having 1 to 5 carbon atoms. $Rf^{14}$ represents a divalent linking group that does not have an acid dissociable site. $Rf^{15}$ represents an alkyl group or a fluorinated alkyl group that does not have an acid dissociable site. Here, in a case where $Rf^{15}$ represents an alkyl group, $Rf^{14}$ represents a divalent linking group having a fluorine atom.]

In Formulae (f1-1), (f1-2), and (f-3), examples of R include the same groups as those for R in Formula (f-1).

In Formula (f1-1), $Rf^{11}$ represents a fluorinated alkyl group that does not have an acid dissociable site. Examples of the fluorinated alkyl group include a group in which some or all hydrogen atoms in the linear or branched monovalent alkyl group as $Rf^{P1}$ have been substituted with fluorine atoms.

In Formula (f1-1), $Rf^{11}$ represents preferably a linear fluorinated alkyl group and more preferably a trifluoroethyl group (—$CH_2$—$CF_3$).

In Formula (f1-2), $Rf^{12}$ represents a divalent linking group that does not have an acid dissociable site.

Examples of the divalent linking group as $Rf^{12}$ include the linear or branched divalent alkylene group, the divalent alicyclic hydrocarbon group, the divalent aromatic hydrocarbon group, and the divalent linking group having a hetero atom as $Rf^{P2}$. Examples of the divalent linking group having a hetero atom include —O—, —C(=O)—O—, —C(=O)—, —O—C(=O)—O—, —C(=O)—NH—, —NH—, —NH—C(=NH)— (H may be substituted with a substituent such as an alkyl group or an acyl group), —S—, —S(=O)$_2$—, —S(=O)$_2$—O—, and a group represented by Formula: —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$—, or —$Y^{21}$—S(O)$_2$—O—$Y^{22}$— [in the formulae, $Y^{21}$ and $Y^{22}$ each independently represent a divalent hydrocarbon group which may have a substituent, O represents an oxygen atom, and m" represents an integer of 0 to 3].

In a case where the divalent linking group containing a hetero atom is —C(=O)—NH—, —C(=O)—NH—C(=O)—, —NH—, or —NH—C(=NH)—, H may be substituted with a substituent such as an alkyl group, an acyl group, or the like. The substituent (an alkyl group, an acyl group, or the like) has preferably 1 to 10 carbon atoms, more preferably 1 to 8 carbon atoms, and particularly preferably 1 to 5 carbon atoms.

In Formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$—, or —$Y^{21}$—S(=O)$_2$—O—$Y^{22}$—, $Y^{21}$ and $Y^{22}$ each independently represent a divalent hydrocarbon group which may have a substituent. Examples of the divalent hydrocarbon group include the same groups (the divalent hydrocarbon groups which may have a substituent) as those for the above-described divalent linking group as $Ya^{21}$.

As $Y^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As $Y^{22}$, a linear or branched aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[$Y^{21}$—C(=O)—O]$_{m''}$—$Y^{22}$—, m" represents an integer of 0 to 3, preferably an integer of 0 to 2, more preferably 0 or 1, and particularly preferably 1. That is, a group represented by Formula —$Y^{21}$—C(=O)—O—$Y^{22}$— is preferable as the group represented by Formula —[$Y^{21}$—C(=O)—O]$_{m''}$-$Y^{22}$—. Among these, a group represented by Formula —(CH$_2$)$_{a'}$—C(=O)—O—(CH$_2$)$_{b'}$— is preferable. In the formula, a' represents an integer of 1 to 10, preferably an integer of 1 to 8, more preferably 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

In Formula (f1-2), $Rf^{12}$ represents more preferably a linear or branched alkylene group having 1 to 10 carbon atoms which may have a substituent and still more preferably a linear alkylene group having 1 to 10 carbon atoms or a branched fluorinated alkylene group having 1 to 10 carbon atoms.

In Formula (f1-2), $Rf^{13}$ represents an alkyl group or a fluorinated alkyl group that does not have an acid dissociable site. Here, in a case where $Rf^{13}$ represents an alkyl group, $Rf^{12}$ represents a divalent linking group having a fluorine atom.

The number of carbon atoms in the alkyl group or the fluorinated alkyl group as $Rf^{13}$ is preferably in a range of 1 to 5.

In Formula (f1-3), examples of $Rf^{14}$ include the same groups as those for $Rf^{12}$ in Formula (f1-2).

In Formula (f1-3), examples of $Rf^{15}$ include the same groups as those for $Rf^{13}$ in Formula (f1-2).

The constitutional unit (f1) included in the component (F1) may be used alone or in combination of two or more kinds thereof.

Among the constitutional units, the constitutional unit (f11) represented by Formula (f1-1) is preferable as the constitutional unit (f1).

The proportion of the constitutional unit (f1) in the component (F1) is preferably in a range of 30% to 90% by mole, more preferably in a range of 40% to 80% by mole, and particularly preferably in a range of 50% to 75% by mole with respect to the total amount (100% by mole) of all constitutional units constituting the component (F1). In a case where the proportion of the constitutional unit (f1) is set to be greater than or equal to the lower limit of the above-described preferable range, the surface segregation effect can be improved.

Hereinafter, specific examples of the constitutional unit (f1) will be described.

In the formulae shown below, Ra represents a hydrogen atom, a methyl group, or a trifluoromethyl group.

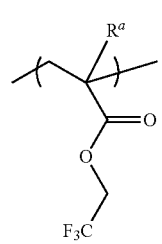

(f1-1-1)

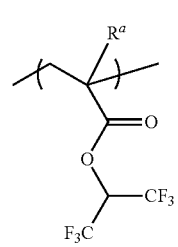

(f1-1-2)

-continued
(f1-1-3)
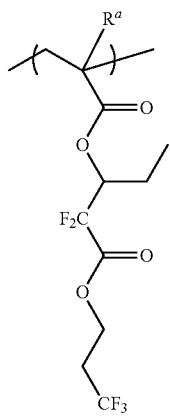
(f1-1-4)
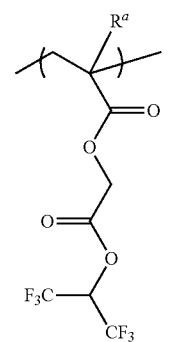
(f1-1-5)
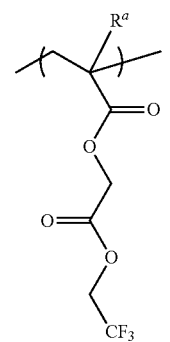
(f1-1-6)
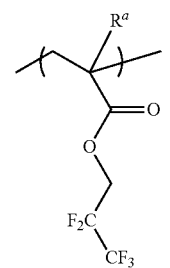
-continued
(f1-1-7)
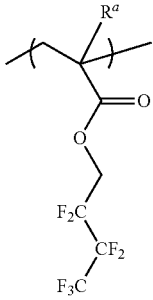
(f1-1-8)
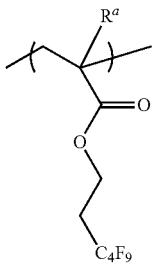
(f1-1-9)
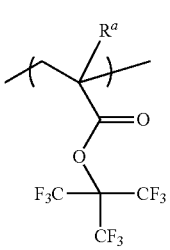
(f1-1-10)
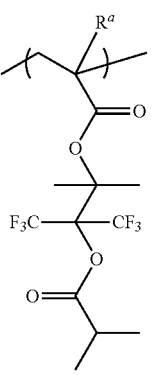
(f1-1-11)
Among the constitutional units, a constitutional unit represented by any of Formulae (f1-1-1), (f1-1-2), (f1-1-3), and (f1-1-4) is preferable as the constitutional unit (f1).
<<Constitutional Unit (f2)>>
The constitutional unit (f2) is a constitutional unit represented by Formula (f-2).

The constitutional unit (f2) has a polycyclic aliphatic cyclic group having a plurality of alkyl groups. Therefore, the hydrophobicity of the resist film can be further improved.

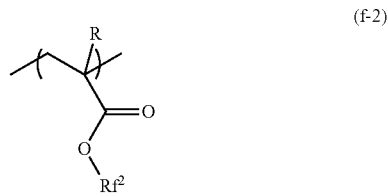

[In Formula (f-2), R represents a hydrogen atom, an alkyl group having 1 to 5 carbon atoms, or a halogenated alkyl group having 1 to 5 carbon atoms. $Rf^2$ represents a group represented by Formula (f2-r-1).]

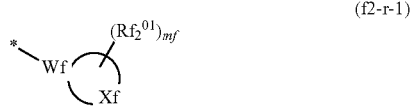

[In the formula, Wf represents a carbon atom. Xf represents a group that forms a polycyclic aliphatic cyclic group with Wf. $Rf_2^{o1}$ represents an alkyl group. Here, $Rf_2^{o1}$ is not bonded to Wf. mf represents an integer of 2 or greater. The symbol * represents a bonding site.]

In Formula (f-2), R represents a hydrogen atom, an alkyl group having 1 to 5 carbon atoms, or a halogenated alkyl group having 1 to 5 carbon atoms, and examples of R include the same groups as those for R in Formula (f-1).

In Formula (f-2), $Rf^2$ represents a group represented by Formula (f2-r-1).

In Formula (f2-r-1), Wf represents a carbon atom, and Xf represents a group that forms a polycyclic aliphatic cyclic group with Wf. As the polycyclic alicyclic hydrocarbon group, a group in which one or more hydrogen atoms have been removed from a polycycloalkane is preferable, and the number of carbon atoms of the polycycloalkane is preferably in a range of 7 to 30 and more preferably in a range of 7 to 20. Among these, a polycycloalkane having a crosslinked ring polycyclic skeleton such as adamantane, norbornane, isobornane, tricyclodecane, or tetracyclododecane; and a polycycloalkane having a fused ring polycyclic skeleton such as a cyclic group having a steroid skeleton are preferable as the polycycloalkane.

In Formula (f-2), $Rf^{201}$ represents an alkyl group. As the alkyl group, a linear alkyl group having 1 to 5 carbon atoms is preferable. Specific examples thereof include a methyl group, an ethyl group, a propyl group, a butyl group, and a pentyl group. Among these, a methyl group is more preferable.

In Formula (f-2), mf represents an integer of 2 or greater and preferably an integer of 3 or greater from the viewpoint of improving the hydrophobicity. Further, mf depends on the polycyclic aliphatic cyclic group formed by Xf and Wf, but mf represents preferably 7 or less and more preferably 5 or less.

The constitutional unit (f2) included in the component (F1) may be used alone or in combination of two or more kinds thereof.

The proportion of the constitutional unit (f2) in the component (F1) is preferably in a range of 10% to 70% by mole, more preferably in a range of 15% to 60% by mole, and particularly preferably in a range of 20% to 50% by mole with respect to the total amount (100% by mole) of all constitutional units constituting the component (F1).

In a case where the proportion of the constitutional unit (f2) is set to be greater than or equal to the lower limit of the above-described preferable range, the hydrophobicity of the resist film can be further improved. Further, in a case where the proportion thereof is set to be less than or equal to the upper limit of the above-described preferable range, the constitutional unit (f2) and other constitutional units can be balanced, and the lithography characteristics are improved.

Hereinafter, specific examples of the constitutional unit (f2) will be described.

In the formulae shown below, Ra represents a hydrogen atom, a methyl group, or a trifluoromethyl group.

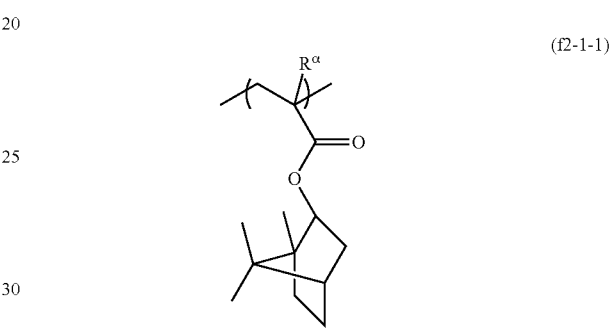

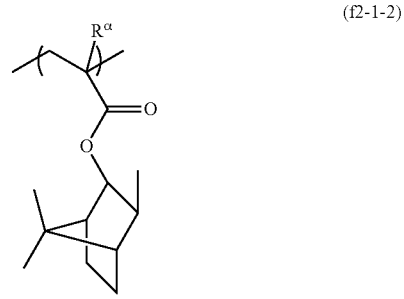

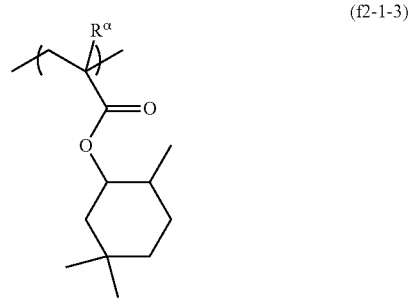

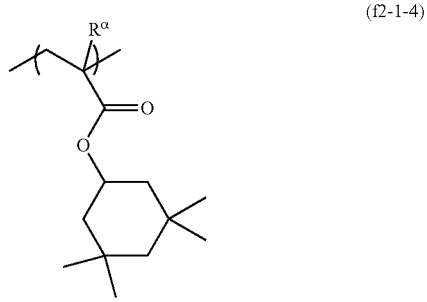

Among the constitutional units, the constitutional unit represented by Formula (f2-1-1) is preferable as the constitutional unit (f2).

In the resist composition according to the present embodiment, the component (F1) may be used alone or in combination of two or more kinds thereof.

The content of the component (F1) is preferably in a range of 0.1 to 10 parts by mass and more preferably in a range of 0.5 to 5 parts by mass with respect to 100 parts by mass of the component (A).

The proportion of the component (F1) in the component (F) of the resist composition is, for example, 50% by mass or greater, preferably 70% by mass or greater, and more preferably 95% by mass or greater. In addition, the proportion thereof may be 100% by mass.

In a case where the content of the component (F1) is set to be greater than or equal to the lower limit of the above-described preferable range, the hydrophobicity of the resist film can be further improved. Further, in a case where the content thereof is set to be less than or equal to the upper limit of the above-described preferable range, the component (F1) and other components can be balanced, and the lithography characteristics are improved.

<Other Components>

The resist composition according to the present embodiment may further contain other components in addition to the component (A), the component (B1), and the component (F) described above. Examples of other components include a component (B2), a component (D), a component (E), and a component (S) described below.

<<Base Component (D)>>

The resist composition of the present embodiment may further contain, in addition to the component (A), a base component (component (D)) that traps an acid generated upon exposure (that is, controls diffusion of an acid). The component (D) functions as a quencher (an acid diffusion control agent) which traps an acid generated upon exposure in the resist composition.

Examples of the component (D) include a photodecomposable base (D1) (hereinafter, referred to as a "component (D1)") which is decomposed upon exposure and loses an acid diffusion controllability and a nitrogen-containing organic compound (D2) (hereinafter, referred to as a component (D2)") that does not correspond to the component (D1). Among these, the photodecomposable base (component (D1)) is preferable from the viewpoint of easily increasing the sensitivity, reducing the roughness, and improving the characteristic of suppressing occurrence of coating defects.

In regard to component (D1) In a case where a resist composition containing the component (D1) is obtained, the contrast between an exposed portion and an unexposed portion of the resist film can be further improved in a case of forming a resist pattern.

The component (D1) is not particularly limited as long as the component is decomposed upon exposure and loses an acid diffusion controllability, and one or more compounds selected from the group consisting of a compound represented by Formula (d1-1) (hereinafter, referred to as a "component (d1-1)"), a compound represented by Formula (d1-2) (hereinafter, referred to as a "component (d1-2)"), and a compound represented by Formula (d1-3) (hereinafter, referred to as a "component (d1-3)") are preferable.

Since the components (d1-1) to (d1-3) are decomposed and lose the acid diffusion controllability (basicity), the components (d1-1) to (d1-3) do not function as a quencher at the exposed portion of the resist film, but function as a quencher at the unexposed portion of the resist film.

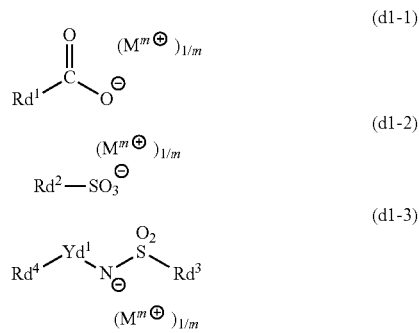

[In the formulae, $Rd^1$ to $Rd^4$ represent a cyclic group which may have a substituent, a chain-like alkyl group which may have a substituent, or a chain-like alkenyl group which may have a substituent. Here, the carbon atom adjacent to the S atom as $Rd^2$ in Formula (d1-2) has no fluorine atom bonded thereto. $Yd^1$ represents a single bond or a divalent linking group. m represents an integer of 1 or greater, and each $M^{m+}$ independently represents an m-valent organic cation.]

{Component (d1-1)}

Anion Moiety

In Formula (d1-1), $Rd^1$ represents a cyclic group which may have a substituent, a chain-like alkyl group which may have a substituent or a chain-like alkenyl group which may have a substituent, and examples thereof include the same groups as those for $R'^{201}$.

Among these, it is preferable that the group as $Rd^1$ represents an aromatic hydrocarbon group which may have a substituent, an aliphatic cyclic group which may have a substituent, and a chain-like alkyl group which may have a substituent. Examples of the substituent that may be included in these groups include a hydroxyl group, an oxo group, an alkyl group, an aryl group, a fluorine atom, a fluorinated alkyl group, a lactone-containing cyclic group represented by any of Formulae (a2-r-1) to (a2-r-7), an ether bond, an ester bond, and a combination thereof. In a case where an ether bond or an ester bond is included as the substituent, the substituent may be bonded through an alkylene group, and a linking group represented by any of Formulae (y-a1-1) to (y-a1-5) is preferable as the substituent.

Suitable examples of the aromatic hydrocarbon group include a phenyl group, a naphthyl group, and a polycyclic structure having a bicyclooctane skeleton (for example, a polycyclic structure formed of a bicyclooctane skeleton and a ring structure other than the bicyclooctane skeleton).

As the aliphatic cyclic group, a group in which one or more hydrogen atoms have been removed from a polycycloalkane such as adamantane, norbornane, isobornane, tricyclodecane or tetracyclododecane is more preferable.

It is preferable that the chain-like alkyl group has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, or a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain-like alkyl group is a fluorinated alkyl group having a fluorine atom or a fluorinated alkyl group as a substituent, the fluorinated alkyl group has preferably 1 to 11 carbon atoms, more preferably 1 to 8 carbon atoms, and still more preferably 1 to 4 carbon atoms. The fluorinated alkyl group may have an atom other than a fluorine atom. Examples of the atom other than a fluorine atom include an oxygen atom, a sulfur atom, and a nitrogen atom.

$Rd^1$ represents preferably a fluorinated alkyl group in which some or all hydrogen atoms constituting a linear alkyl group have been substituted with fluorine atoms and particularly preferably a fluorinated alkyl group in which all hydrogen atoms constituting a linear alkyl group have been substituted with fluorine atoms (a linear perfluoroalkyl group).

Specific preferred examples of the anion moiety in the component (d1-1) are described below.

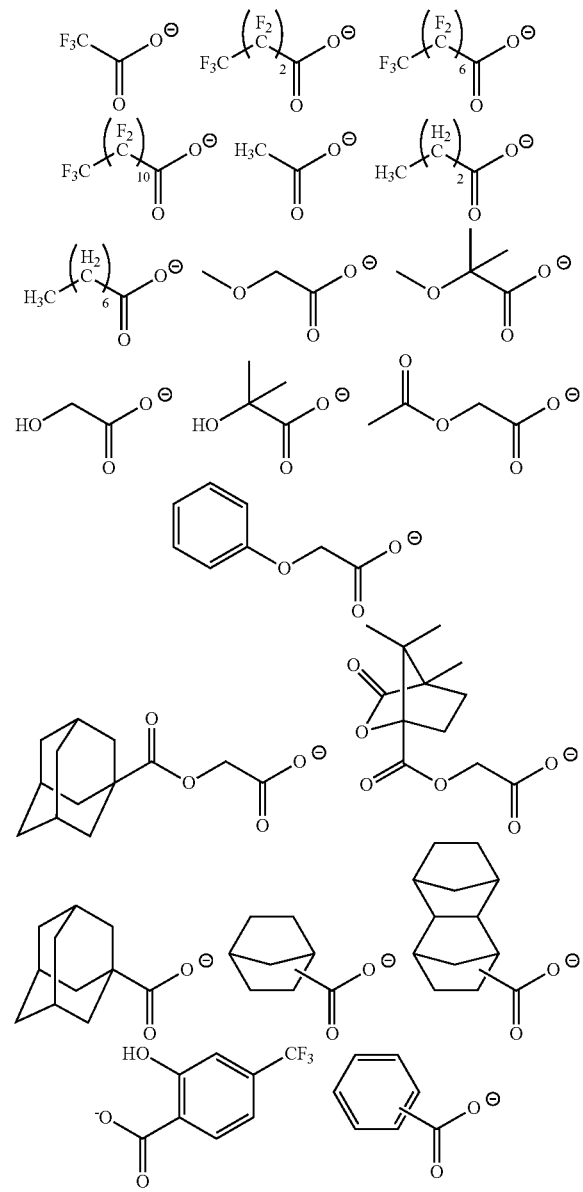

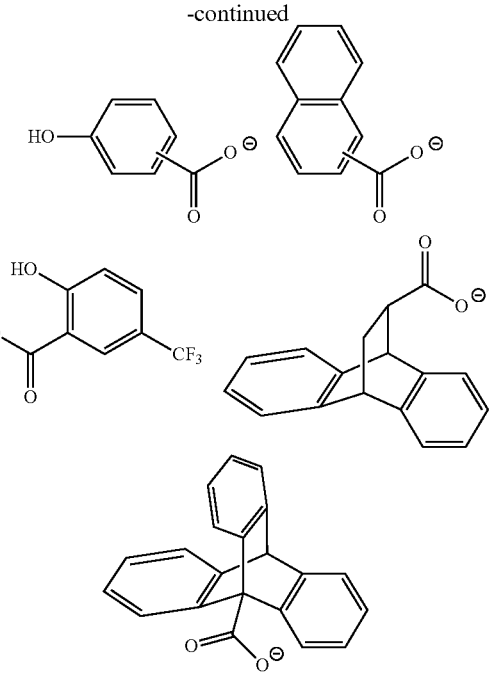

Cation Moiety

In Formula (d1-1), $M^{m+}$ represents an m-valent organic cation.

Examples of the organic cation as $M^{m+}$ include those for the cations represented by Formulae (ca-1) to (ca-4). Among these, the cation represented by Formula (ca-1) is more preferable, and the cations respectively represented by Formulae (ca-1-1) to (ca-1-70) are still more preferable.

The component (d1-1) may be used alone or in combination of two or more kinds thereof.

{Component (d1-2)}

Anion Moiety

In Formula (d1-2), $Rd^2$ represents a cyclic group which may have a substituent, a chain-like alkyl group which may have a substituent, or a chain-like alkenyl group which may have a substituent, and examples thereof include the same groups as those for $R'^{201}$.

Here, the carbon atom adjacent to the S atom in $Rd^2$ has no fluorine atom bonded thereto (the carbon atom is not substituted with a fluorine atom). In this manner, the anion of the component (d1-2) becomes an appropriately weak acid anion, thereby improving the quenching ability of the component (D).

It is preferable that $Rd^2$ represents a chain-like alkyl group which may have a substituent or an aliphatic cyclic group which may have a substituent. The chain-like alkyl group has preferably 1 to 10 carbon atoms and more preferably 3 to 10 carbon atoms. As the aliphatic cyclic group, a group in which one or more hydrogen atoms have been removed from adamantane, norbornane, isobornane, tricyclodecane, or tetracyclododecane (a group which may have a substituent); and a group in which one or more hydrogen atoms have been removed from camphor are more preferable.

The hydrocarbon group as $Rd^2$ may have a substituent, and examples of the substituent include the same groups as those for the substituent which may be included in the hydrocarbon group (such as an aromatic hydrocarbon group, an aliphatic cyclic group, or a chain-like alkyl group) as $Rd^1$ in Formula (d1-1).

Specific preferred examples of the anion moiety in the component (d1-2) are described below.

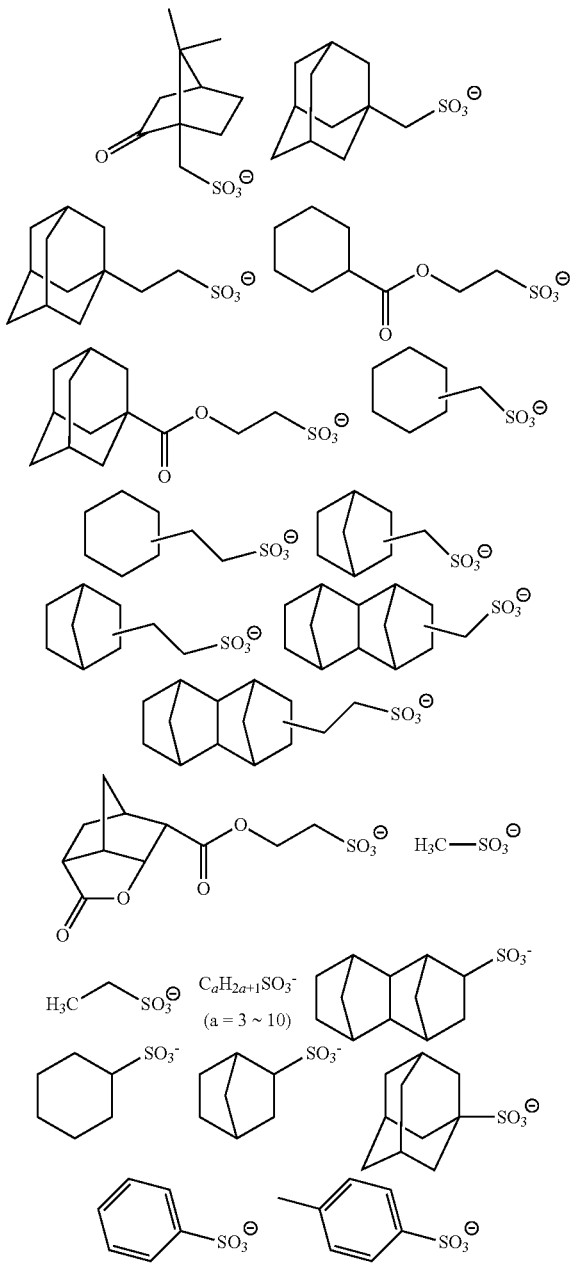

Cation Moiety

In Formula (d1-2), $M'^{m+}$ represents an m-valent organic cation and has the same definition as that for $M'^{m+}$ in Formula (d1-1).

The component (d1-2) may be used alone or in combination of two or more kinds thereof.

{Component (d1-3)}
Anion Moiety

In Formula (d1-3), $Rd^3$ represents a cyclic group which may have a substituent, a chain-like alkyl group which may have a substituent, or a chain-like alkenyl group which may have a substituent, and examples thereof include the same groups as those for $R'^{201}$. Among these, a cyclic group having a fluorine atom, a chain-like alkyl group, or a chain-like alkenyl group is preferable. Among these, a fluorinated alkyl group is preferable, and the same groups as those for the fluorinated alkyl group represented by $Rd^1$ are more preferable.

In Formula (d1-3), $Rd^4$ represents a cyclic group which may have a substituent, a chain-like alkyl group which may have a substituent, or a chain-like alkenyl group which may have a substituent, and examples thereof include the same groups as those for $R'^{201}$.

Among these, an alkyl group which may have a substituent, an alkoxy group which may have a substituent, an alkenyl group which may have a substituent, or a cyclic group which may have a substituent is preferable.

It is preferable that the alkyl group as $Rd^4$ is a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. Some hydrogen atoms in the alkyl group as $Rd^4$ may be substituted with a hydroxyl group, a cyano group, or the like.

It is preferable that the alkoxy group as $Rd^4$ is an alkoxy group having 1 to 5 carbon atoms, and specific examples of the alkoxy group having 1 to 5 carbon atoms include a methoxy group, an ethoxy group, an n-propoxy group, an iso-propoxy group, an n-butoxy group, and a tert-butoxy group. Among these, a methoxy group and an ethoxy group are preferable.

Examples of the alkenyl group as $Rd^4$ include the same groups as those for the alkenyl group as $R'^{201}$. Among these, a vinyl group, a propenyl group (an allyl group), a 1-methylpropenyl group, and a 2-methylpropenyl group are preferable. These groups may have an alkyl group having 1 to 5 carbon atoms or a halogenated alkyl group having 1 to 5 carbon atoms as a substituent.

Examples of the cyclic group as $Rd^4$ include the same groups as those for the cyclic group as $R'^{201}$. Among these, an alicyclic group in which one or more hydrogen atoms have been removed from a cycloalkane such as cyclopentane, cyclohexane, adamantane, norbornane, isobornane, tricyclodecane or tetracyclododecane or an aromatic group such as a phenyl group or a naphthyl group is preferable. In a case where $Rd^4$ represents an alicyclic group, the resist composition is satisfactorily dissolved in an organic solvent so that the lithography characteristics are improved. Further, in a case where $Rd^4$ represents an aromatic group, the resist composition has excellent light absorption efficiency in lithography using EUV or the like as an exposure light source, and thus the sensitivity and lithography characteristics are improved.

In Formula (d1-3), $Yd^1$ represents a single bond or a divalent linking group. The divalent linking group as $Yd^1$ is not particularly limited, and examples thereof include a divalent hydrocarbon group (an aliphatic hydrocarbon group or an aromatic hydrocarbon group) which may have a substituent and a divalent linking group having a hetero atom. These divalent linking groups are the same as those for the divalent hydrocarbon group which may have a substituent and the divalent linking group having a hetero atom described in the section of the divalent linking group as $Ya^{21}$ in Formula (a2-1).

It is preferable that $Yd^1$ represents a carbonyl group, an ester bond, an amide bond, an alkylene group, or a combination of these. As the alkylene group, a linear or branched alkylene group is more preferable, and a methylene group or an ethylene group is still more preferable.

Specific preferred examples of the anion moiety in the component (d1-3) are described below.
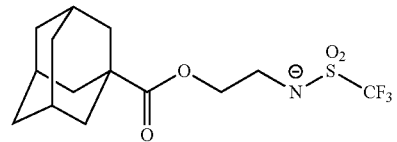
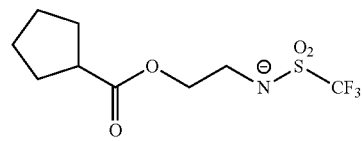
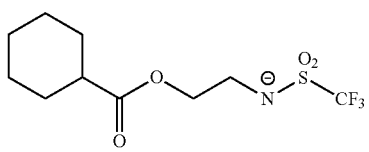
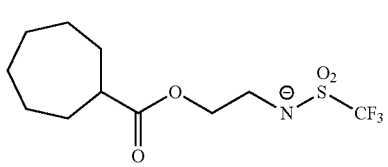
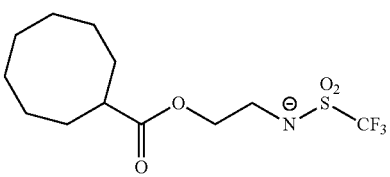
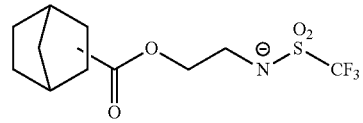
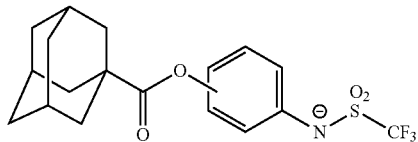
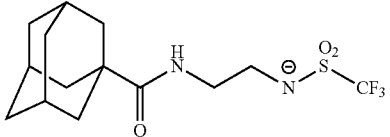
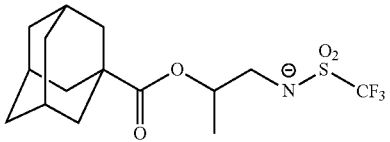
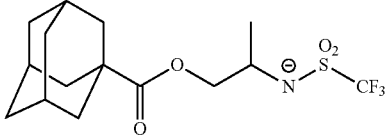
-continued
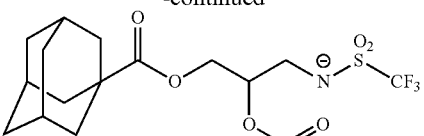
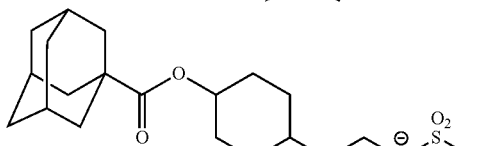
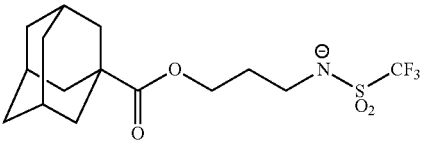
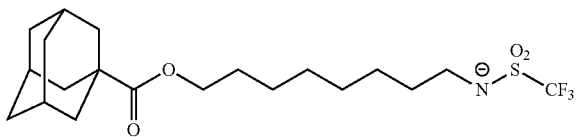
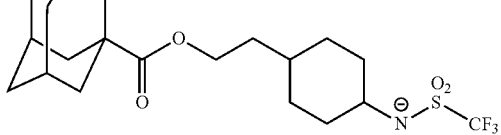
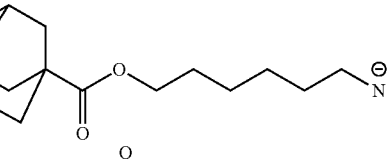
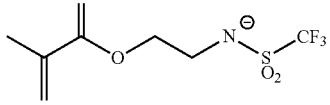
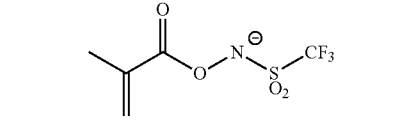
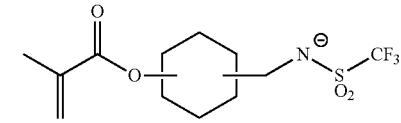
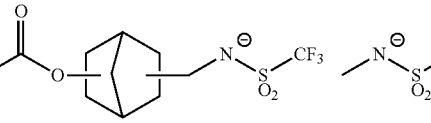
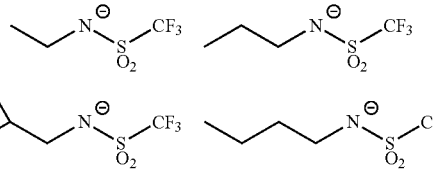

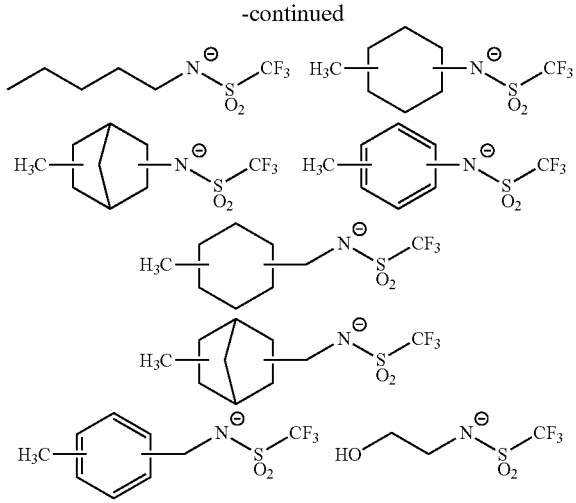

Cation Moiety

In Formula (d1-3), $M^{m+}$ represents an m-valent organic cation and has the same definition as that for $M'^{m+}$ in Formula (d1-1).

The component (d1-3) may be used alone or in combination of two or more kinds thereof.

As the component (D1), only one of the above-described components (d1-1) to (d1-3) or a combination of two or more kinds thereof may be used.

In a case where the resist composition contains the component (D1), the content of the component (D1) in the resist composition is preferably in a range of 0.5 to 20 parts by mass, more preferably in a range of 1 to 15 parts by mass, and still more preferably in a range of 5 to 12 parts by mass with respect to 100 parts by mass of the component (A). In a case where the content of the component (D1) is greater than or equal to the lower limit of the above-described range, particularly excellent lithography characteristics and an excellent resist pattern shape are easily obtained. On the contrary, in a case where the content is less than or equal to the upper limit of the above-described range, the sensitivity can be satisfactorily maintained and the throughput is also excellent.

Method of Producing Component (D1):

The methods of producing the component (d1-1) and the component (d1-2) are not particularly limited, and these components can be produced according to known methods.

Further, the method of producing the component (d1-3) is not particularly limited, and the component (d1-3) can be produced according to the same method as disclosed in United States Patent Application, Publication No. 2012-0149916.

In regard to component (D2)

The component (D) may contain a nitrogen-containing organic compound component (hereinafter, referred to as a "(D2) component") that does not correspond to the component (D1) described above.

The component (D2) is not particularly limited as long as the component functions as an acid diffusion control agent and does not correspond to the component (D1), and an optional component may be selected from known components and then used. Among the examples, an aliphatic amine is preferred, and particularly a secondary aliphatic amine and a tertiary aliphatic amine are more preferred.

The aliphatic amine is an amine containing one or more aliphatic groups, and the number of carbon atoms in the aliphatic group is preferably in a range of 1 to 12.

Examples of these aliphatic amines include amines in which at least one hydrogen atom of ammonia ($NH_3$) has been substituted with an alkyl group or hydroxyalkyl group having 12 or less carbon atoms (alkylamines or alkylalcoholamines), and cyclic amines.

Specific examples of the alkylamines and the alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, a trialkylamine of 5 to 10 carbon atoms is preferable, and tri-n-pentylamine and tri-n-octylamine are particularly preferable.

Examples of the cyclic amine include a heterocyclic compound having a nitrogen atom as a hetero atom. The heterocyclic compound may be a monocyclic compound (aliphatic monocyclic amine) or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-[2-(2-hydroxyethoxy)ethoxy]ethyl]amine, and triethanolamine triacetate. Among these, triethanolamine triacetate is preferable.

As the component (D2), an aromatic amine may be used.

Examples of the aromatic amine include 4-dimethylaminopyridine, pyrrole, indole, pyrazole, imidazole, and derivatives thereof, tribenzylamine, 2,6-diisopropylaniline, and N-tert-butoxycarbonylpyrrolidine.

The component (D2) may be used alone or in combination of two or more kinds thereof.

In a case where the resist composition contains the component (D2), the content of the component (D2) in the resist composition is typically in a range of 0.01 to 5 parts by mass with respect to 100 parts by mass of the component (A). In a case where the content thereof is set to be in the above-described range, the resist pattern shape, the post exposure temporal stability, and the like are improved.

<<At Least One Compound (E) Selected from Group Consisting of Organic Carboxylic Acids, Phosphorus Oxo Acids, and Derivatives Thereof>>

For the purpose of preventing deterioration in sensitivity and improving the resist pattern shape and the post exposure temporal stability, the resist composition of the present embodiment may contain, as optional components, at least one compound (E) (hereinafter referred to as the component (E)) selected from the group consisting of organic carboxylic acids, phosphorus oxo acids, and derivatives thereof.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid, and phosphinic acid. Among these, phosphonic acid is particularly preferable.

Examples of the phosphorus oxo acid derivatives include esters in which a hydrogen atom in the above-described oxo acids is substituted with a hydrocarbon group. Examples of the hydrocarbon group include an alkyl group having 1 to 5 carbon atoms and an aryl group having 6 to 15 carbon atoms.

Examples of the phosphoric acid derivatives include phosphoric acid esters such as di-n-butyl phosphate and diphenyl phosphate.

Examples of the phosphonic acid derivatives include phosphonic acid esters such as dimethyl phosphonate, di-n-butyl phosphonate, phenylphosphonic acid, diphenyl phosphonate, and dibenzyl phosphonate.

Examples of the phosphinic acid derivatives include phosphinic acid ester and phenylphosphinic acid.

In the resist composition of the present embodiment, the component (E) may be used alone or in combination of two or more kinds thereof.

In a case where the resist composition contains the component (E), the content of the component (E) is typically in a range of 0.01 to 5 parts by mass with respect to 100 parts by mass of the component (A).

<<Organic Solvent Component (S)>>

The resist composition of the present embodiment can be produced by dissolving the resist materials in an organic solvent component (hereinafter, referred to as a "component (S)").

The component (S) may be any organic solvent which can dissolve the respective components to be used to obtain a uniform solution, and an optional organic solvent can be appropriately selected from those which have been known as solvents of a chemically amplified resist composition and then used.

Examples of the component (S) include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol, and dipropylene glycol; compounds having an ester bond, such as ethylene glycol monoacetate, diethylene glycol monoacetate, propylene glycol monoacetate, and dipropylene glycol monoacetate; polyhydric alcohol derivatives of compounds having an ether bond such as monoalkyl ether or monophenyl ether, such as monomethylether, monoethylether, monopropylether, or monobutylether of polyhydric alcohols or compounds having an ester bond [among these, propylene glycol monomethyl ether acetate (PGMEA) and propylene glycol monomethyl ether (PGME) are preferable]; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene, and mesitylene; and dimethylsulfoxide (DMSO).

In the resist composition of the present embodiment, the component (S) may be used alone or in the form of a mixed solvent of two or more kinds thereof. Among these, PGMEA, PGME, γ-butyrolactone, EL, or cyclohexanone is preferable.

Further, a mixed solvent obtained by mixing PGMEA with a polar solvent is also preferable as the component (S). The blending ratio (mass ratio) of the mixed solvent can be appropriately determined in consideration of the compatibility between PGMEA and the polar solvent, but is preferably in the range of 1:9 to 9:1 and more preferably in a range of 2:8 to 8:2.

More specifically, in a case where EL or cyclohexanone is blended as the polar solvent, the mass ratio of PGMEA to EL or cyclohexanone is preferably in a range of 1:9 to 9:1 and more preferably in a range of 2:8 to 8:2. Further, in a case where PGME is blended as the polar solvent, the mass ratio of PGMEA to PGME is preferably in a range of 1:9 to 9:1, more preferably in a range of 2:8 to 8:2, and still more preferably in a range of 3:7 to 7:3. Further, a mixed solvent of PGMEA, PGME, and cyclohexanone is also preferable.

Further, a mixed solvent of γ-butyrolactone and at least one selected from PGMEA and EL is also preferable as the component (S). In this case, as the mixing ratio, the mass ratio between the former and the latter is preferably in a range of 70:30 to 95:5.

The amount of the component (S) to be used is not particularly limited and is appropriately set to have a concentration which enables coating a substrate or the like depending on the thickness of the coated film. The component (S) is typically used in an amount such that the solid content concentration of the resist composition is set to be in a range of 0.1% to 20% by mass and preferably in a range of 0.2% to 15% by mass.

As desired, miscible additives such as additive resins, dissolution inhibitors, plasticizers, stabilizers, colorants, halation prevention agents, and dyes for improving the performance of the resist film can be added to the resist composition of the present embodiment, as appropriate.

After the resist material is dissolved in the component (S), impurities may be removed from the resist composition of the present embodiment using a porous polyimide film, a porous polyamideimide film, or the like. For example, the resist composition may be filtered using a filter formed of a porous polyimide film, a filter formed of a porous polyamideimide film, a filter formed of a porous polyimide film and a porous polyamideimide film, or the like. Examples of the porous polyimide film and the porous polyamideimide film include those described in Japanese Unexamined Patent Application, First Publication No. 2016-155121.

The resist composition of the present embodiment described above contains a base material component (A) whose solubility in a developing solution is changed by the action of an acid, an acid generator component (B) that generates an acid upon exposure, and a fluorine additive component (F). The component (B) contains a compound (B1) having an anion moiety with a specific number of fluorine atoms. Since the component (B1) has a specific number of fluorine atoms, the component (B1) has a high acidity, the pattern formation can be sufficiently performed, and the surface segregation effect of the component (F) is not impaired.

The fluorine additive component (F) includes a fluororesin component (F1) that has a constitutional unit (f1) having a fluorine atom and a constitutional unit (f2) having a polycyclic aliphatic cyclic group. The hydrophobicity of the resist film can be further improved by using the constitutional unit (f1) having a surface segregation effect and the constitutional unit (f2) having high hydrophobicity in combination. Therefore, it is assumed that the resist composition of the present embodiment enables an increase of the hydrophobicity of the resist film and improvement of the lithography characteristics by using the component (B) and the component (F) in combination.

In the resist film formed by using the resist composition of the present embodiment, the hydrophobicity of the resist film is improved by using the component (F) as compared with a case of using a resist composition of the related art so that the water contact angle with respect to water, for example, the static contact angle (an angle between the surface of a water droplet on a resist film in a horizontal state and the surface of the resist film), the dynamic contact angle (a contact angle at which a water droplet starts to fall down in a case where the resist film is gradually inclined, the dynamic contact angle is divided into a contact angle (advancing angle) at an end point of a water droplet in the front falling direction and a contact angle (reversing angle) at an end point of the water droplet in the rear falling direction), and the falling angle (the inclination angle of the resist film at which a water droplet starts to fall down in a case where the resist film is gradually inclined) are changed. For example, as the hydrophobicity of the resist film increases, the static contact angle and the dynamic contact angle increase while the falling angle decreases.

FIG. 1 is a view for describing an advancing angle ($\theta_1$), a reversing angle ($\theta_2$), and a falling angle ($\theta_3$).

Here, as shown in FIG. 1, the advancing angle is an angle $\theta_1$ between a plane 2 and the surface of a water droplet at a lower end 1a of a water droplet 1 at which the water droplet 1 starts to move (fall down) on the plane 2 in a case where the plane 2 on which the water droplet 1 has been placed is gradually inclined.

At this time (at the time of the water droplet 1 starting to move (fall down) on the plane 2), an angle $\theta_2$ between the plane 2 and the surface of the water droplet at the upper end 1b of the water droplet 1 is the reversing angle, and an inclination angle $\theta_3$ of the plane 2 is the falling angle.

In the present specification, the static contact angle, the dynamic contact angle, and the falling angle can be measured, for example, in the following manner.

First, a silicon substrate is spin-coated with a resist composition solution, and heated under predetermined conditions of a temperature of 110° C. to 115° C. for 60 seconds to form a resist film.

Next, the measurement can be performed on the resist film using commercially available measuring devices such as DROP MASTER-700 (product name, manufactured by Kyowa Interface Science, Inc.), AUTO SLIDING ANGLE: SA-30DM (product name, manufactured by Kyowa Interface Science, Inc.), and AUTO DISPENSER: AD-31 (product name, manufactured by Kyowa Interface Science, Inc.).

The measured value of the dynamic contact angle (reversing angle) obtained by coating an 8-inch silicon wafer which has been subjected to a hexamethyldisilazane (HMDS) treatment with the resist composition of the present embodiment using a spinner, prebaking the wafer on a hot plate at 110° C. for 60 seconds, and drying the resist composition to prepare a resist film having a film thickness of 100 nm is preferably 80° or greater. In a case where the measured value of the static contact angle is 80° or greater, the hydrophobicity of the resist film is sufficient, and the lithography characteristics are further excellent. Further, in the liquid immersion exposure, an increase in scanning speed can be achieved. Further, the effect of suppressing substance elution is also improved.

(Method of Forming Resist Pattern)

A method of forming a resist pattern according to a second embodiment of the present invention includes a step (i) of forming a resist film on a support using the resist composition; a step (ii) of exposing the resist film; and a step (iii) of developing the exposed resist film to form a resist pattern.

According to the embodiment of the method of forming a resist pattern, a method of forming a resist pattern by performing processes as described below is exemplified.

Step (i):

First, a support is coated with the resist composition of the according to the embodiment using a spinner or the like, and a bake treatment (post applied bake (PAB)) is performed under a temperature condition of 80° C. to 150° C. for 40 to 120 seconds and preferably 60 to 90 seconds to form a resist film.

Step (ii):

Next, the resist film is selectively exposed by performing exposure through a mask (mask pattern) on which a predetermined pattern has been formed or performing drawing by direct irradiation with electron beams without a mask pattern using an ArF exposure device, an electron beam drawing device, or an EUV exposure device, and a bake (post exposure bake (PEB)) treatment is performed under a temperature condition of 80° C. to 150° C. for 40 to 120 seconds and preferably 60 to 90 seconds.

Step (iii):

Next, the resist film is subjected to a developing treatment. The developing treatment is conducted using an alkali developing solution in a case of an alkali developing process and using a developing solution containing an organic solvent (organic developing solution) in a case of a solvent developing process.

After the developing treatment, it is preferable to conduct a rinse treatment. As the rinse treatment, water rinsing using pure water is preferable in a case of the alkali developing process, and rinsing using a rinse solution containing an organic solvent is preferable in a case of the solvent developing process.

In a case of the solvent developing process, after the developing treatment or the rinse treatment, the developing solution or the rinse solution attached onto the pattern may be removed by a treatment using a supercritical fluid.

After the developing treatment or the rinse treatment, drying is conducted. As desired, a bake treatment (post bake) may be conducted after the developing treatment.

In this manner, a resist pattern can be formed.

The support is not particularly limited and a known support of the related art can be used, and examples thereof include a substrate for an electronic component and a substrate on which a predetermined wiring pattern has been formed. Specific examples thereof include a metal substrate such as a silicon wafer, copper, chromium, iron, or aluminum; and a glass substrate. As the materials of the wiring pattern, copper, aluminum, nickel, or gold can be used.

Further, as the support, any support described above, on which an inorganic and/or organic film has been formed may be employed. As the inorganic film, an inorganic antireflection film (inorganic BARC) can be used. As the organic film, an organic film such as an organic antireflection film (organic BARC) or a lower-layer organic film used in a multilayer resist method can be used.

Here, the multilayer resist method is a method of providing at least one layer of an organic film (lower-layer organic film) and at least one layer of a resist film (upper-layer resist film) on a substrate and performing patterning of the lower-layer organic film using a resist pattern formed on the upper-layer resist film as a mask, and this method is considered to enable formation of a pattern with a high aspect ratio. That is, according to the multilayer resist method, since a desired thickness can be ensured by the lower-layer organic film, the thickness of the resist film can be reduced, and a fine pattern with a high aspect ratio can be formed.

The multilayer resist method is classified into a method in which a double-layer structure consisting of an upper-layer resist film and a lower-layer organic film is formed (two-layer resist method), and a method in which a multilayer structure having at least three layers consisting of an upper-layer resist film, a lower-layer organic film, and at least one intermediate layer (thin metal film or the like) provided between the upper-layer resist film and the lower-layer organic film (three-layer resist method).

The wavelength to be used for exposure is not particularly limited and the exposure can be conducted using radiation such as an ArF excimer laser, a KrF excimer laser, an $F_2$ excimer laser, extreme ultraviolet (EUV) rays, vacuum ultraviolet rays (VUV), electron beams (EB), X-rays, and soft X-rays. The resist composition is useful for a KrF excimer laser, an ArF excimer laser, EB, and EUV and more useful for an ArF excimer laser, EB, and EUV.

The liquid immersion exposure is an exposure method in which the region between the resist film and the lens at the lowermost position of the exposure device is filled with a solvent (liquid immersion medium) in advance that has a larger refractive index than the refractive index of air, and the exposure (immersion exposure) is conducted in this state.

As the liquid immersion medium, a solvent which has a refractive index larger than the refractive index of air but smaller than the refractive index of the resist film to be exposed is preferable. The refractive index of such a medium is not particularly limited as long as the refractive index is in the above-described range.

Examples of the solvent which has a refractive index that is larger than the refractive index of air but smaller than the refractive index of the resist film include water, a fluorine-based inert liquid, a silicon-based solvent, and a hydrocarbon-based solvent.

Specific examples of the fluorine-based inert liquid include a liquid containing a fluorine-based compound such as $C_3HCl_2F_5$, $C_4F_9OCH_3$, $C_4F_9OC_2H_5$, or $C_5H_3F_7$ as a main component, and a liquid with a boiling point of 70° C. to 180° C. is preferable and a liquid with a boiling point of 80° C. to 160° C. is more preferable. A fluorine-based inert liquid having a boiling point in the above-described range is preferable from the viewpoint that a medium used for liquid immersion can be removed using a simple method after completion of exposure.

As the fluorine-based inert liquid, a perfluoroalkyl compound in which all hydrogen atoms in the alkyl group have been substituted with fluorine atoms is particularly preferable. Specific examples of the perfluoroalkyl compound include a perfluoroalkylether compound and a perfluoroalkylamine compound.

Further, specific examples of the perfluoroalkylether compound include perfluoro(2-butyl-tetrahydrofuran) (boiling point of 102° C.), and specific examples of the perfluoroalkylamine compound include perfluorotributylamine (boiling point of 174° C.).

As the liquid immersion medium, water is preferable from the viewpoints of the cost, the safety, the environmental issues, and the versatility.

As the alkali developing solution used for the developing treatment in the alkali developing process, a 0.1 to 10 mass % tetramethylammonium hydroxide (TMAH) aqueous solution is exemplified.

The organic solvent contained in the organic developing solution used for the developing treatment in the solvent developing process may be any solvent that is capable of dissolving the component (A) (the component (A) before exposure) and can be appropriately selected from known organic solvents. Specific examples thereof include a polar solvent such as a ketone-based solvent, an ester-based solvent, an alcohol-based solvent, a nitrile-based solvent, an amide-based solvent, and an ether-based solvent, and a hydrocarbon solvent.

The ketone-based solvent is an organic solvent containing C—C(=O)—C in the structure thereof. The ester-based solvent is an organic solvent containing C—C(=O)—O—C in the structure thereof. The alcohol-based solvent is an organic solvent containing an alcoholic hydroxyl group in the structure thereof. The "alcoholic hydroxyl group" indicates a hydroxyl group bonded to a carbon atom of an aliphatic hydrocarbon group. The nitrile-based solvent is an organic solvent containing a nitrile group in the structure thereof. The amide-based solvent is an organic solvent containing an amide group in the structure thereof. The ether-based solvent is an organic solvent containing C—O—C in the structure thereof.

Some organic solvents have a plurality of the functional groups which characterize each of the solvents in the structure thereof. In such a case, the organic solvents are considered to correspond to all the solvents containing the functional groups. For example, diethylene glycol monomethylether corresponds to both the alcohol-based solvent and the ether-based solvent which have been classified above.

The hydrocarbon-based solvent is a hydrocarbon solvent which is formed of a hydrocarbon that may be halogenated and does not have a substituent other than halogen atoms. Examples of the halogen atom include a fluorine atom, a chlorine atom, a bromine atom, and an iodine atom. Among these, a fluorine atom is preferable.

Among the examples, as the organic solvent contained in the organic developing solution, a polar solvent is preferable. Further, a ketone solvent, an ester solvent, and a nitrile solvent are preferable.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone, and methyl amyl ketone (2-heptanone). Among these examples, methyl amyl ketone (2-heptanone) is preferable as the ketone-based solvent.

Examples of the ester-based solvent include methyl acetate, butyl acetate, ethyl acetate, isopropyl acetate, amyl acetate, isoamyl acetate, ethyl methoxyacetate, ethyl ethoxyacetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these examples, butyl acetate is preferable as the ester-based solvent.

Examples of the nitrile-based solvent include acetonitrile, propionitrile, valeronitrile, and butyronitrile.

Known additives can be blended into the organic developing solution as desired. Examples of the additive include a surfactant. The surfactant is not particularly limited, and for example, an ionic or non-ionic fluorine-based and/or silicon-based surfactant can be used. As the surfactant, a non-ionic surfactant is preferable, and a non-ionic fluorine-based surfactant or a non-ionic silicon-based surfactant is more preferable.

In a case where a surfactant is blended into the solution, the amount of the surfactant to be blended is typically in a range of 0.001% to 5% by mass, preferably in a range of 0.005% to 2% by mass, and more preferably in a range of 0.01% to 0.5% by mass with respect to the total amount of the organic developing solution.

The developing treatment can be performed according to a known developing method, and examples thereof include a method of immersing a support in a developing solution for a certain time (a dip method), a method of raising a developing solution on the surface of a support using the surface tension and maintaining the state for a certain time (a puddle method), a method of spraying a developing solution to the surface of a support (spray method), and a method of continuously ejecting a developing solution onto a support rotating at a certain rate while scanning a developing solution ejection nozzle at a certain rate (dynamic dispense method).

As the organic solvent contained in the rinse solution used for the rinse treatment after the developing treatment in the solvent developing process, a solvent that is unlikely to dissolve a resist pattern can be appropriately selected from the organic solvents exemplified as the organic solvent used in the organic developing solution and then used. Typically, at least one solvent selected from a hydrocarbon-based solvent, a ketone-based solvent, an ester-based solvent, an alcohol-based solvent, an amide-based solvent, and an ether-based solvent is used. Among these, at least one solvent selected from a hydrocarbon-based solvent, a ketone-based solvent, an ester-based solvent, an alcohol-based solvent, and an amide-based solvent is preferable, at least one solvent selected from an alcohol-based solvent and an ester-based solvent is more preferable, and an alcohol-based solvent is particularly preferable.

As the alcohol-based solvent used in the rinse solution, a monohydric alcohol having 6 to 8 carbon atoms is preferable, and the monohydric alcohol may be linear, branched, or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol, and 2-hexanol are preferable, and 1-hexanol and 2-hexanol are more preferable.

These organic solvents may be used alone or in combination of two or more kinds thereof. Further, an organic solvent other than the above-described solvents and water may be mixed and used. Here, in consideration of the development characteristics, the amount of water to be blended into the rinse solution is preferably 30% by mass or less, more preferably 10% by mass or less, still more preferably 5% by mass or less, and particularly preferably 3% by mass or less with respect to the total amount of the rinse solution.

A known additive can be blended into the rinse solution as necessary. Examples of the additive include a surfactant. As the surfactant, the same surfactants as those described above can be exemplified. Among these, a non-ionic surfactant is preferable, and a non-ionic fluorine-based surfactant or a non-ionic silicon-based surfactant is more preferable.

In a case where a surfactant is blended into the solution, the amount of the surfactant to be blended is typically in a range of 0.001% to 5% by mass, preferably in a range of 0.005% to 2% by mass, and more preferably in a range of 0.01% to 0.5% by mass with respect to the total amount of the rinse solution.

The rinse treatment carried out using a rinse solution (washing treatment) can be performed according to a known rinse method. Examples of the method of performing the rinse treatment include a method of continuously ejecting a rinse solution onto a support rotating at a certain rate (rotary coating method), a method of immersing a support in a rinse solution for a certain time (dip method), and a method of spraying a rinse solution to the surface of a support (spray method).

According to the method of forming a resist pattern of the present embodiment described above, since the resist composition according to the first embodiment described above is used, lithography characteristics are improved, and a resist pattern having an excellent shape can be formed.

In the step (ii), the method of exposing the resist film may be typical exposure (dry exposure) performed in inert gas such as air or nitrogen or liquid immersion exposure (liquid immersion lithography). The method of forming a resist pattern according to the present embodiment is a particularly useful method in a case where the resist film is subjected to liquid immersion exposure.

EXAMPLES

Hereinafter, the present invention will be described in more detail based on examples, but the present invention is not limited to these examples.

<Preparation of Resist Composition>

Examples 1 to 19 and Comparative Examples 1 to 4

Respective components listed in Tables 1 to 3 were mixed and dissolved to prepare each resist composition (solid content concentration of 3% by mass) of each example.

TABLE 1

| | Component (A) | Component (B1) | Component (D) | Component (F) | Component (S) |
| --- | --- | --- | --- | --- | --- |
| Example 1 | (A)-1 [100] | (B1)-1 [8.0] | (D)-1 [6.0] | (F1)-1 [3.0] | (S)-1 [4000] |
| Example 2 | (A)-1 [100] | (B1)-2 [8.0] | (D)-1 [6.0] | (F1)-1 [3.0] | (S)-1 [4000] |
| Example 3 | (A)-1 [100] | (B1)-3 [8.0] | (D)-1 [6.0] | (F1)-1 [3.0] | (S)-1 [4000] |

TABLE 1-continued

| | Component (A) | Component (B1) | Component (D) | Component (F) | Component (S) |
|---|---|---|---|---|---|
| Example 4 | (A)-1 [100] | (B1)-4 [8.0] | (D)-1 [6.0] | (F1)-1 [3.0] | (S)-1 [4000] |
| Example 5 | (A)-1 [100] | (B1)-5 [8.0] | (D)-1 [6.0] | (F1)-1 [3.0] | (S)-1 [4000] |
| Example 6 | (A)-1 [100] | (B1)-6 [8.0] | (D)-1 [6.0] | (F1)-1 [3.0] | (S)-1 [4000] |
| Example 7 | (A)-1 [100] | (B1)-1 [8.0] | (D)-2 [6.0] | (F1)-2 [3.0] | (S)-1 [4000] |
| Example 8 | (A)-1 [100] | (B1)-1 [8.0] | (D)-3 [6.0] | (F1)-2 [3.0] | (S)-1 [4000] |
| Example 9 | (A)-1 [100] | (B1)-1 [8.0] | (D)-3 [10] | (F1)-2 [3.0] | (S)-1 [4000] |

TABLE 2

| | Component (A) | Component (B1) | Component (D) | | Component (F) | Component (S) |
|---|---|---|---|---|---|---|
| Example 10 | (A)-1 [100] | (B1)-1 [8.0] | (D)-2 [4.0] | (D)-4 [6.0] | (F1)-2 [3.0] | (S)-1 [4000] |
| Example 11 | (A)-1 [100] | (B1)-1 [8.0] | (D)-4 [6.0] | (D)-5 [4.0] | (F1)-2 [3.0] | (S)-1 [4000] |
| Example 12 | (A)-1 [100] | (B1)-1 [8.0] | (D)-1 [6.0] | | (F1)-3 [3.0] | (S)-1 [4000] |
| Example 13 | (A)-1 [100] | (B1)-1 [8.0] | (D)-1 [6.0] | | (F1)-4 [3.0] | (S)-1 [4000] |
| Example 14 | (A)-1 [100] | (B1)-1 [8.0] | (D)-1 [6.0] | | (F1)-5 [3.0] | (S)-1 [4000] |
| Example 15 | (A)-1 [100] | (B1)-1 [8.0] | (D)-1 [6.0] | | (F1)-6 [3.0] | (S)-1 [4000] |
| Example 16 | (A)-2 [100] | (B1)-1 [8.0] | (D)-1 [6.0] | | (F1)-1 [3.0] | (S)-1 [4000] |
| Example 17 | (A)-2 [100] | (B1)-2 [8.0] | (D)-1 [6.0] | | (F1)-1 [3.0] | (S)-1 [4000] |
| Example 18 | (A)-3 [100] | (B1)-1 [8.0] | (D)-1 [6.0] | | (F1)-1 [3.0] | (S)-1 [4000] |
| Example 19 | (A)-3 [100] | (B1)-2 [8.0] | (D)-1 [6.0] | | (F1)-1 [3.0] | (S)-1 [4000] |

TABLE 3

| | Component (A) | Component (B) | | Component (D) | Component (F) | Component (S) |
|---|---|---|---|---|---|---|
| | | Component (B1) | Component (B2) | | | |
| Comparative Example 1 | (A)-1 [100] | — | (B2)-1 [8.0] | (D)-1 [6.0] | (F1)-1 [3.0] | (S)-1 [4000] |
| Comparative Example 2 | (a)-1 [100] | — | (B2)-2 [8.0] | (D)-1 [6.0] | (F1)-1 [3.0] | (S)-1 [4000] |
| Comparative Example 3 | (a)-1 [100] | — | (B2)-3 [8.0] | (D)-1 [6.0] | (F1)-1 [3.0] | (S)-1 [4000] |
| Comparative Example 4 | (a)-1 [100] | (B1)-2 [8.0] | — | (D)-1 [6.0] | (F2)-1 [3.0] | (S)-1 [4000] |

In Tables 1 to 3, each abbreviation has the following meaning. The numerical values in the parentheses are blending amounts (parts by mass).

(A)-1: A polymer compound represented by Chemical Formula (A1-1). The weight-average molecular weight (Mw) in terms of standard polystyrene which had been acquired by GPC measurement was 10000 and the molecular weight dispersity (Mw/Mn) was 1.50. The copolymer compositional ratio (1/m) (the proportion (molar ratio) between constitutional units in the structural formula) acquired by $^{13}$C-NMR was 50/50.

(A)-2: A polymer compound represented by Chemical Formula (A1-2). The weight-average molecular weight (Mw) in terms of standard polystyrene which had been acquired by GPC measurement was 10000 and the molecular weight dispersity (Mw/Mn) was 1.60. The copolymer compositional ratio (1/m) (the proportion (molar ratio) between constitutional units in the structural formula) acquired by $^{13}$C-NMR was 50/50.

(A)-3: A polymer compound represented by Chemical Formula (A1-3). The weight-average molecular weight (Mw) in terms of standard polystyrene which had been acquired by GPC measurement was 10000 and the molecular weight dispersity (Mw/Mn) was 1.60. The copolymer compositional ratio (1/m) (the proportion (molar ratio) between constitutional units in the structural formula) acquired by $^{13}$C-NMR was 50/50.

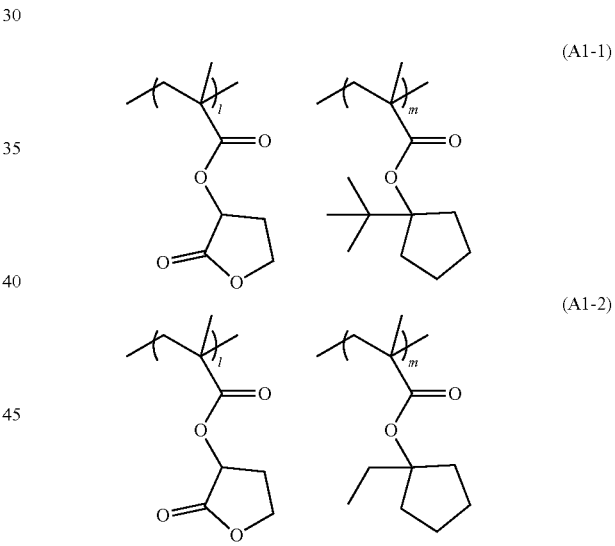

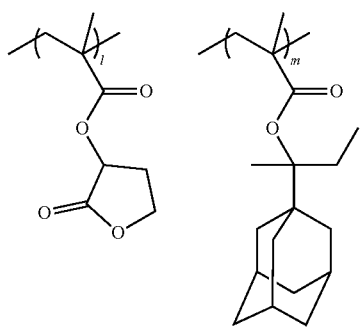
(A1-3)
(B1)-1 to (B1)-6: acid generators formed of compounds represented by Chemical Formulae (B1-1) to (B1-6).
(B2)-1: an acid generator formed of a compound represented by Chemical Formula (B2-1).
(B2)-2: an acid generator formed of a compound represented by Chemical Formula (B2-2).
(B2)-3: an acid generator formed of a compound represented by Chemical Formula (B2-3).
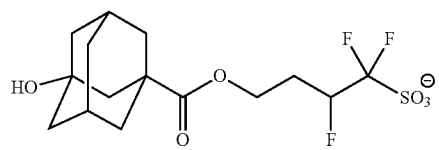
(B1-1)
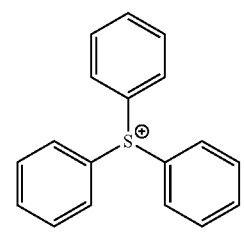
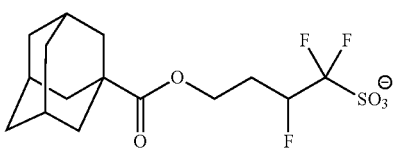
(B1-2)
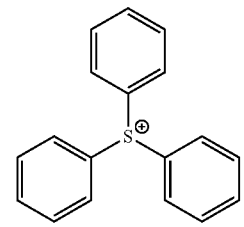
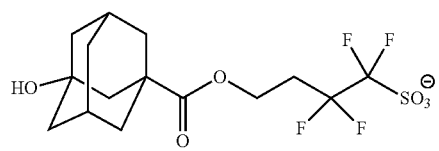
(B1-3)
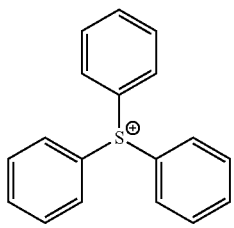
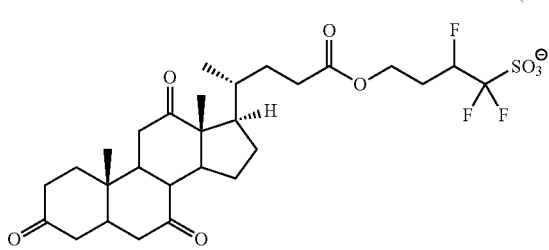
(B1-4)
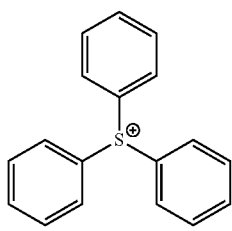
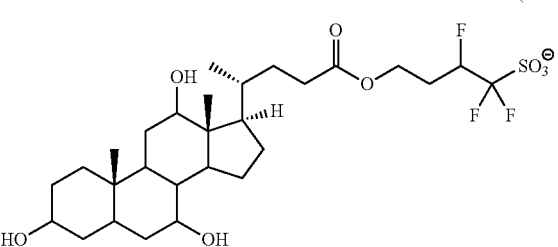
(B1-5)
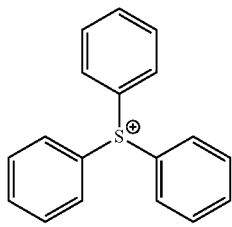
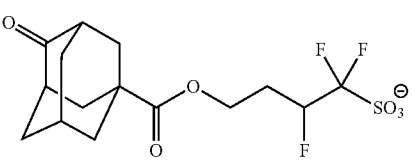
(B1-6)
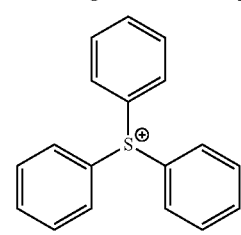

-continued (B2-1)
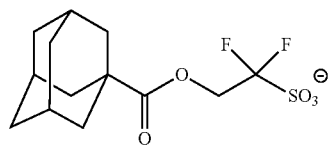

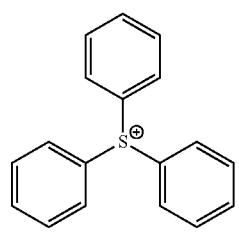

(B2-2)
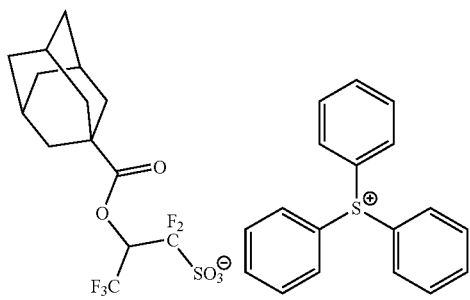

(B2-3)
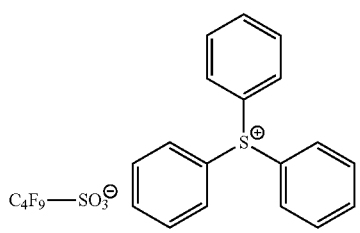

(D)-1 to (D)-5: photodecomposable bases formed of compounds respectively represented by Chemical Formulae (D-1) to (D-5).

(D-1)
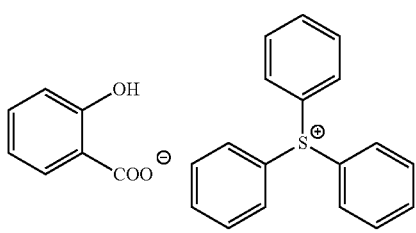

-continued (D-2)
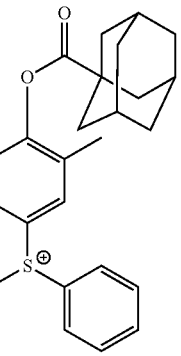
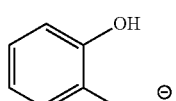

(D-3)
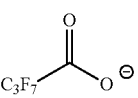
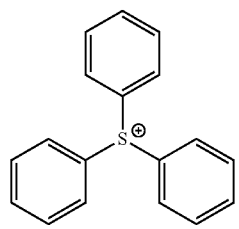

(D-4)
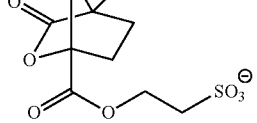
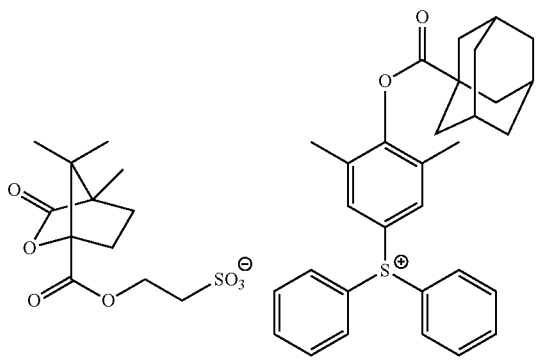

(D-5)
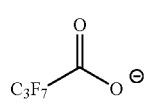
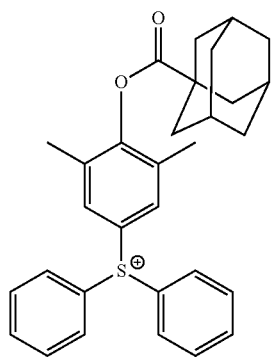

(F1)-1: A polymer compound represented by Chemical Formula (F1-1). The weight-average molecular weight (Mw) in terms of standard polystyrene which had been acquired by GPC measurement was 10000 and the molecular weight dispersity (Mw/Mn) was 1.65. The copolymer compositional ratio (1/m) (the proportion (molar ratio) between constitutional units in the structural formula) acquired by $^{13}$C-NMR was 70/30.

(F1)-2: A polymer compound represented by Chemical Formula (F1-2). The weight-average molecular weight (Mw) in terms of standard polystyrene which had been acquired by GPC measurement was 10000 and the molecular weight dispersity (Mw/Mn) was 1.70. The copolymer compositional ratio (1/m) (the proportion (molar ratio) between constitutional units in the structural formula) acquired by $^{13}$C-NMR was 70/30.

(F1)-3: A polymer compound represented by Chemical Formula (F1-2). The weight-average molecular weight (Mw) in terms of standard polystyrene which had been acquired by GPC measurement was 10000 and the molecular weight dispersity (Mw/Mn) was 1.70. The copolymer compositional ratio (1/m) (the proportion (molar ratio) between constitutional units in the structural formula) acquired by $^{13}$C-NMR was 50/50.

(F1)-4: A polymer compound represented by Chemical Formula (F1-2). The weight-average molecular weight (Mw) in terms of standard polystyrene which had been acquired by GPC measurement was 20000 and the molecular weight dispersity (Mw/Mn) was 1.75. The copolymer compositional ratio (1/m) (the proportion (molar ratio) between constitutional units in the structural formula) acquired by $^{13}$C-NMR was 70/30.

(F1)-5: A polymer compound represented by Chemical Formula (F1-3). The weight-average molecular weight (Mw) in terms of standard polystyrene which had been acquired by GPC measurement was 20000 and the molecular weight dispersity (Mw/Mn) was 1.80. The copolymer compositional ratio (1/m) (the proportion (molar ratio) between constitutional units in the structural formula) acquired by $^{13}$C-NMR was 70/30.

(F1)-6: A polymer compound represented by Chemical Formula (F1-4). The weight-average molecular weight (Mw) in terms of standard polystyrene which had been acquired by GPC measurement was 20000 and the molecular weight dispersity (Mw/Mn) was 1.80. The copolymer compositional ratio (1/m) (the proportion (molar ratio) between constitutional units in the structural formula) acquired by $^{13}$C-NMR was 70/30.

(F2)-1: A polymer compound represented by Chemical Formula (F2-1). The weight-average molecular weight (Mw) in terms of standard polystyrene which had been acquired by GPC measurement was 10000 and the molecular weight dispersity (Mw/Mn) was 1.65. The copolymer compositional ratio (1/m) (the proportion (molar ratio) between constitutional units in the structural formula) acquired by $^{13}$C-NMR was 50/50.

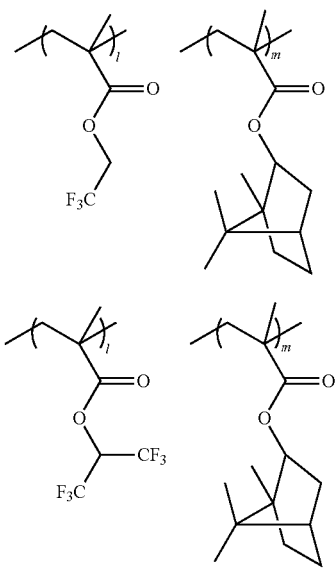

(F1-1)

(F1-2)

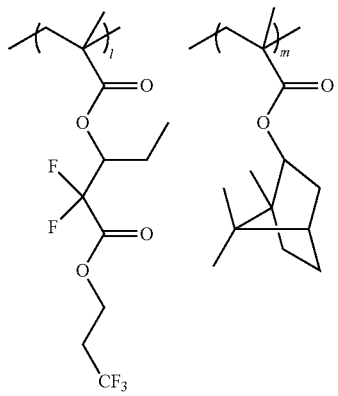

(F1-3)

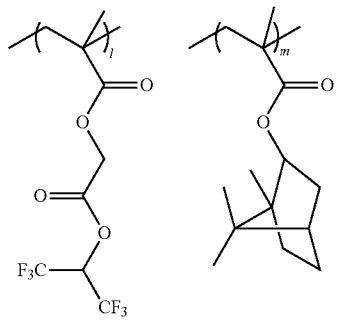

(F1-4)

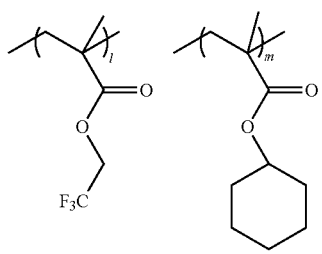

(F2-1)

(S)-1: A mixed solvent of propylene glycol monomethyl ether acetate, propylene glycol monomethyl ether, and cyclohexanone at a mass ratio of 45/30/25.

[Evaluation of Contact Angle]

An 8-inch silicon wafer was coated with each resist composition of each example using a spinner and prebaked on a hot plate at 90° C. for 60 seconds, and the composition was dried, thereby forming a resist film having a film thickness of 80 nm. Water was added dropwise onto the surface of the resist film, and the dynamic contact angle (reversing angle) was measured using a contact angle meter (trade name: DROP MASTER-700, manufactured by Kyowa Interface Science, Inc.) (measurement of contact angle: 50 μL of water). The results thereof are listed in Tables 4 and 5.

<Formation of Resist Pattern>

A 12-inch silicon wafer was coated with an organic anti-reflective coating composition (trade name: ARC95, manufactured by Brewer Science, Inc.) using a spinner to form an organic anti-reflective film having a film thickness 72 nm. Next, the organic anti-reflective film was coated with an inorganic anti-reflective coating composition (trade name: ARC212, manufactured by Brewer Science, Inc.) using a spinner, and an inorganic anti-reflective film having a film thickness of 14 nm was laminated thereon.

The inorganic anti-reflective film was coated with the resist composition of each example using a spinner, subjected to a prebake (PAB) treatment on a hot plate at 90° C. for 60 seconds, and dried to form each resist film having a film thickness of 80 nm. Next, the resist film was selectively irradiated with an ArF excimer laser (193 nm) through a photomask using an ArF exposure device for liquid immersion NXT1900i [manufactured by ASML Holding N. V., NA (numerical aperture)=1.35, Dipole-90X (0.80/0.65) with TE-Polarization, liquid immersion medium: water]. Thereafter, a post exposure bake (PEB) treatment was performed thereon at 90° C. for 60 seconds. Subsequently, solvent development was carried out with butyl acetate at 23° C. for 23 seconds, followed by shaking off and drying.

As a result, a space and line pattern (hereinafter, referred to as an "SL pattern") having a space width of 45 nm and a pitch width of 90 nm was formed.

[Evaluation of Line Width Roughness (LWR)]

Using the SL pattern formed in the section of the "formation of resist pattern", the 3σ which is the scale that indicates the LWR was acquired. The results are listed in Tables 4 to 5 in the columns of "LWR (nm)".

The "3σ" indicates three times (3σ) (unit: nm) the standard deviation (σ) acquired from the measurement results obtained by measuring 400 sites of line positions in the longitudinal direction of the line using a scanning electron microscope (trade name: CG-5000, manufactured by Hitachi High-Technologies Corporation, accelerating voltage of 800 V).

In a case where the value of the 3σ is small, this indicates that the roughness of a line side wall is small and an SL pattern with a uniform width is obtained.

[Evaluation of Minimum Resolution Dimension]

An optimum exposure amount Eop at which the SL pattern with a target size was formed according to the method in the section of "formation of resist pattern" was acquired. In a case where the SL pattern was formed by gradually decreasing the exposure amount from the optimum exposure amount Eop, the minimum dimension of the line portion in the SL pattern resolved without causing the pattern collapse was determined using a length measurement SEM (accelerating voltage of 800 V). A scanning electron microscope (trade name: CG-5000) manufactured by Hitachi High-Technologies Corporation was used for the length measurement SEM.

The minimum dimension of the space portion in the resolved SL pattern is listed in Tables 4 and 5 as the "minimum resolution dimension (nm)".

TABLE 4

| | PAB (° C.) | PEB (° C.) | Contact angle [°] | LWR [nm] | Resolution [nm] |
|---|---|---|---|---|---|
| Example 1 | 90 | 90 | 83 | 2.55 | 35 |
| Example 2 | 90 | 90 | 80 | 2.62 | 37 |
| Example 3 | 90 | 90 | 81 | 2.57 | 36 |
| Example 4 | 90 | 90 | 82 | 2.65 | 36 |
| Example 5 | 90 | 90 | 83 | 2.61 | 35 |
| Example 6 | 90 | 90 | 81 | 2.62 | 36 |
| Example 7 | 90 | 90 | 90 | 2.56 | 33 |
| Example 8 | 90 | 90 | 89 | 2.58 | 34 |
| Example 9 | 90 | 90 | 85 | 2.47 | 36 |
| Example 10 | 90 | 90 | 90 | 2.51 | 32 |
| Example 11 | 90 | 90 | 88 | 2.50 | 31 |
| Example 12 | 90 | 90 | 85 | 2.56 | 36 |
| Example 13 | 90 | 90 | 90 | 2.54 | 36 |
| Example 14 | 90 | 90 | 81 | 2.55 | 34 |
| Example 15 | 90 | 90 | 84 | 2.53 | 35 |

TABLE 4-continued

| | PAB (° C.) | PEB (° C.) | Contact angle [°] | LWR [nm] | Resolution [nm] |
|---|---|---|---|---|---|
| Example 16 | 90 | 90 | 82 | 2.60 | 36 |
| Example 17 | 90 | 90 | 81 | 2.65 | 38 |
| Example 18 | 90 | 90 | 81 | 2.64 | 37 |
| Example 19 | 90 | 90 | 80 | 2.70 | 39 |

TABLE 5

| | PAB (° C.) | PEB (° C.) | Contact angle [°] | LWR [nm] | Resolution [nm] |
|---|---|---|---|---|---|
| Comparative Example 1 | 90 | 90 | 79 | 2.77 | 39 |
| Comparative Example 2 | 90 | 90 | 77 | 2.80 | 40 |
| Comparative Example 3 | 90 | 90 | 76 | 3.22 | 42 |
| Comparative Example 4 | 90 | 90 | 72 | 2.67 | 38 |

From the results listed in Tables 4 and 5, it was confirmed that the resist composition of each example had higher hydrophobicity and excellent lithography characteristics (LWR, minimum resolution dimension) as compared with the resist compositions of each comparative example.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1: liquid droplet
1a: lower end
1b: upper end
2: plane
θ1: advancing angle
θ2: reversing angle
θ3: falling angle

What is claimed is:

1. A resist composition which generates an acid upon exposure and whose solubility in a developing solution is changed due to an action of the acid, the resist composition comprising:

a base material component (A) whose solubility in a developing solution is changed due to the action of an acid; an acid generator component (B) which generates an acid upon exposure; and a fluorine additive component (F), wherein the acid generator component (B) contains a compound (B1) represented by Formula (b1-1), and the fluorine additive component (F) contains a fluororesin component (F1) which has a constitutional unit represented by Formula (f-1) and a constitutional unit (f2) represented by Formula (f-2),

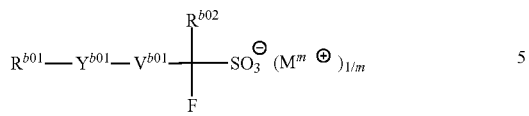

(b1-1)

wherein $R^{b01}$ represents a cyclic group which may have a substituent, a chain alkyl group which may have a substituent, or a chain alkenyl group which may have a substituent;
$Y^{b01}$ represents a divalent linking group having an oxygen atom or a single bond; $V^{b01}$ represents a fluorinated alkylene group; $R^{b02}$ represents a fluorine atom or a hydrogen atom, provided that a total number of fluorine atoms contained in $V^{b01}$ and $R^{b02}$ is 2 or 3,
m represents an integer of 1 or 2, and $M^{m+}$ represents a monovalent or divalent organic cation;

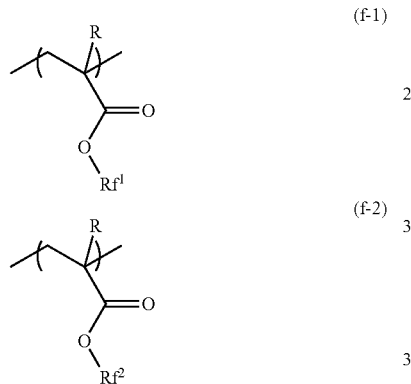

(f-1)

(f-2)

wherein, in Formula (f-1), R represents a hydrogen atom, an alkyl group having 1 to 5 carbon atoms, or a halogenated alkyl group having 1 to 5 carbon atoms; and $R^{f1}$ represents a monovalent organic group having a fluorine atom; and
in Formula (f-2), R represents a hydrogen atom, an alkyl group having 1 to 5 carbon atoms, or a halogenated alkyl group having 1 to 5 carbon atoms; and $Rf^2$ represents a group represented by Formula (f2-r-1):

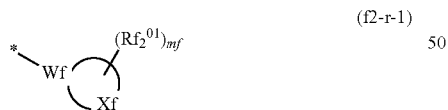

(f2-r-1)

wherein Wf represents a carbon atom; Xf represents a group that forms a polycyclic aliphatic cyclic group in which one or more hydrogen atoms have been removed from a polycyclic aliphatic cyclic group selected from adamantane, norbornane, or tetracyclododecane, provided that Wf forms part of the ring skeleton of the polycyclic aliphatic cyclic group; $Rf_2^{01}$ represents an alkyl group, provided that $Rf_2^{01}$ is not bonded to Wf; mf represents an integer of 2 or greater; and the symbol * represents a bonding site.

2. The resist composition according to claim 1,
wherein the constitutional unit (f1) is a constitutional unit (f11) represented by Formula (f1-1), a constitutional unit (f12) represented by Formula (f1-2), or a constitutional unit (f13) represented by Formula (f1-3),

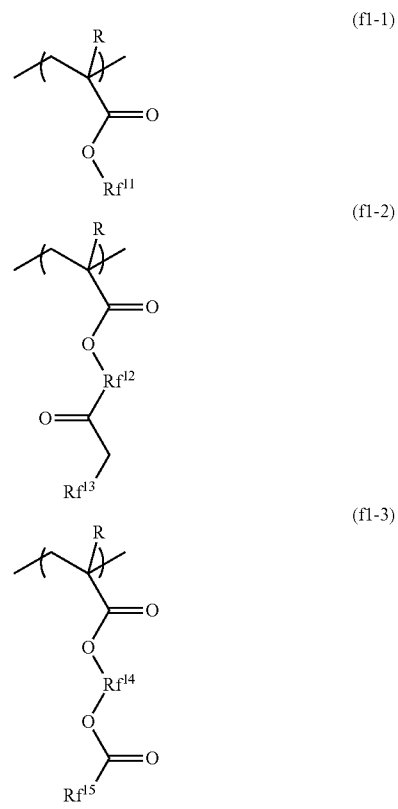

(f1-1)

(f1-2)

(f1-3)

wherein, in Formula (f1-1), R represents a hydrogen atom, an alkyl group having 1 to 5 carbon atoms, or a halogenated alkyl group having 1 to 5 carbon atoms; and $Rf^{11}$ represents a fluorinated alkyl group that does not have an acid dissociable site;
in Formula (f1-2), R represents a hydrogen atom, an alkyl group having 1 to 5 carbon atoms, or a halogenated alkyl group having 1 to 5 carbon atoms; $Rf^{12}$ represents a divalent linking group that does not have an acid dissociable site; $Rf^{13}$ represents an alkyl group or a fluorinated alkyl group that does not have an acid dissociable site, and here, provided that, when $Rf^{13}$ represents an alkyl group, $Rf^{12}$ represents a divalent linking group having a fluorine atom; and
in Formula (f1-3), R represents a hydrogen atom, an alkyl group having 1 to 5 carbon atoms, or a halogenated alkyl group having 1 to 5 carbon atoms; $Rf^{14}$ represents a divalent linking group that does not have an acid dissociable site; $Rf^{15}$ represents an alkyl group or a fluorinated alkyl group that does not have an acid dissociable site, provided that, when $Rf^{15}$ represents an alkyl group, $Rf^{14}$ represents a divalent linking group having a fluorine atom.

3. A method of forming a resist pattern, comprising:
forming a resist film on a support using the resist composition according to claim 1;
exposing the resist film; and
developing the exposed resist film to form a resist pattern.

4. The method of forming a resist pattern according to claim 3, wherein exposing the resist film comprises subjecting the resist film to liquid immersion exposure.

* * * * *